(12) United States Patent
Tanaka et al.

(10) Patent No.: US 11,881,491 B2
(45) Date of Patent: Jan. 23, 2024

(54) CAMERA MODULE, PHOTOSENSITIVE COMPONENT, PHOTOSENSITIVE-COMPONENT JOINED PANEL, AND FORMING DIE THEREOF AND MANUFACTURING METHOD THEREOF

(71) Applicant: NINGBO SUNNY OPOTECH CO., LTD., Zhejiang (CN)

(72) Inventors: Takehiko Tanaka, Nara (JP); Bojie Zhao, Zhejiang (CN); Zhewen Mei, Zhejiang (CN); Nan Guo, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 0 days.

(21) Appl. No.: 18/136,604

(22) Filed: Apr. 19, 2023

(65) Prior Publication Data

US 2023/0253423 A1 Aug. 10, 2023

Related U.S. Application Data

(60) Division of application No. 17/707,051, filed on Mar. 29, 2022, now Pat. No. 11,664,397, which is a
(Continued)

(30) Foreign Application Priority Data

Sep. 28, 2017 (CN) .......................... 201710895910.4
Sep. 28, 2017 (CN) .......................... 201721262500.8

(51) Int. Cl.
*H01L 27/146* (2006.01)
*H04N 23/54* (2023.01)
(Continued)

(52) U.S. Cl.
CPC .... *H01L 27/1461* (2013.01); *H01L 27/14623* (2013.01); *H01L 27/14625* (2013.01);
(Continued)

(58) Field of Classification Search
CPC ........... H01L 27/1461; H01L 27/14618; H01L 27/14623; H01L 27/14625; H04N 23/54; H04N 23/55; H04N 23/57
See application file for complete search history.

(56) References Cited

U.S. PATENT DOCUMENTS

| | | | |
|---|---|---|---|
| 2008/0055420 | A1 | 3/2008 | Orihashi et al. |
| 2008/0203512 | A1 | 8/2008 | Webster et al. |

(Continued)

FOREIGN PATENT DOCUMENTS

| | | |
|---|---|---|
| CN | 203279004 | 11/2013 |
| CN | 205961279 | 2/2017 |

(Continued)

OTHER PUBLICATIONS

International Search Report (ISR) dated Dec. 26, 2018 in International (PCT) Application No. PCT/CN2018/106351.
(Continued)

*Primary Examiner* — Amy R Hsu
(74) *Attorney, Agent, or Firm* — WENDEROTH, LIND & PONACK, L.L.P.

(57) ABSTRACT

Provided is a camera module and a photosensitive component thereof and a manufacturing method thereof, said photosensitive component comprising: a circuit board, a photosensitive element, and a molding base; the molding base is integrally formed on the circuit board and photosensitive element to form a light window; a first end side corresponding to the molding base adjacent to the flexible region has a first side surface facing the light window; said first side surface comprises a first partial surface arranged
(Continued)

adjacent to the photosensitive element and a second partial surface connected to said first portion surface; a first angle between said first partial surface and the optical axis of the camera module is greater than a second angle between the second partial surface and the optical axis; a second end side opposite to and away from the flexible region of the molding base has a second side surface facing the light window; said second side surface comprises a third partial surface arranged adjacent to the photosensitive element and a fourth partial surface connected to said third portion surface; a third angle between the third partial surface and the optical axis is greater than a fourth angle between the fourth partial surface and the optical axis.

20 Claims, 38 Drawing Sheets

Related U.S. Application Data continuation of application No. 16/651,455, filed as application No. PCT/CN2018/106351 on Sep. 19, 2018, now Pat. No. 11,315,967.

(51) Int. Cl.
  *H04N 23/55* (2023.01)
  *H04N 23/57* (2023.01)
(52) U.S. Cl.
  CPC ............ *H04N 23/54* (2023.01); *H04N 23/55* (2023.01); *H04N 23/57* (2023.01)

(56) References Cited

U.S. PATENT DOCUMENTS

| | | | |
|---|---|---|---|
| 2010/0079635 A1* | 4/2010 | Yano | G02B 3/0062 |
| | | | 359/503 |
| 2010/0165134 A1* | 7/2010 | Dowski, Jr. | G02B 13/0085 |
| | | | 257/E31.127 |
| 2018/0035022 A1 | 2/2018 | Wang et al. | |
| 2018/0035029 A1* | 2/2018 | Wang | H05K 1/181 |
| 2018/0332245 A1* | 11/2018 | Mishima | H01L 27/14 |
| 2019/0263040 A1* | 8/2019 | Wang | H04N 23/57 |
| 2020/0244852 A1 | 7/2020 | Wang et al. | |

FOREIGN PATENT DOCUMENTS

| | | |
|---|---|---|
| CN | 206302476 | 7/2017 |
| CN | 207765446 | 8/2018 |
| EP | 3 484 139 | 5/2019 |
| EP | 3 493 517 | 6/2019 |
| EP | 3 672 220 | 6/2020 |
| TW | 200722906 | 6/2007 |
| WO | 2017/094502 | 6/2017 |

OTHER PUBLICATIONS

Communication pursuant to Article 94(3) EPC dated Jul. 26, 2021 in corresponding European Patent Application No. 18 861 568.6.

* cited by examiner

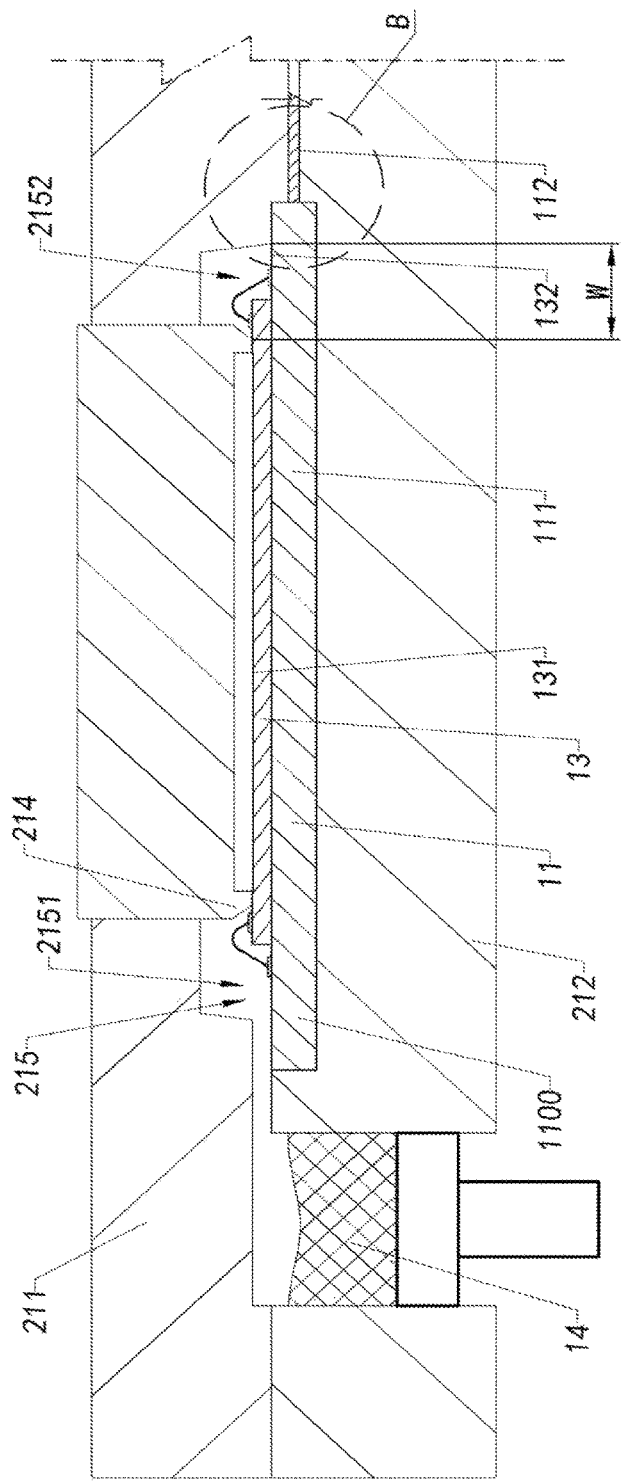
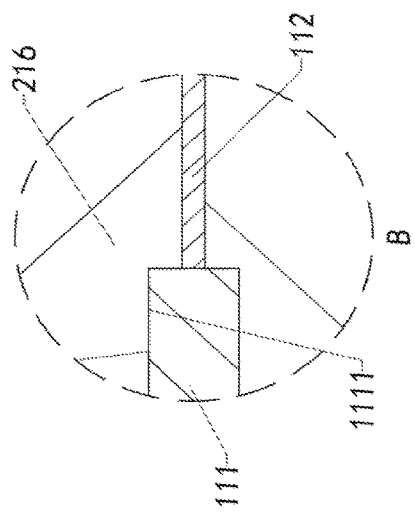
Figure 7A
Figure 7B

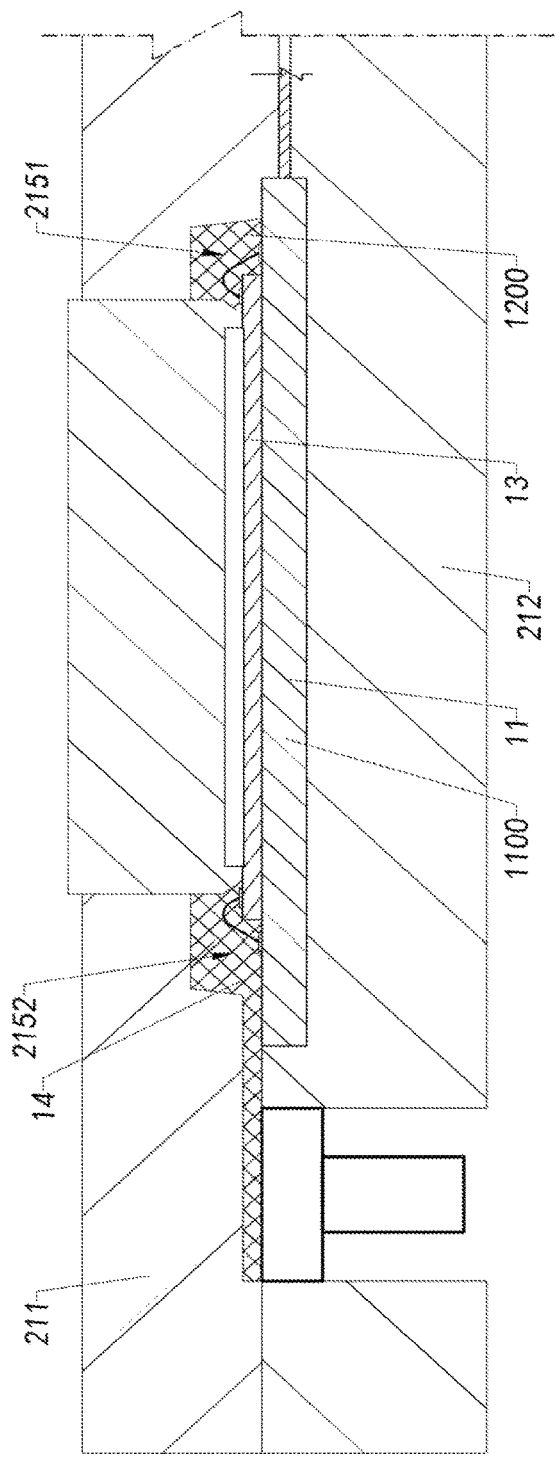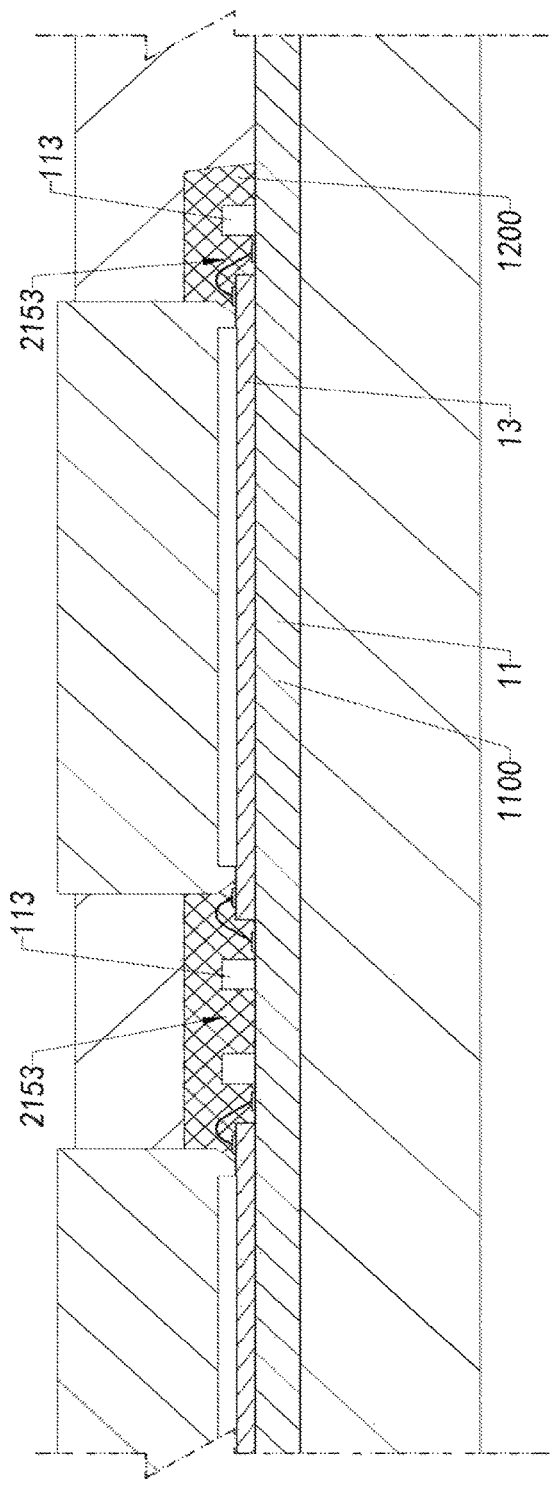

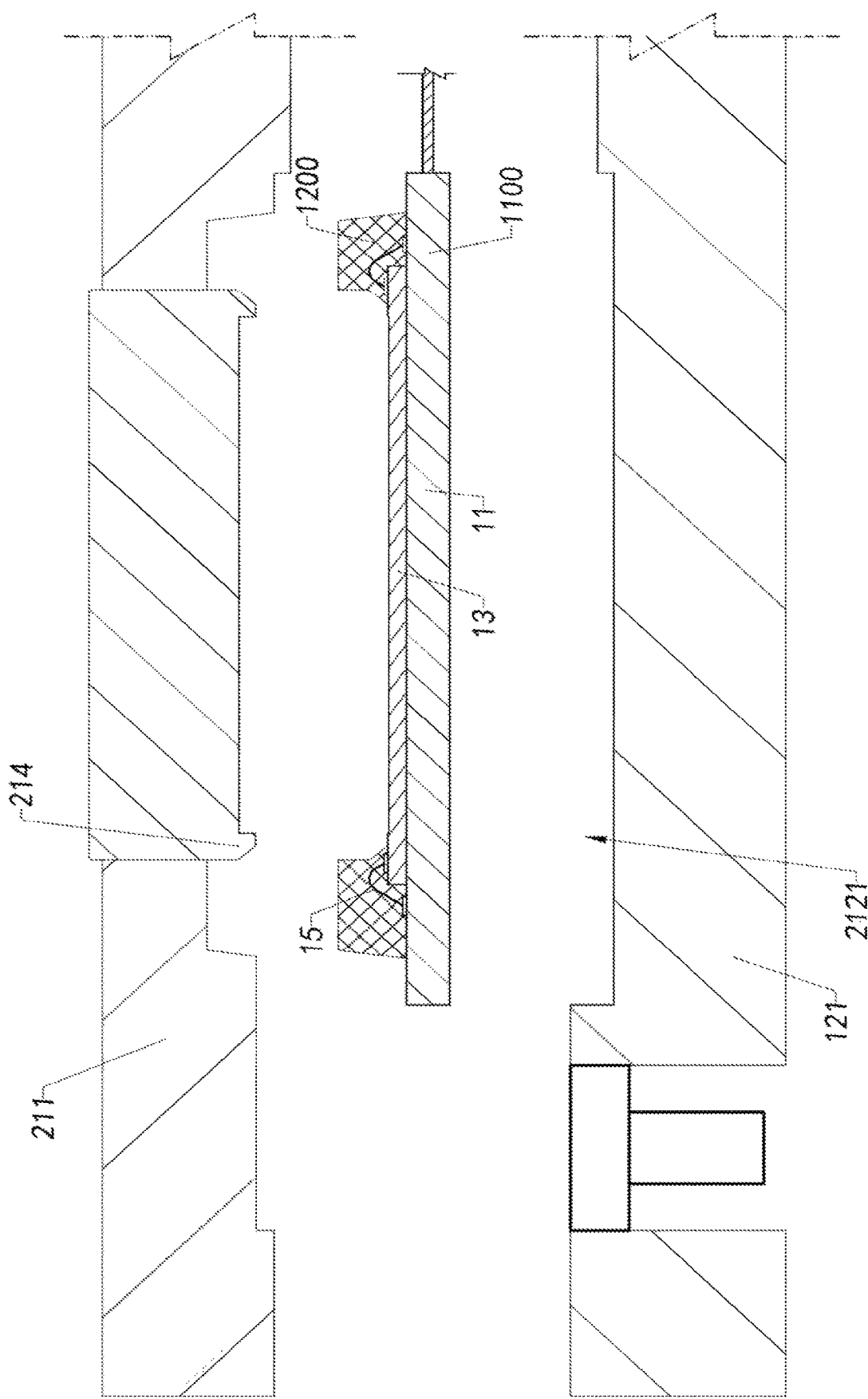

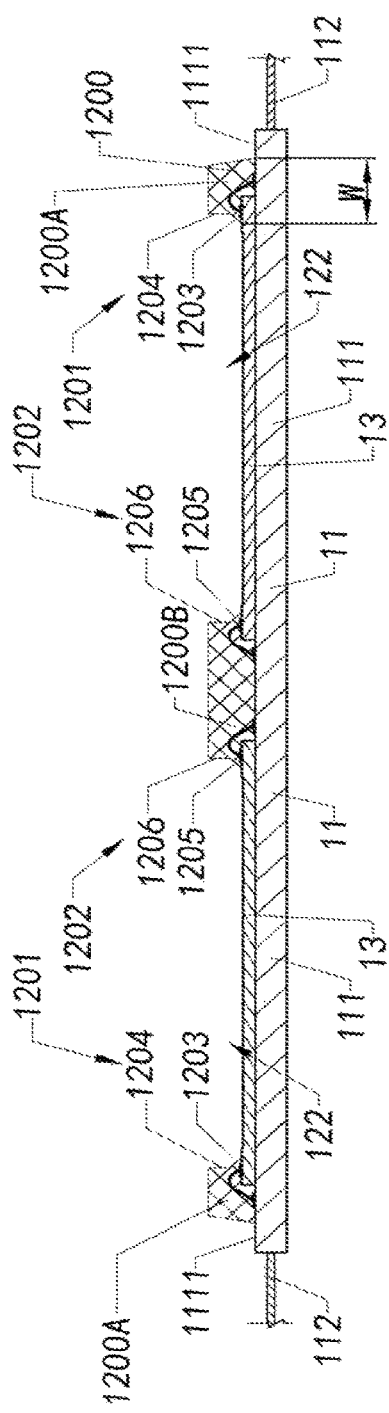
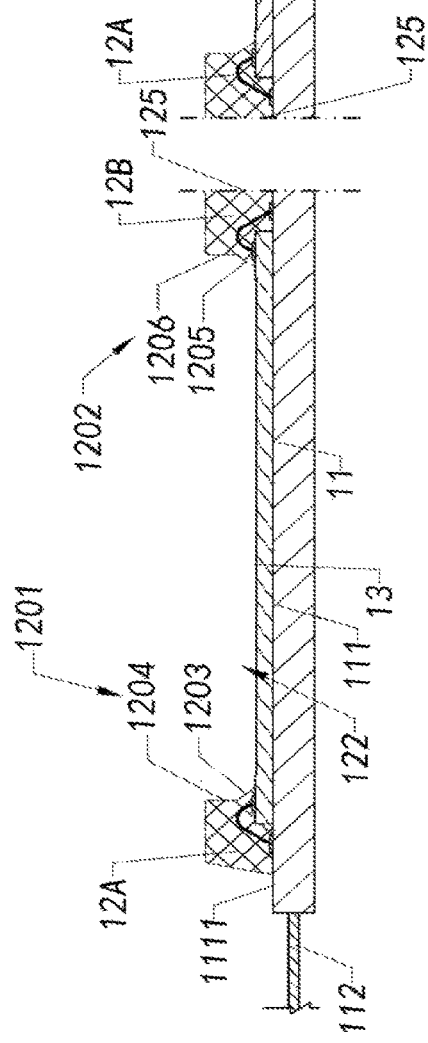
Figure 20A
Figure 20B

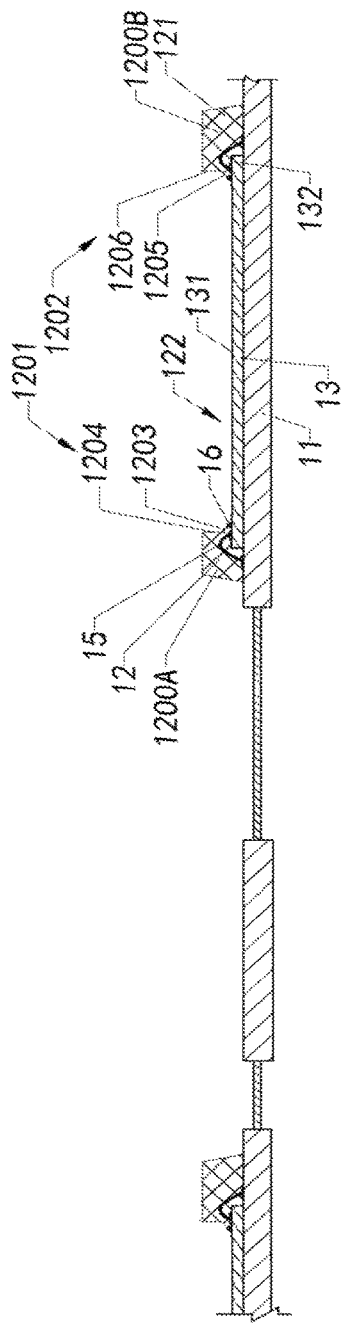
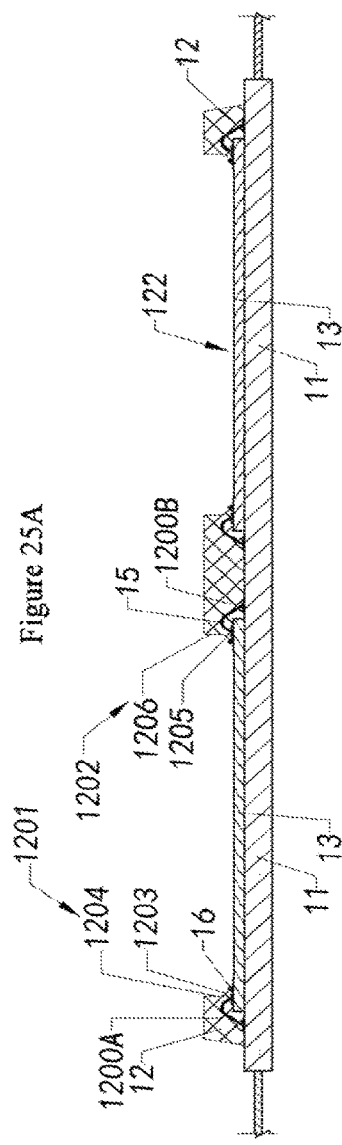
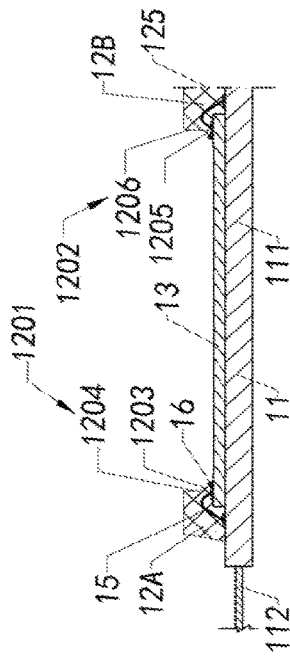
Figure 25A
Figure 25B
Figure 25C

K-K

M-M

CAMERA MODULE, PHOTOSENSITIVE COMPONENT, PHOTOSENSITIVE-COMPONENT JOINED PANEL, AND FORMING DIE THEREOF AND MANUFACTURING METHOD THEREOF

FIELD OF THE INVENTION

The present application relates to field of camera modules, and further relates to a photosensitive assembly and a photosensitive assembly jointed panel manufactured by a molding process, a manufacturing method thereof, and a camera module having the photosensitive assembly.

BACKGROUND OF THE INVENTION

Molding and packaging technology of a camera module is a newly developed packaging technology based on traditional COB packaging. As shown in FIGS. 1A to 1C, a circuit board is packaged by using the existing integrated packaging technology. In this structure, a packaging portion 1 is packaged in a circuit board 2 and a photosensitive chip 3 by an integrated packaging way to form an integrated packaging assembly, and the packaging portion 1 covers a plurality of electronic components 201 of the circuit board 2 and a series of leads 202 electrically connecting the photosensitive chip 3 and the circuit board 2, which enables the length, width, and thickness dimensions of the camera module to be reduced, and assembly tolerances can be reduced, and a lens or a lens assembly positioned above the integrated packaging assembly can be mounted flatly and the problem that dust attached to the electronic components affects the imaging quality of the camera module is solved.

More specifically, as shown in FIGS. 1A and 1B, in order to improve production efficiency, the integrated packaging assembly is generally produced by a jointed panel production way, that is, a plurality of the integrated packaging assemblies are produced at one time. More specifically, FIGS. 1A and 1B show a way of producing the integrated packaging assembly by using a molding die to perform jointed panel production. Wherein, the molding die includes an upper die 101 and a lower die 102, and one of the circuit board jointed panels is placed in the lower die 102 of the molding die, the circuit board jointed panel includes a plurality of rows of the circuit boards, each row of the circuit boards includes a plurality of the circuit boards 2, and each of the circuit board 2 is operatively connected to the photosensitive chip 3. The upper die 101 and the lower die 102 are clamped to form a molding cavity, so that the upper die 101 is pressed on the circuit board jointed panel, and is corresponding to the two end sides of the photosensitive chip 3 on each row of the circuit boards, and two flow passages 103 and 104 are formed in the upper die, and the upper die 101 has a plurality of the bumps 105, an intermediate flow passage 106 is formed between two adjacent bumps 105, so that the plurality of the intermediate flow passages 106 extend between the two flow passages 103 and 104. In the molding process, a fluid-like packaging material 4 flows forward along with the two flow passages 103 and 104, and fills into the intermediate flow passage 106 between two adjacent bumps 105, so that the region between two adjacent photosensitive chips 3 is also filled with the packaging material 4, thereby after the packaging material 4 is cured, the packaging portion 1 can be formed on the corresponding each of the circuit boards 2 and each of the photosensitive chips 3, a light window located in the middle of the packaging portion 1 is formed at a position corresponding to each of the bumps 105, and these packaging portions 1 are integrally molded to form a one-piece structure, as shown in FIG. 1C.

Referring to FIG. 1E, the thermosetting packaging material 4 has a curing time T in the molding process, as time passes, its viscosity decreases to the lowest point, and then gradually rises to the highest point to completely cure. Ideally, when the packaging material 4 has a low viscosity, the packaging material 4 is to fill the flow passages 103, 104, and 106, while the packaging material 4 still flows forward when the viscosity is large, the friction thereof to a lead 202 between the circuit board 2 and the photosensitive chip 3 is relatively large, which may easily cause deformation and damage of the lead 202.

In the above-mentioned molding process, the packaging material 4 is a thermosetting material, and enters the two flow passages 103 and 104 after being melted, and is cured under the action of heating conditions. However, in actual production, it has been found that, during the molding process, when the packaging material 4 flows forward along with the two flow passages 103 and 104, if the widths of the two flow passages 103 and 104 is small, it may cause problems.

More specifically, because the packaging material 4 is a fluid having a predetermined viscosity, the dimensions of the two flow passages 103 and 104 are relatively small, and for example, the flow passage 103 may be a narrow flow passage, the flow rate in the flow passage 103 is relatively small, and the friction generated by the inner wall of the flow passage 103 on the fluid-like packaging material 4 in it has a relatively large effect on flow velocity of the fluid-like packaging material 4, so the flow velocity of the packaging material 4 in the flow passage 103 is relatively slow. In this way, during the curing time T of the packaging material 4, the packaging material 4 in the flow passage 103 may not flow from the feeding end to the terminal end within the curing time T, so that some certain position of the flow passage 103 cannot be filled, as the region S shown in FIG. 1D, thereby it is impossible to form a one-piece structure of the packaging portion 1 with a series of complete shapes between the upper die 101 and the lower die 102, and at the position corresponding to the region S, the packaging portion 1 forms a gap, so that it is not possible to form an all-around closed light window. In addition, if the width of the flow passage 104 is narrow, a case as shown in FIG. 1D may also appear in the flow passage 104.

In addition, if, for example, the packaging material 4 in the flow passage 103 flows too slowly forward, when the viscosity is relatively large, it still flows forward in the flow passage 103, resulting in the frictional force on the lead 202 through which the packaging material flow is large, so that the lead 202 is deflected forward with a large level, thereby the lead 202 is easily deformed and damaged, and is easily detached from a bonding pad.

As shown in FIG. 1F, it is a camera module packaged by using the existing integrated packaging technology, which includes a packaging portion 1, a circuit board 2, a photosensitive chip 3, a filter 5, and a lens assembly 6. In this structure, the packaging portion 1 is packaged in the circuit board 2 and the photosensitive chip 3 by an integrated packaging way, thereby forming an integrated packaging assembly, and the packaging portion 1 covers a series of electronic components 201 of the circuit board 2 and a series of leads 202 electrically connecting the photosensitive chip 3 and the circuit board 2, which enables the length and width dimensions and thickness dimensions of the camera module to be reduced, assembly tolerances to be reduced, and the lens assembly 6 positioned above the integrated packaging assembly to be mounted flatly, and the problem that the dust attached to the electronic component 201 affects the imaging quality of the camera module to be solved.

In addition, in order to facilitate demolding, an inner surface of the packaging portion 1 that is generally formed extends integrally and obliquely from the photosensitive chip 3, which will cause the area of the top surface of the packaging portion 1 to decrease, and the top side of the packaging portion 1 needs to be used for mounting an upper optical device of the camera module, such as the lens assembly 6 described above, or additional components, such as lens holders, etc. However, the small-area top surface of the packaging portion 1 may not provide sufficient mounting surfaces for the upper optical device of the camera module, so that these upper optical devices are unable to be stably mounted and glue is prone to overflow on the mounting surface.

In the manufacturing process of the integrated assembly shown in FIG. 1B, a circuit board 201 to which a photosensitive chip 3 is connected is placed in a die, and a bump 105 is pressed on the photosensitive chip 3 as an indenter. Flow passages 103, 104, and 106 substantially form a groove 107 surrounding the bump 105, and a fluid-like packaging material 4 is filled into the groove 107, after the fluid-like packaging material 4 being cured, the packaging portion 1 is formed, and a through hole of the packaging portion 1 is formed at the position corresponding to the bump 105. The bump 105 has an inclined outer surface 1051, so as to form an integrally extending inner surface of the packaging portion 1.

However, in the integrated packaging process, the fluid-like packaging material may enter between the photosensitive chip 3 and the bottom surface of the bump 105, thereby causing the packaging material to reach a photosensitive region of the photosensitive chip 3, forming a "flash", thereby affecting the photosensitive effect of the photosensitive chip 3. Furthermore, a filling groove 1071 is formed on the bottom side of the groove 107 between the photosensitive chip 3 and the inclined outer surface 1051 of the bump 105, in the integrated packaging process, the packaging material enters the filling groove 1071, and the inclined outer surface 1051 of extends obliquely the bump 105 tends to guide the packaging material into the filling groove 1071, resulting in the filling groove 1071 having a greater volume, and the fluid-like packaging material generates a relative large pressure force and intensity of pressure, therefore the probability that the packaging material enters between the photosensitive chip 3 and the bottom surface of the bump 105 is increased, so that the packaging material is likely to pollute the photosensitive region of the photosensitive chip 3, thereby affecting the photosensitive performance of the photosensitive chip 3. Moreover, if in order to reduce the occurrence of "flash", the pressure force of the bump 105 pressed on the photosensitive chip 3 is increased, the photosensitive chip 3 may be damaged.

SUMMARY OF THE INVENTION

An object of the present application is to provide a camera module, a photosensitive assembly thereof and a manufacturing method thereof, wherein in a method for manufacturing a jointed panel of a photosensitive assembly, a molding material can fill a base jointed panel molding guide groove in a molding die in a molding process to avoid occurrence of defective products of the photosensitive assembly.

An object of the present application is to provide a camera module, a photosensitive assembly thereof and a manufacturing method thereof, wherein in a molding process, the molding material can form a one-piece molding base on a circuit board jointed panel, and the one-piece molding base can form an all-round closed light window at positions corresponding to each photosensitive element, so that after the formed one-piece photosensitive assembly jointed panel is cut, a molding base having the light window is formed on each circuit board and the corresponding photosensitive element to prevent a portion of the molding base from forming an opening to connect the light window to the outside of the molding base.

An object of the present application is to provide a camera module, a photosensitive assembly thereof, and a manufacturing method thereof, wherein the base jointed panel molding guide groove is used to form the one-piece molding base on a row of the circuit boards, which has two diversion grooves at two sides, and a plurality of the filling grooves extending laterally between the two diversion grooves, the molding material flows and cures in the diversion grooves and the filling grooves, wherein the side walls of the two diversion grooves are designed to increase the volume of the diversion grooves, so that the molding material can flow forward from the feeding ends of the two diversion grooves and fill the entire the diversion groove and the filling groove of the base jointed panel molding diversion grooves.

An object of the present application is to provide a camera module, a photosensitive assembly thereof, and a manufacturing method thereof, wherein the base jointed panel molding guide groove is used to form the one-piece molding base on two adjacent rows of circuit boards with rigid regions integrated, and has two first diversion grooves at two sides, a second diversion groove in the middle, and a plurality of the filling grooves located between the two first diversion grooves and the second diversion groove, the molding material flows and cures in the diversion groove and the filling groove, wherein the side walls of two first diversion grooves and the second diversion groove are designed to increase the volume of the diversion grooves, so that the molding material can flow forward from the feeding ends of the two diversion grooves and fill the entire diversion groove and the filling groove of the base jointed panel molding guide groove.

An object of the present application is to provide a camera module, a photosensitive assembly thereof, and a manufacturing method thereof, wherein when the dimension of the diversion groove is small to form a miniaturized photosensitive assembly, by setting the shape of the side wall of the diversion groove to increase the volume of the diversion groove, it makes that when the diversion groove with a small dimension, such as the above mentioned first diversion groove, has a width of the bottom end thereof which is less than 1 mm, the entire base jointed panel molding guide groove is still filled during the molding process.

An object of the present application is to provide a camera module, a photosensitive assembly thereof, and a manufacturing method thereof, wherein before the viscosity of the molding material reaches a high value and the molding material is cured, the molding material can fill the base jointed panel molding guide groove, thereby preventing the connecting wire between the circuit board and the photosensitive element from being damaged by a high-viscosity molding material flowing forward.

An object of the present application is to provide a camera module, a photosensitive assembly thereof, and a manufacturing method thereof, wherein the side walls of the diversion groove is designed to increase the volume of the diversion grooves, so that the molding material can flow forward from the feeding ends of the respective diversion grooves to the terminal ends thereof, to prevent the molding material in a diversion groove from flowing to another diversion groove to hinder the molding material in the another diversion groove to flow forward.

An object of the present application is to provide a camera module, a photosensitive assembly thereof and a manufacturing method thereof, wherein the molding process can form the one-piece molding base on a row of the circuit boards having a plurality of the circuit boards and a row of the photosensitive elements at a time, so that a row of a plurality of the photosensitive assemblies are formed by a jointed panel process, such as preferably 2-12 of the photosensitive assemblies.

An object of the present application is to provide a camera module, a photosensitive assembly thereof and a manufacturing method thereof, wherein the photosensitive assembly includes a molding base integrally molded on a photosensitive element and a circuit board, wherein in the process of forming the molding base by an integrated molding process, a molding material molded to form the molding base cannot easily enter between the photosensitive element and the bottom surface of a light window molding portion of a molding die to form a "flash", thereby reducing the possibility that a photosensitive region of the photosensitive element is contaminated.

An object of the present application is to provide a camera module, a photosensitive assembly thereof, and a manufacturing method thereof, wherein by reducing the volume of a filling groove between the photosensitive element and the outer surface of the light window molding portion, the pressure force and intensity of pressure generated by the molding material entering the filling groove is reduced, thereby reducing the possibility that the molding material enters between the photosensitive element and the bottom surface of the light window molding portion to form a "flash".

An object of the present application is to provide a camera module, a photosensitive assembly thereof and a manufacturing method thereof, wherein an outer surface of the light window molding portion has an outer surface extending in different directions, and an included angle of an outer surface of a top side thereof and the optical axis of the photosensitive assembly is smaller than that of the outer surface of the bottom side and the optical axis, thereby reducing the volume of the filling groove formed between the outer surface of the bottom side of the light window molding portion and the photosensitive element, thereby reducing the possibility of the occurrence of "flash".

An object of the present application is to provide a camera module, a photosensitive assembly thereof, and a manufacturing method thereof, wherein an outer surface of the top side of the optical window molding portion extends in a direction with a small angle relative to the optical axis, so that the flow velocity of the molding material entering the filling groove is slowed down to a certain extent, and the pressure force generated by the molding material entering the filling groove is reduced, thereby reducing the possibility of the occurrence of "flash".

An object of the present application is to provide a camera module, a photosensitive assembly thereof, and a manufacturing method thereof, wherein the molding material does not easily form a "flash" in the integrated molding process, so that the light window molding portion does not need a greater pressure force to press on the photosensitive element, thereby preventing the photosensitive element from being crushed.

An object of the present application is to provide a camera module, a photosensitive assembly thereof, and a manufacturing method thereof, wherein an outer surface of the light window molding portion of the molding die and an optical axis form two angles, wherein the outer surface of the bottom side has a inclination angle, and the outer surface of the bottom side that extends obliquely has a height of 0.05 mm or more, to prevent an elastic coating film covering the light window molding portion from being easily punctured during the molding process.

An object of the present application is to provide a camera module, a photosensitive assembly thereof, and a manufacturing method thereof, wherein the molding base has a plurality of the inner surfaces extending integrally, and a included angle of the inner surface of the top side of the molding base and the optical axis is smaller than that of the inner surface of the bottom side of the molding base and the optical axis, which makes the inner surface of the molding base extend in a twisted manner, and there is the molding material with a smaller size between the inner surface of the bottom side of the molding base and the photosensitive element, so that the molding material does not easily form a "flash" on the photosensitive element.

An object of the present application is to provide a camera module, a photosensitive assembly thereof, and a manufacturing method thereof, wherein the molding base includes a photosensitive element coupling portion that extend integrally and a top side extending portion, and the inner surfaces thereof have different extension angles, wherein there is a small included angle of the top side extending portion and the optical axis, so that the area of the top surface of the top side extending portion is increased, thereby providing a larger area of the mounting surface for the lens or the filter element holder or the lens assembly above the camera module to stably mount the lens, the filter element holder, or the lens assembly.

An object of the present application is to provide a camera module, a photosensitive assembly thereof and a manufacturing method thereof, wherein an inner surface of the photosensitive element coupling portion of the molding base extends obliquely so as to facilitate demolding operation and reduce the stray light reaching the photosensitive element in a molding process, and the inner surface of the top side extending portion integrally extends in a twisted manner from the inner surface of the photosensitive element coupling portion, so that the photosensitive element coupling portion and the top side extending portion cooperate to maximize the area of the top surface of the molding base while reducing the stray light.

An object of the present application is to provide a camera module, a photosensitive assembly thereof, and a manufacturing method thereof, wherein an inner surface of the top side extending portion integrally extends in a twisted manner from the photosensitive element coupling portion to prevent a light window molding part of a molding die from pressing on a connecting wire connecting the photosensitive element and the circuit board during the molding process, causing damage to the connecting wire.

An object of the present application is to provide a camera module, a photosensitive assembly thereof, and a manufacturing method thereof, wherein a smaller included angle of the top side extending portion and an optical axis can reduce an area of the filter element.

An object of the present application is to provide a camera module, a photosensitive assembly thereof and a manufacturing method thereof, wherein a filter element main body of a filter element of the photosensitive assembly of the camera module is provided with a light shielding layer, so that the central region of the filter element main body forms an effective light transmission region to reduce the stray light reaching the interior of a molding base.

An object of the present application is to provide a camera module, a photosensitive assembly thereof, and a manufacturing method thereof, wherein in some embodiments, the light shielding layer is provided on a bottom side of the filter element main body to reduce the light incident on the inner surface of the top side extending portion, thereby preventing the light incident on the inner surface of the top side extending portion from being reflected and reaching the photosensitive element to form the stray light, which affects the imaging quality of the camera module.

In order to achieve at least one of the above objects of the invention, the present application provides a method for manufacturing a photosensitive assembly of a camera module, which includes the following steps:

(a) fixing a circuit board jointed panel to a second die of a molding die, wherein the circuit board jointed panel includes one or more rows of the circuit boards, and each row of the circuit boards includes one or more circuit boards arranged side by side, each of the circuit boards includes a rigid region and a flexible region combined with each other, and each of the circuit boards is operatively connected with a photosensitive element;

(b) clamping the second die and a first die, and filling a molten molding material in a base jointed panel molding guide groove in the molding die, wherein a position corresponding to at least one light window molding portion is prevented from filling with the molding material; and (c) curing the molding material in the base jointed panel molding guide groove to form a one-piece molding base at a position corresponding to the base jointed panel molding guide groove, wherein the one-piece molding base is integrally molded on corresponding one or more rows of the circuit board and one or more rows of the photosensitive elements to form a photosensitive assembly jointed panel and forms a light window for providing a light path for each of the photosensitive elements at a position corresponding to the light window molding portion, wherein the base jointed panel molding guide groove has a first diversion groove corresponding to a first end side of the one-piece molding base adjacent to the flexible region and a second diversion groove corresponding to the one-piece molding base away from the flexible region, and a plurality of the filling grooves extending between the first diversion groove and the second diversion groove, wherein the first diversion groove has a first side surface facing the light window, the second diversion groove has a second side surface facing the light window, wherein the first side surface includes a first partial surface provided adjacent to the photosensitive element and a second partial surface connected to the first partial surface, and the second side surface has a third partial surface provided adjacent to the photosensitive element and a fourth partial surface connected to the third partial surface, wherein a first angle of the first partial surface relative to an optical axis of the camera module is greater than a second angle of the second partial surfaces relative to the optical axis, and a third angle of the third partial surface relative to the optical axis is greater than a fourth angle of the fourth partial surface relative to the optical axis.

The photosensitive assembly jointed panel is used for manufacturing a plurality of the photosensitive assemblies, wherein the method further includes the step of: cutting the photosensitive assembly jointed panel to obtain a plurality of the photosensitive assemblies, wherein each of the photosensitive assemblies includes the circuit board, the photosensitive element, and the molding base, wherein the molding base is integrally molded on the circuit board and the photosensitive element and forms the light window that provides a light path for the photosensitive element.

According to another aspect of the present application, the present application provides a photosensitive assembly of a camera module, including:

a circuit board, including a rigid region and a flexible region combined with each other;

a photosensitive element; and a molding base, wherein the molding base is integrally molded on the circuit board and the photosensitive element and forms a light window that provides a light path for the photosensitive element; wherein a first end side corresponding to the molding base adjacent to the flexible region has a first side surface facing the light window, and the first side surface includes a first partial surface provided adjacent to the photosensitive element and a second partial surface connected to the second partial surface, and a first angle of the first partial surface relative to an optical axis of the camera module is greater than a second angle of the second partial surface relative to the optical axis; the opposite second end side corresponding to the molding base away from the flexible region has a second side surface facing the light window, the second side surface includes a third partial surface provided adjacent to the photosensitive element and a fourth partial surface connected to the third partial surface, and a third angle of the third partial surface relative to the optical axis is greater than a fourth angle of the fourth partial surface relative to the optical axis.

According to another aspect of the present application, the present application also provides a photosensitive assembly jointed panel of a camera module, including:

one or more rows of circuit boards, each row of the circuit boards includes one or more circuit boards arranged side by side, each of the circuit boards includes a rigid region and a flexible region combined with each other;

one or more rows of photosensitive elements; and one or more of one-piece molding bases, each of the one-piece molding bases is integrally molded on a row of the circuit boards and a row of the photosensitive elements and forms a light window that provides a light path for each of the photosensitive elements; wherein the first end side corresponding to the one-piece molding base adjacent to the flexible region has a first side surface facing the light window, and the first side surface includes a first partial surface provided adjacent to the photosensitive element and a second partial surface connected to the first partial surface, and a first angle of the first partial surface relative to an optical axis of the camera module is greater than a second angle of the second partial surface relative to the optical axis; an opposite second end side corresponding to the one-piece molding base away from the flexible region has a second side surface facing the light window, and the second side surface includes a third partial surface provided adjacent to the photosensitive element and a fourth partial surface connected to the third partial surface, and a third angle of the third partial surface relative to the optical axis is greater than a fourth angle of the fourth partial surface relative to the optical axis.

According to another aspect of the present application, the present application also provides a photosensitive assembly jointed panel of a camera module, including:

multiple rows of the circuit boards, each row of the circuit boards including one or more circuit boards arranged side by side, each of the circuit boards including a rigid region and a flexible region combined with each other;

multiple rows of the photosensitive elements; and one or more one-piece molding bases, each of the one-piece molding bases is integrally molded on two adjacent rows of the circuit boards and two adjacent rows of the photosensitive elements and forms a light window that provides a light path for each of the photosensitive elements, and the two adjacent rows of the circuit boards are arranged so that their flexible regions are away from each other and their rigid regions are adjacent to each other, so that each of the one-piece molding bases has the two end sides adjacent to the flexible regions, wherein the first side surface corresponding to the one-piece molding base adjacent to the flexible region has the first side surface facing the light window, the first side surface includes a first partial surface provided adjacent to the photosensitive element and a second partial surface connected to the first partial surface, and a first angle of the first partial surface relative to an optical axis of the camera module is greater than a second angle of the second partial surface relative to the optical axis; a second end side of the one-piece molding base extending between the two adjacent rows of the photosensitive elements has a second side surface facing the light window, the second side surface includes a third partial surface provided adjacent to the photosensitive element and a fourth partial surface connected to the third partial surface, and a third angle of the third partial surface relative to the optical axis is greater than a fourth angle of the fourth partial surface relative to the optical axis.

According to another aspect of the present application, the present application also provides a camera module, including:

a lens;

a circuit board, including a rigid region and a flexible region combined with each other;

a photosensitive element; and a molding base, wherein the molding base is integrally molded on the circuit board and the photosensitive element and forms a light window that provides a light path for the photosensitive element, wherein the lens is located on a photosensitive path of the photosensitive element; wherein the first end side corresponding to the molding base adjacent to the flexible region has a first side surface facing the light window, and the first side surface includes a first partial surface provided adjacent to the photosensitive element and a second partial surface connected to the first partial surface, and a first angle of the first partial surface relative to an optical axis of the camera module is greater than a second angle of the second partial surface relative to the optical axis; the opposite second end side corresponding to the molding base away from the flexible region has a second side surface facing the light window, the second side surface includes a third partial surface provided adjacent to the photosensitive element and a fourth partial surface connected to the third partial surface, and a third angle of the third partial surface relative to the optical axis is greater than a fourth angle of the fourth partial surface relative to the optical axis.

According to another aspect of the present application, the present application further provides molding die for manufacturing a photosensitive assembly jointed panel for a camera module, including a first die and a second die suitable for being separated from each other and being in close contact with each other, wherein the first die and the second die form a molding cavity when they are in close contact with each other, and the molding die is configured with at least one light window molding portion and a base jointed panel molding guide groove formed around the light window molding portion in the molding cavity, and the molding cavity is suitable for fixing a circuit board jointed panel therein, wherein the circuit board jointed panel includes one or more rows of the circuit boards, each row of the circuit boards includes one or more circuit boards arranged side by side, each of the circuit boards includes a rigid region and flexible region combined with each other, and each of the circuit boards is operatively connected with a photosensitive element, the base jointed panel molding guide groove is adapted to be filled with molding material so as to form a one-piece molding base at a position corresponding to the base jointed panel molding guide groove, wherein the one-piece molding base is integrally molded on corresponding each row of the circuit boards and each row of the photosensitive elements to form the photosensitive assembly jointed panel and forms a light window that provides a light path for each of the photosensitive elements at a position corresponding to the light window molding portion, wherein the base jointed panel molding guide groove has a first diversion groove of a first end side of corresponding to the one-piece molding base adjacent to the flexible region and a second diversion groove corresponding to the one-piece molding base away from the flexible region, and a plurality of the filling grooves extending between the first diversion groove and the second diversion groove, wherein each of the light window molding portions is located between the two adjacent filling grooves, wherein the first diversion groove has a first side surface facing the light window, and the second diversion groove has a second surface facing the light window, wherein the first side surface includes a first partial surface provided adjacent to the photosensitive element and a second partial surface connected to the first partial surface, and the second side surface has a third partial surface provided adjacent to the photosensitive element and a fourth partial surface connected to the third partial surface, wherein a first angle of the first partial surface relative to an optical axis is greater than a second partial surface relative to the optical axis, a third angle of the third partial surface relative to the optical axis is greater than a fourth angle of the fourth partial surface relative to the optical axis.

According to another aspect of the present application, the present application further provides a molding die for manufacturing a photosensitive assembly jointed panel for a camera module, including a first die and a second die suitable for being separated from each other and being in close contact with each other, wherein the first die and the second die form a molding cavity when they are in close contact with each other, and the molding die is configured with light window molding portion and a base jointed panel molding guide groove formed around the light window molding portion in the molding cavity, and the molding cavity is suitable for fixing a circuit board jointed panel therein, wherein the circuit board jointed panel includes multiple rows of the circuit boards, each row of the circuit boards includes one or more circuit boards arranged side by side, and each of the circuit boards includes a rigid region and a flexible region combined with each other, and each of the circuit boards is operatively connected with a photosensitive element, wherein the base jointed panel molding guide groove is adapted to be filled with molding material so as to form a one-piece molding base at a position corresponding to the base jointed panel molding guide groove, wherein the one-piece molding base is integrally molded on two adjacent rows of the circuit boards and two adjacent rows of the photosensitive elements to form the photosensitive assembly jointed panel and forms a light window that provides a light path for each of the photosensitive elements at a position corresponding to the light window molding portion, wherein the two adjacent rows of the circuit boards are arranged so that their flexible regions are away from each other and their rigid regions are adjacent to each other, wherein the base jointed panel molding guide groove has two first diversion grooves corresponding to two end sides of the one-piece molding base adjacent to the flexible region, and a second diversion grooves corresponding to regions between the two adjacent rows of the photosensitive elements, and a plurality of the filling grooves extending between two of the first diversion grooves and the second diversion groove, wherein each of the light window molding portions is located between the two adjacent filling grooves, wherein the first diversion groove has a first side surface facing the light window, and the second diversion groove has a second side surface facing the light window, wherein the first side surface includes a first partial surface provided adjacent to the photosensitive element and a second partial surface connected to the first partial surface, the second side surface has a third partial surface provided adjacent to the photosensitive element and a fourth partial surface connected to the third partial surface, wherein a first angle of the first partial surface relative to an optical axis of the camera module is greater than a second angle of the second partial surface relative to the optical axis, and a third angle of the third partial surface relative to the optical axis is greater than a fourth angle of the fourth partial surface relative to the optical axis.

The present application also provides a photosensitive assembly, including:
a circuit board;
a photosensitive element, which is operatively connected to the circuit board; and
a molding base, which is integrally combined with the circuit board and the photosensitive element and forms a light window, wherein the molding base has one or more first portion inner surfaces adjacent to the photosensitive element and one or more second partial inner surfaces connected to the first portion inner surface and away from the photosensitive element, wherein there is an included angle $\alpha$ between the first portion inner surface and an optical axis of the photosensitive assembly, and there is an included angle $\beta$ between the second portion inner surface and the optical axis of the photosensitive assembly, wherein $\beta<\alpha$.

According to another aspect of the present application, the present application further provides a camera module, including
a lens;
a circuit board;
a photosensitive element, which is operatively connected to the circuit board; wherein the lens is located on a photosensitive path of the photosensitive element; and
a molding base, which is integrally combined with the circuit board and the photosensitive element and forms a light window, wherein the molding base has a first portion inner surface adjacent to the photosensitive element and a second partial inner surface connected to the first portion inner surface and away from the photosensitive element, wherein there is an included angle $\alpha$ between the first portion inner surface and an optical axis of the camera module, and there is an included angle $\beta$ between the second portion inner surface and the optical axis of the camera module, wherein $\beta<\alpha$.

According to another aspect of the present application, the present application further provides a molding die for manufacturing at least one photosensitive assembly applied to a camera module, the photosensitive assembly includes a circuit board, a photosensitive element, and a molding base, wherein the molding base is integrally molded on the circuit board and the photosensitive element form a light window, wherein the molding die includes a first die and a second die suitable for being separated from each other and being in close contact with each other, and at least one light window molding portion configuring therein and a base molding guide groove forming around the light window molding portion, the circuit board to which the photosensitive element is connected is placed in the molding die, and when the first die and the second die are in close contact with each other, a molten molding material is filled into the base molding guide groove and cured to form the molding base, the light window is formed corresponding to the position of the light window molding portion, wherein the light window molding portion has at least one first partial outer surface and at least one second partial outer surface in a direction from the bottom side to the top side, which respectively form angles $\alpha$ and $\beta$ with the optical axis perpendicular to the photosensitive element, and $\alpha>\beta$.

According to another aspect of the present application, the present application further provides an electronic device including one or more of the camera modules described above. The electronic device includes, but are not limited to, a mobile phone, a computer, a television, a smart wearable device, a vehicle, a camera, and a monitoring device.

BRIEF DESCRIPTION OF THE DRAWINGS

FIG. 7A is a cross-sectional view illustrating when a molten molding material is pushed into a base jointed panel molding guide groove in the molding die of the photosensitive assembly jointed panel according to the above mentioned first preferred embodiment of the present application, wherein the cross-sectional view is a cross-sectional view corresponding to the direction of the A-A line illustrated in FIG. 4.

FIG. 7B is a partially enlarged schematic view at B in FIG. 7A.

FIG. 8 is a cross-sectional view illustrating when a molten molding material is filled in a base jointed panel molding guide groove in the molding die of the photosensitive assembly jointed panel according to the above mentioned first preferred embodiment of the present application, wherein the cross-sectional view is a cross-sectional view corresponding to the direction of the A-A line illustrated in FIG. 4.

FIG. 9 is a cross-sectional view illustrating when a molten molding material is filled in a base jointed panel molding guide groove in the molding die of the photosensitive assembly jointed panel according to the above mentioned first preferred embodiment of the present application, wherein the cross-sectional view is a cross-sectional view corresponding to the direction of the B-B line illustrated in FIG. 4.

FIG. 10 is a cross-sectional view of performing a demolding step to form a one-piece molding base in the molding die of the photosensitive assembly jointed panel according to the above mentioned first preferred embodiment of the present application, wherein the cross-sectional view is a cross-sectional view corresponding to the direction of the A-A line illustrated in FIG. 4.

FIG. 20A is a cross-sectional view of the photosensitive assembly jointed panel of the camera module according to the above mentioned second preferred embodiment of the present application, taken along line H-H in FIG. 19A.

FIG. 20B is a schematic structural view of two photosensitive assemblies obtained by cutting the photosensitive assembly jointed panel of the camera module according to the above mentioned second preferred embodiment of the present application.

FIG. 25A to 25C are schematic cross-sectional views of a photosensitive assembly jointed panel according to a variant embodiment of the above mentioned first and second preferred embodiments of the present application, and enlarged structural views of the photosensitive assembly obtained by cutting the photosensitive assembly jointed panel.

DETAIL DESCRIPTION OF THE INVENTION

Figure 1A:
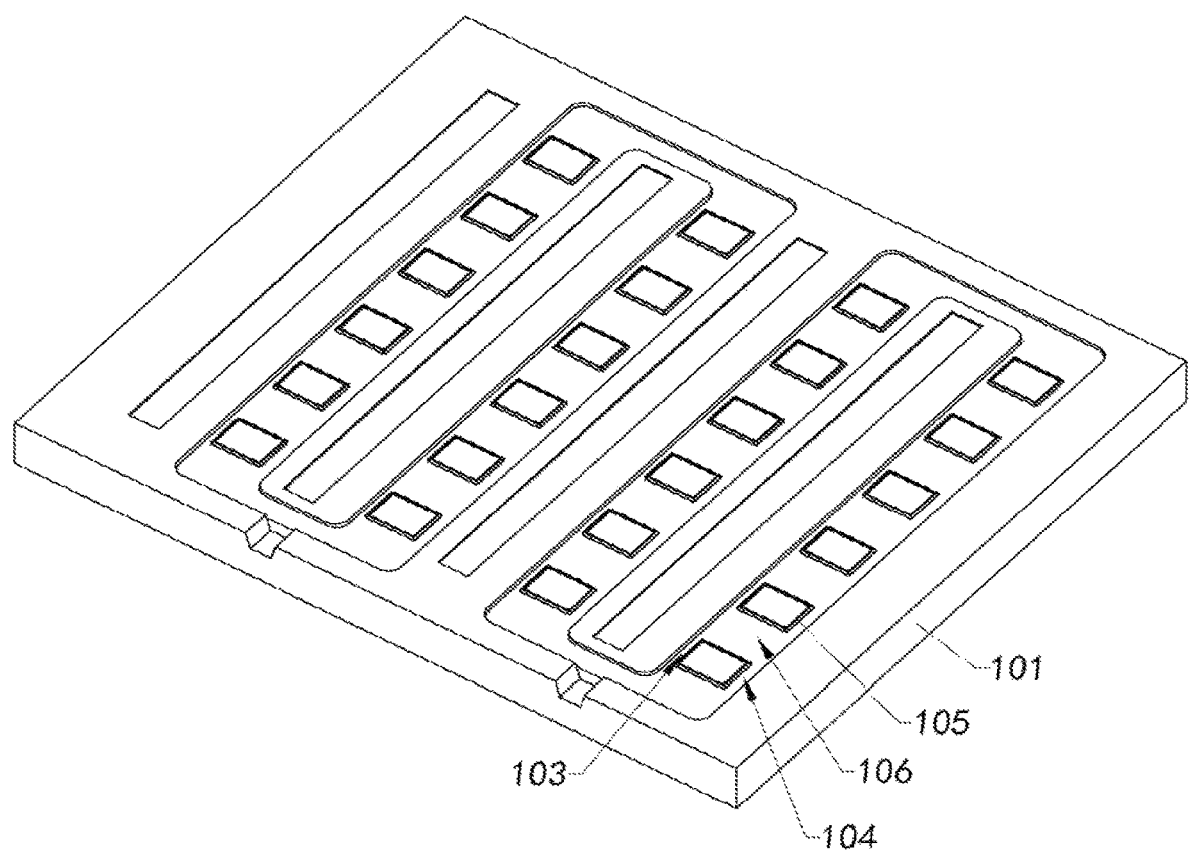
FIG. 1A is a schematic structural view of a molding die for obtaining a photosensitive assembly packaged by the existing integrated packaging process.

The following description is used to disclose the present application so that those skilled in the art can implement the present application. The preferred embodiments in the following description are merely embodiments, and those skilled in the art can think of other obvious variations. The basic principles of the present application defined in the following description can be applied to other embodiments, modifications, improvements, equivalents, and other technical solutions without departing from the spirit and scope of the present application.

Those skilled in the art should understand that, in the disclosure of the present application, The orientation or positional relationship of the indications of the terms "longitudinal", "transverse", "upper", "lower", "front", "back", "left", "right", "upright", "horizontal", "top", "bottom", "inside", "outside", etc. is based on the orientation or positional relationship shown in the drawings, which is merely for the convenience of describing the present application and simplifying the description rather than indicating or implying that the device or component referred to must have a particular orientation, or be constructed and operated in a particular orientation. Therefore, the above terms are not to be construed as limiting the present application.

Figure 44:
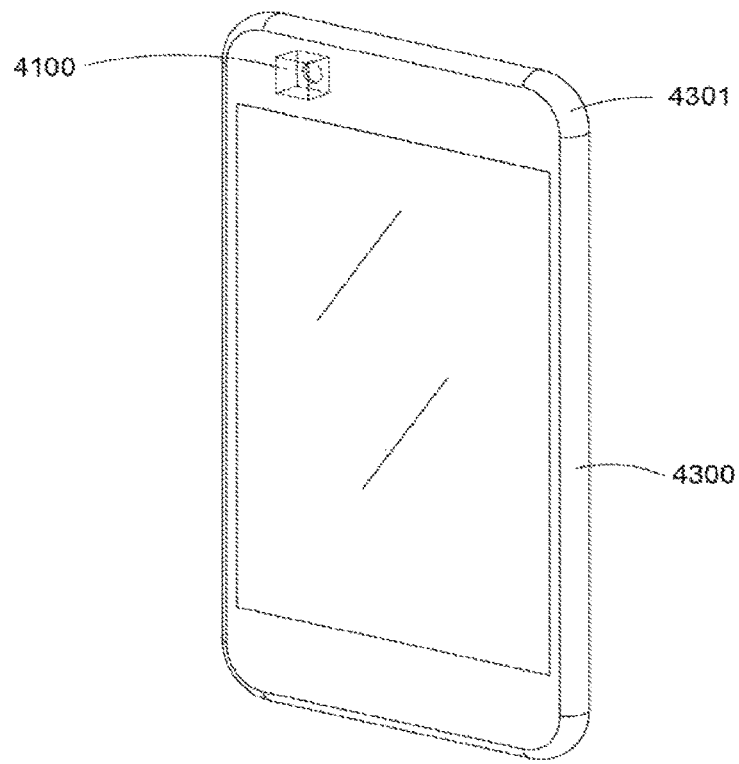
FIG. 44 is a schematic structural diagram of the application of the above camera module according to the present application to intelligent electronic device.

It can be understood that the term "a" should be understood as "at least one" or "one or more", that is, in one embodiment, the number of one component can be one, while in other embodiments, the number of the component may be plural, and the term "a" cannot be understood as a limitation on the number. As shown in FIGS. 2 to 14, a camera module 100 and a photosensitive assembly 10 and a manufacturing method thereof according to a first preferred embodiment of the present application are shown. The camera module 100 can be applied to various electronic devices 300. The electronic device 300 includes a device main body 301 and one or more camera modules 100 mounted in the device main body 301, as shown in FIG. 44. The electronic device 30 is exemplified but not limited to a smart phone, a wearable device, a computer device, a television, a vehicle, a camera, a monitoring device, etc., and the camera module cooperates with the electronic device to implement image acquisition and reproduction of the target object.

More specifically, the figures illustrate a photosensitive assembly 10 of the camera module 100 and its manufacturing equipment 200. The photosensitive assembly 10 includes a circuit board 11, a molding base 12 and a photosensitive element 13. The molding base 12 is integrally molded on the circuit board 11 and the photosensitive element 13 and form a light window 122 that provides a light path for the photosensitive element 13. Wherein, the molding base 12 of the present application is integrally molded on the circuit board 11 and the photosensitive element 13 by the manufacturing equipment 200 through a molding process, more specifically, a transfer molding process, so that the molding base 12 can replace the lens holder or the bracket of the conventional camera module, and does not need to attach the lens holder or the bracket to the circuit board 11 by glue in a conventional packaging process. Further, referring to FIGS. 2-4 and 7A to 10, the present application manufactures a photosensitive assembly jointed panel 1000 through the manufacturing equipment 200, that is, the photosensitive assembly jointed panel 1000 having a plurality of photosensitive assemblies 10 is manufactured by a jointed panel process. The photosensitive assembly jointed panel 1000 includes a circuit board 1100 and one or more one-piece molding bases 1200. The circuit board jointed panel 1100 includes a plurality of rows of the circuit boards, such as four-row circuit boards illustrated in FIG. 4, and each row of the circuit boards includes a plurality of circuit boards 11, such as 2-12 circuit boards 11, for example, six circuit boards shown in FIG. 11, and each of the circuit boards 11 is operatively connected to a photosensitive element 13.

Each of the one-piece molding bases 1200 is formed on a row of the circuit boards and is integrally molded on at least a part of non-photosensitive region 132 of each of the photosensitive elements 13 of the row of the photosensitive elements 13 to expose a photosensitive region 131 of the photosensitive element 13. Each of the one-piece molding bases 1200 has a plurality of light windows 122, and the positions of each light window 122 correspond to each of the photosensitive elements 13 for providing a light path for the corresponding photosensitive elements 13.

Wherein, the manufacturing equipment 200 of the photosensitive assembly jointed panel 1000 of the camera module 100 includes a molding die 210, a molding material feeding mechanism 220, a die fixing device 230, a temperature control device 250, and a controller 260, the molding material feeding mechanism 220 is used to provide a molding material 14 to a base jointed panel molding guide groove 215. The die fixing device 230 is used to control the die opening and clamping of the molding die 210, the temperature control device 250 is used to heat the thermosetting molding material 14, and the controller 260 is used to automatically control the operation of the molding material feeding mechanism 220, the die fixing device 230, and the temperature control device 250 in the molding process.

The molding die 210 includes a first die 211 and a second die 212 that can be opened and clamped under the operation of the die fixing device 230, that is, the die fixing device 230 can operate the first die 211 and the second die 212 to be separated and closely contacted to form a molding cavity 213. During die clamping, the circuit board jointed panel 1100 is fixed in the molding cavity 213, and the fluid-like molding material 14 enters the molding cavity 213 and is integrally molded on each row of the circuit boards 11 and the corresponding each row of the photosensitive elements 13, and after be cured, it forms the one-piece molding base 1200 integrally molded on each row of the circuit boards 11 and each row of the photosensitive elements 13.

More specifically, the molding die 210 further has one or more base jointed panel molding guide grooves 215 and a plurality of light window molding portions 214 located in the base jointed panel molding guide grooves 215. When the first and second dies 211 and 212 are clamped, the light window molding portion 214 and the base jointed panel molding guide groove 215 extend in the molding cavity 213, and the fluid-like molding material 14 is filled into the base jointed panel molding guide groove 215, and the position corresponding to the light window molding portion 214 cannot be filled with the fluid-like molding material 14, therefore, at a position corresponding to the base jointed panel molding guide groove 215, the fluid-like molding material 14 can be formed into the one-piece molding base 1200 after be cured, the one-piece molding base 1200 includes a ring-shaped molding main body 121 corresponding to the molding base 12 of each of the photosensitive assemblies 10, and the light window 122 of the molding base 12 will be formed at a position corresponding to the light window molding portion 214. The molding material 14 may be selected from, but not limited to, nylon, LCP (Liquid Crystal Polymer), PP (Polypropylene), epoxy resin, and the like.

The first die 211 and the second die 212 may be two dies capable of moving relative to each other, such as one of the two dies is fixed and the other is movable; or both dies are movable. The present application is not limited in this aspect. In the example of the embodiment of the present application, the first die 211 is specifically implemented as a fixed upper die, and the second die 212 is implemented as a movable lower die. The fixed upper die and the movable lower die are arranged coaxially, for example, the movable lower die can slide up along with a plurality of positioning axes, and can form the tightly closed molding cavity 213 as being clamped with the fixed upper die.

The second die 212, that is, the lower die may have a circuit board positioning groove 2121, which may be in the shape of a groove or formed by a positioning post for mounting and fixing the circuit board 11, and the light window molding portion 214 and the base jointed panel molding guide groove 215 may be formed in the first die 211, that is, formed in the upper die, and when the first die 211 and the second die 212 are clamped, the molding cavity 213 is formed. In addition, the fluid-like molding material 14 is injected into the base jointed panel molding guide grooves 215 on the top side of the circuit board jointed panel 1100, so that the one-piece molding base 1200 is formed on the top side of each row of the circuit boards 11 and each row of the photosensitive elements 13.

It can be understood that the circuit board positioning groove 2121 may also be provided in the first die 211, that is, the upper die, for mounting and fixing the circuit board jointed panel 1100, and the light window molding portion 214 and the base jointed panel molding guide groove 215 may be formed in the second die 211, and when the first die 211 and the second die 212 are clamped, the molding cavity 213 is formed. The circuit board jointed panel 1100 may be arranged face upward in the upper die, and the fluid-like molding material 14 is injected into the base jointed panel molding guide groove 215 on the bottom side of the circuit board jointed panel 1100 that is inverted, so that the one-piece molding base 1200 is formed on the bottom side of the circuit board jointed panel 1100 that is inverted. More specifically, when the first die 211 and the second die 212 are clamped and a molding step is performed, the light window molding portion 214 is superimposed on the top surface of the photosensitive element 13 and closely adhered, so that the fluid-like molding material 14 is prevented from entering the photosensitive region 1311 on the top surface 131 of the photosensitive element 13 on the circuit board 11, so that the light window 122 of the one-piece molding base 1200 can be finally formed at a position corresponding to the light window molding portion 214. It can be understood that the light window molding portion 214 may be a solid structure or a structure having a groove shape inside as shown in the figures.

It can be understood that the molding surface of the first die 211 forming the base jointed panel molding guide groove 215 can be configured as a flat surface and is on same plane. In this way, when the molding base 12 is cured and molded, the top surface of the molding base 12 is relatively flat, so as to provide flat mounting conditions for optical components such as drivers, lenses, and fixed lens barrels above the photosensitive assembly 10 of the camera module 100 to reduce the tilt error of the camera module 100 after assembly.

It is worth mentioning that the base jointed panel molding guide groove 215 and the light window molding portion 214 can be integrally molded in the first die 211. Alternatively, the first die 211 further includes a detachable molding structure, and the molding structure is formed with the base jointed panel molding guide groove 215 and the light window molding portion 214. In this way, according to the shape and dimension requirements of the photosensitive assembly 10 such as the diameter and thickness of the molding base, the base jointed panel molding guide grooves 215 and the light window molding portion 214 of different shapes and dimensions can be designed. In this way, only the different molding structures need to be replaced, then the manufacturing equipment can be adapted to be applied to the photosensitive assembly 10 with different specifications. It can be understood that the second die 212 may also include accordingly a detachable fixing block to provide the grooves 2121 with different shapes and dimensions, so as to facilitate the replacement of the circuit board 11 adapted to different shapes and dimensions.

It can be understood that the molding material 14 is a thermosetting material. The molding material 14 is changed into a fluid state by heating and melting the thermosetting material in a solid state. During the molding process, the thermosetting molding material 14 is cured through a further heating process, and can no longer be melted after be cured, thereby forming the one-piece molding base 1200.

It can be understood that, in the molding process of the present application, the molding material 14 may be a block shape, a granular shape, or a powder shape, which is changed to fluid in the molding die 210 after being heated, then is cured to form the one-piece molding base 1200.

More specifically, each of the base jointed panel molding diversion grooves 215 of the present application has a first diversion groove 2151 and a second diversion groove 2152 that are substantially parallel to each other, and a plurality of filling grooves 2153 extends between the first diversion groove 2151 and the second diversion grooves 2152, wherein the filling grooves 2153 are formed between two adjacent light window molding portions 214, and as shown in the figure, the base jointed panel molding guide groove 215 has seven filling grooves 2153, and six light window molding portions 214 are located between two adjacent filling grooves 2153. The molding material 14 flows along with the first diversion groove 2151 and the second diversion groove 2152 from the feeding end 215A to the terminal end 215B, and the molding material 14 can fill each of the filling grooves 2153, so that the one-piece molding base 1200 is formed after the molding material 14 is cured.

As shown in FIGS. 7A to 10, it is a schematic view of a manufacturing process of the photosensitive assembly jointed panel 1000 of the camera module 100 according to this preferred embodiment of the present application. As shown in FIG. 7A, the molding die 210 is in a die clamping state, the circuit board jointed panel 1100 to be molded and the solid molding material 14 are ready to be in place, the solid molding material 14 is heated, thereby when the molding material 14 is melted into a fluid state or a semi-solid and semi-fluid state, it is sent to the base jointed panel molding guide groove 215, flows forward along with the first diversion groove 2151 and the second diversion groove 2152, and fills the filling groove 2153 between two adjacent light window molding portions 214.

As shown in FIGS. 8 and 9, when the base jointed panel molding guide groove 215 is completely filled with the fluid-like molding material 14, the fluid-like molding material 14 is cured and molded into the one-piece molding base 1200 integrally molded on each row of the circuit boards 11 and each row of the photosensitive elements 13 through a curing process.

Figure 4:
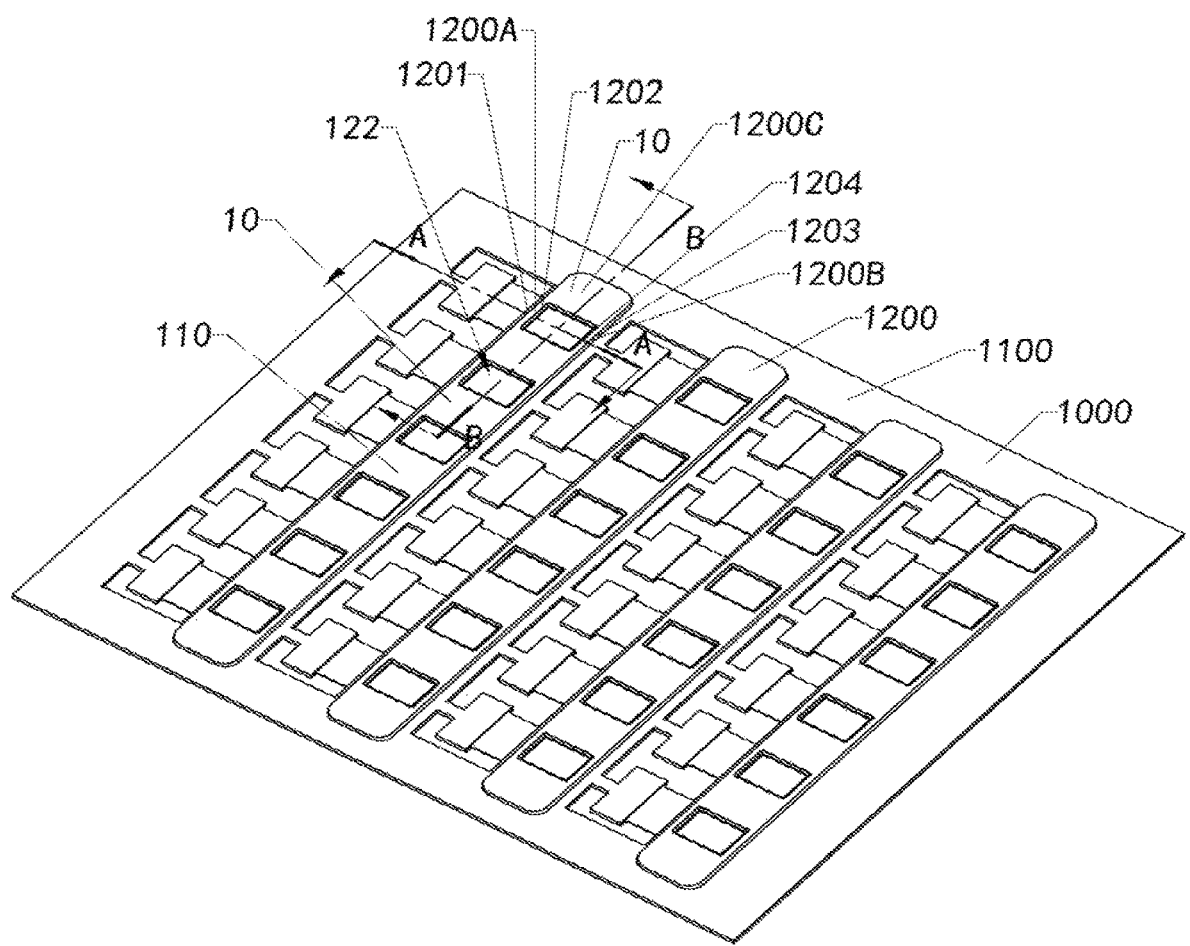
FIG. 4 is a schematic structural view of the photosensitive assembly jointed panel of the camera module according to the first preferred embodiment of the present application.
Figure 5A:
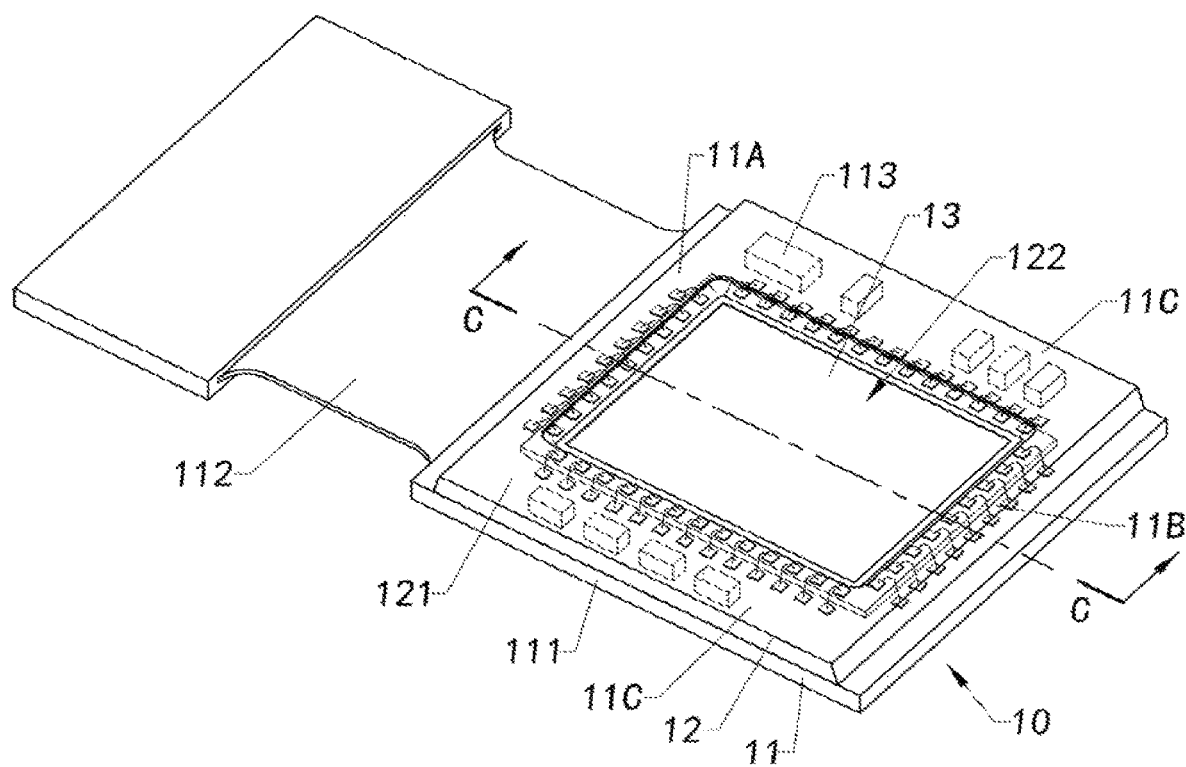
FIG. 5A is an enlarged structural schematic view of the photosensitive assembly of the camera module according to the first preferred embodiment of the present application.
Figure 5B:
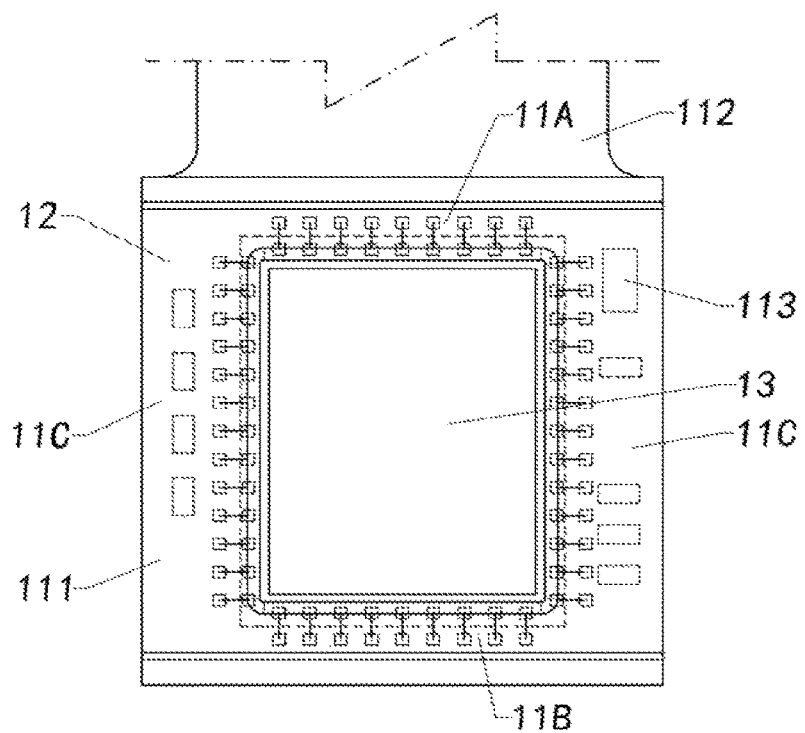
FIG. 5B is an enlarged structural schematic top view of the photosensitive assembly of the camera module according to the first preferred embodiment of the present application.

As shown in FIG. 10, after the molding material 14 is cured to form the one-piece molding base 1200, a demolding process of the present application is performed, that is, the die fixing device 230 makes the first die 211 and the second die 212 to be away from each other, so that the light window molding portion 214 is separated from the one-piece molding base 1200, thereby the light window 122 corresponding to each of the photosensitive elements 13 is formed in the one-piece molding base 1200. As shown in FIGS. 4 to 6, the prepared photosensitive assembly jointed panel 1000 can be further cut to obtain an individual photosensitive assembly 10. Each of the photosensitive assemblies 10 includes at least one circuit board 11, at least one photosensitive element 13 and the molding base 12 integrally molded on the circuit board 11 and the photosensitive element 13. Each of the circuit boards 11 includes a rigid region 111 and a flexible region 112 combined with each other, That is, each of the circuit boards 11 can be implemented as a rigid-flex combined board in this embodiment of the present application. Wherein, the molding base 12 is integrally molded on the rigid region 111 of the circuit board 11 and at least a part of the non-photosensitive region 132 of the photosensitive element 13, and forms the light window 122 that provides a light path for the photosensitive region 131 of the photosensitive element 13.

It is worth mentioning that the manufacturing method of the photosensitive assembly jointed panel 1000 of the present application is suitable for manufacturing the photosensitive assembly 10 with a small size. Therefore, in the molding process, the volumes of the first diversion groove 2151 and the second diversion groove 2152 are relative small. As can be seen from FIGS. 7A to 10, the cross sections of the first diversion groove 2151 and the second diversion groove 2152 are substantially trapezoidal. Wherein, the widths of the bottom ends of the first diversion grooves 2151 and the second diversion grooves 2152 are limited in size and cannot be widened.

Therefore, according to the embodiment of the present application, an inner surface of the one-piece molding base 1200 facing the light window 122, that is, a first side surface 1201 of the first diversion groove 2151 and a second side surface 1202 of the second diversion groove 2152 are provided as a two-end structure.

Figure 6A:
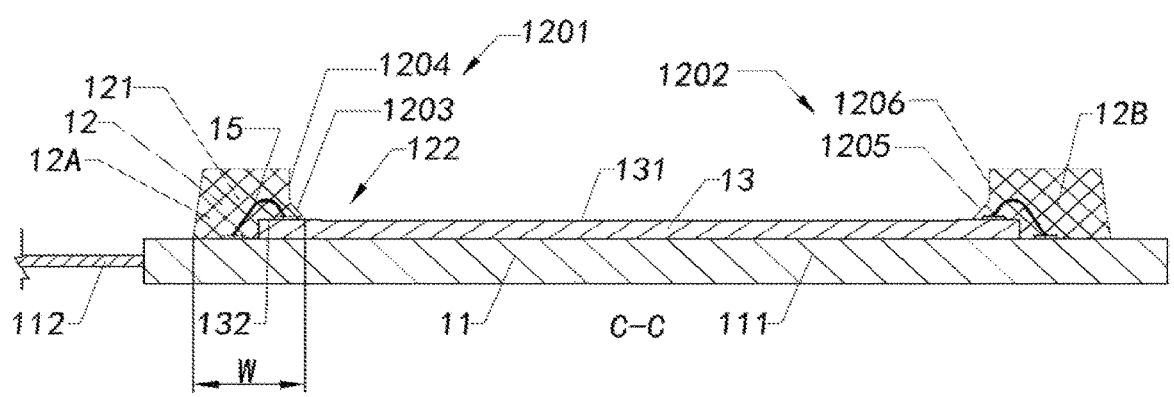
FIG. 6A is a cross-sectional view of the photosensitive module of the camera module according to the above mentioned first preferred embodiment of the present application, taken along the line C-C in FIG. 5A.
Figure 6B:
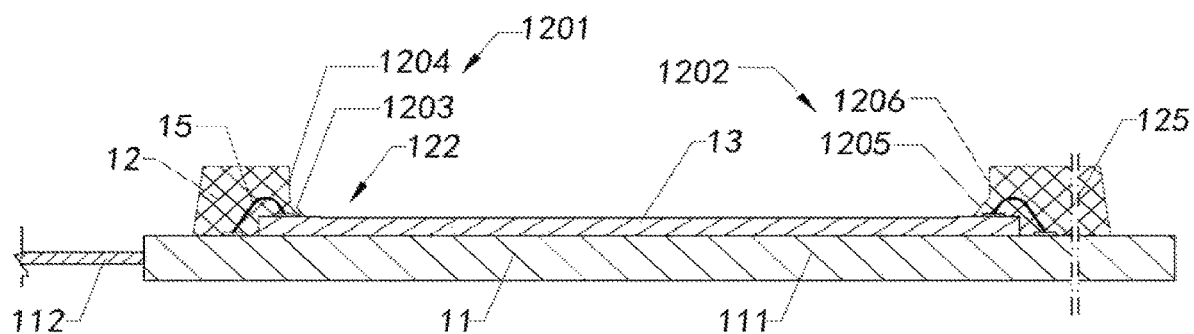
FIG. 6B is a cross-sectional view of a second end side of the photosensitive module of the camera module according to the above mentioned first preferred embodiment of the present application after being further cut.
Figure 11:
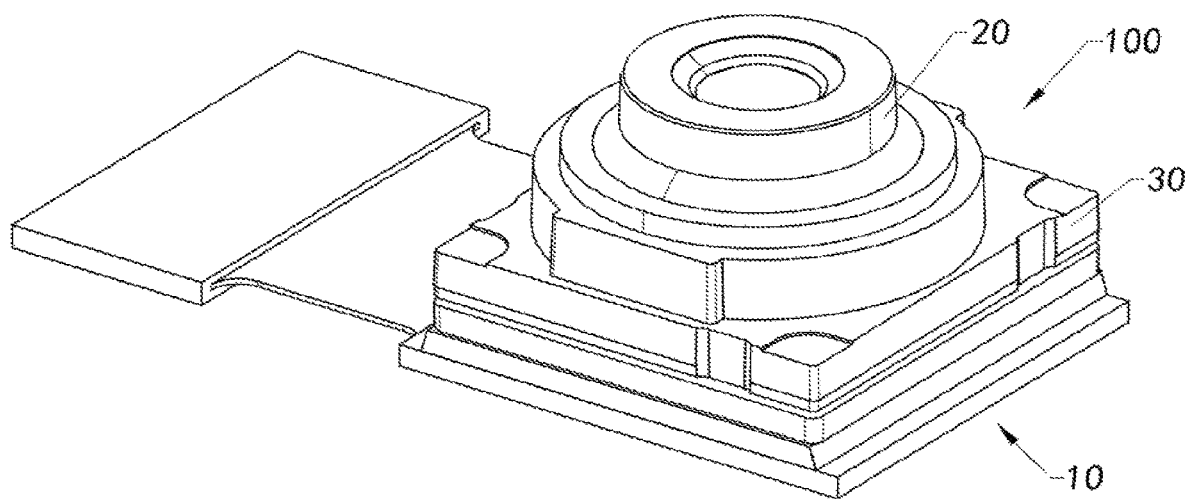
FIG. 11 is a schematic view illustrating a three-dimensional structure of the camera module according to the above mentioned first preferred embodiment of the present application.
Figure 12:
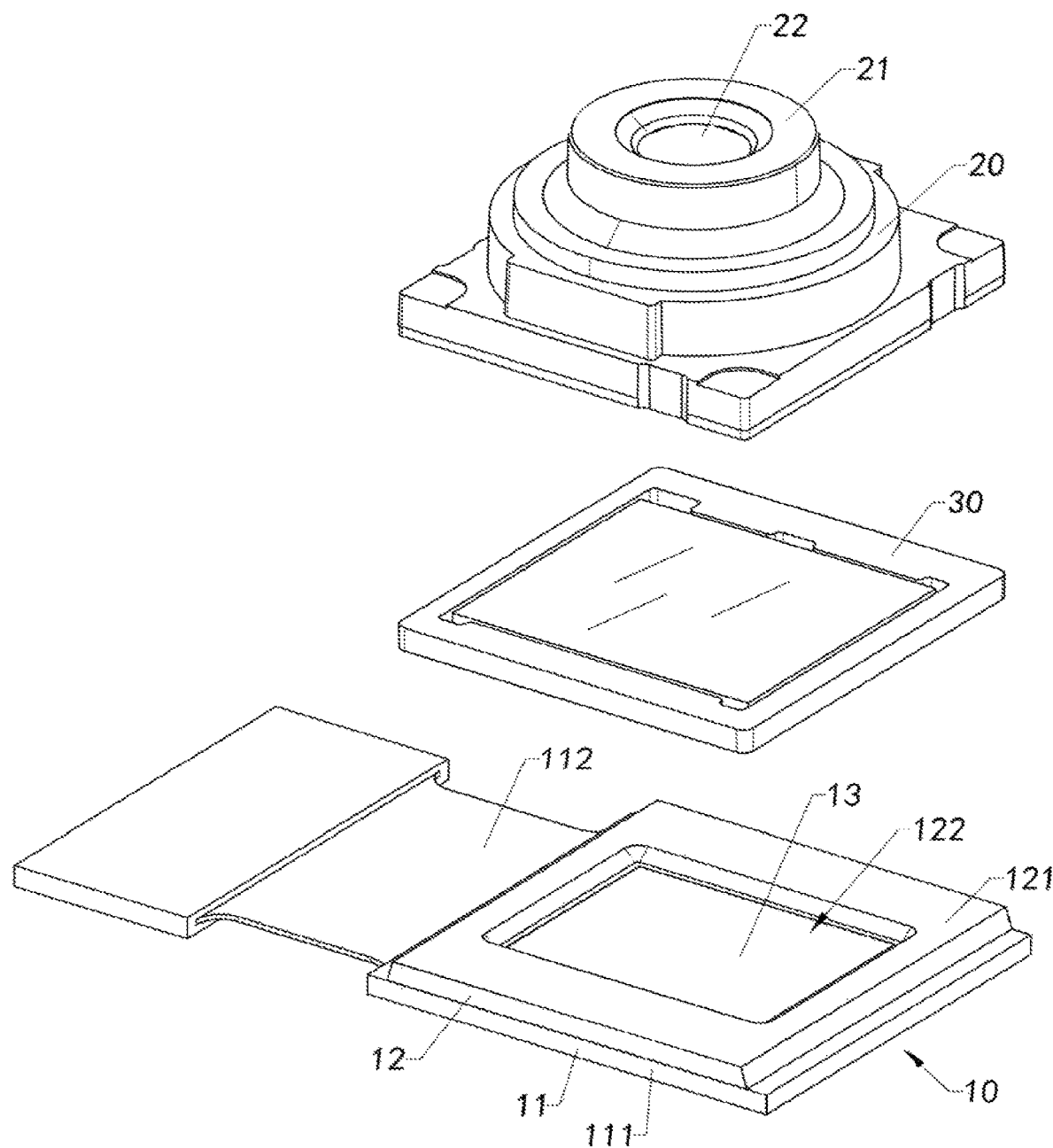
FIG. 12 is a schematic exploded view illustrating the camera module according to the above mentioned first preferred embodiment of the present application.

Specifically, as shown in FIGS. 6A and 6B, the first side surface 1201 includes a first partial surface 1203 provided adjacent to the photosensitive element 13 and a second partial surface 1204 connected to the first partial surface, and a first angle of the first partial surface 1203 relative to an optical axis of the camera module is greater than a second angle of the second partial surface 1204 relative to the optical axis. That is, from the perspective of FIGS. 6A and 6B, the first partial surface 1203 and the second partial surface 1204 extend from bottom to top, and the inclination of the first partial surface 1203 is greater than that of the second partial surface 1204. In this way, because the second partial surface 1204 is inclined toward the light window direction with respect to the first partial surface 1203, the cross-sectional area of the first diversion groove 2151 is increased, thereby further increasing the volume of the first diversion groove 2151.

Similarly, the second side surface 1202 includes a third partial surface 1205 provided adjacent to the photosensitive element 13 and a fourth partial surface 1206 connected to the third partial surface, and a third angle of the third partial surface 1205 relative to the optical axis of the camera module is greater than a fourth angle of the fourth surface portion 1206 relative to the optical axis. That is, from the perspective of FIGS. 6A and 6B, the third partial surface 1205 and the fourth partial surface 1206 extend from bottom to top, and the inclination of the third partial surface 1205 is greater than that of the fourth partial surface 1206. In this way, because the fourth partial surface 1206 is inclined toward the light window direction with respect to the third partial surface 1205, the cross-sectional area of the second diversion groove 2152 is increased, thereby further increasing the volume of the second diversion groove 2152.

Preferably, in the embodiment of the present application, the cross-sectional design of the first diversion groove 2151 and the second diversion groove 2152 has symmetry, that is, the first angle of the first partial surface 1203 is equal to the third angle of the third partial surface 1205, the second angle of the second partial surface 1204 is equal to the fourth angle of the fourth partial surface 1206. Considering the influence of the stray light of the camera module, the first angle and the third angle are set to 3°~80°. In addition, considering other factors of the module process and the structure and material characteristics of the molding base of the camera module, the second angle and the fourth angle are set to 0°~20°.

Here, it should be noted that the second angle and the fourth angle in the embodiment of the present application are further preferably set to 0 degrees, that is, the second partial surface 1204 and the fourth partial surface 1206 extend perpendicular to the surface of the photosensitive element 13 upwardly. On one hand, it can maximize the cross-sectional region of the diversion groove, on the other hand, it will not affect the light incident on the photosensitive chip of the camera module.

Those skilled in the art can understand that, on one hand, the cross-sectional shape of the diversion groove will affect the flow of the molding material, on the other hand, it also directly determines the cross-sectional shape of the resulting molding base.

By the two-stage design of the first side surface 1201 and the second side surface 1202, that is, by the smaller inclination of the second partial surface 1204 relative to the first partial surface 1203, and the smaller inclination of the fourth partial surface 1206 relative to the third partial surface 1205, it can further increase the area of the upper surface of the molding base, so that it is convenient to support other components of the camera module such as a lens holder.

Therefore, in the embodiment of the present application, in addition to considering the influence of specific shape and size factors on the cross-sectional shape of the diversion groove, the influence of the shape and size factors on the shape of the molding base needs to be further considered.

Specifically, since the molding base needs to cover a connecting wire 15, the heights of the first side surface 1201 and the second side surface 1202 in a direction perpendicular to the surface of the photosensitive element 13 need to be further defined.

Preferably, in the embodiment of the present application, a first height of the first partial surface 1203 in a direction perpendicular to the surface of the photosensitive element 13 and a third height of the third partial surface 1205 in the direction are 0.05 mm~0.7 mm. In this way, it can be ensured that the formed molding base can cover the connecting wire 15 well. In addition, considering the molding base as a whole to cover the connecting wire 15 and structural factors that further supports the lens holder, a second height of the second partial surface 1204 in a direction perpendicular to the surface of the photosensitive element 13 and a fourth height of the fourth partial surface 1206 in the direction are 0.02 mm~0.6 mm.

Through the second partial surface 1204 and the fourth partial surface 1206, the height of the molding base can be further increased, which avoids pressing the connecting wire 15 when installing other components of the camera module, such as the lens holder, thereby affecting the performance of the camera module.

In this way, by setting the side surface of the diversion groove to a two-stage shape, a smooth flow of the molding material as a fluid in the diversion groove can be ensured. Specifically, the fluid-like molding material 14 can flow forward along the first diversion groove 2151 and the second diversion groove 2152 and the entire base jointed panel molding guide groove 215 is filled with the molding material 14 before the molding material 14 is cured.

Accordingly, the molding process of the present application obtains the photosensitive assembly jointed panel 1000, including: one or more rows of the circuit board 11, one or more rows of the photosensitive elements 13, and one or more one-piece molding bases 1200. Each row of the circuit boards 11 includes one or more circuit boards 11 arranged side by side, each of the circuit boards 11 includes the rigid region 111 and the flexible region 112 combined with each other. Each of the one-piece molding bases 1200 is integrally molded on a row of the circuit boards 11 and a row of the photosensitive elements 13 and forms the light windows 122 that provide a light path for each of the photosensitive elements 13. Wherein, a portion 1200A of the one-piece molding base corresponding to a first end side of the one-piece molding base 1200 adjacent to the flexible region 112 has a first side surface 1201, the first side surface 1201 includes a first partial surface 1203 provided adjacent to the photosensitive element 13 and a second partial surface 1204 connected to the first partial surface, and a first angle of the first partial surface 1203 relative to an optical axis of the camera module is greater than a second angle of the second partial surface 1204 relative to the optical axis. A portion 1200B of the one-piece molding base corresponding to an opposite second end side of the one-piece molding base 1200 away from the flexible region 112 has a second side surface 1202, the second side surface 1202 includes a third partial surface 1205 provided adjacent to the photosensitive element 13 and a fourth partial surface 1206 connected to the third partial surface, and a third angle of the third surface 1205 relative to the optical axis of the camera module is greater than a fourth angle of the fourth surface 1206 relative to the optical axis. Wherein, the first end side of the one-piece molding base 1200 corresponds to a combined side of the rigid region 111 and the flexible region 112 of the circuit board 11, that is, the proximal side near the flexible region 112; and the second end side of the one-piece molding base 1200 corresponds to the distal side of the circuit board 11 away from the flexible region 112.

A single photosensitive assembly 10 can be obtained after the photosensitive assembly jointed panel 1000 is cut, wherein, in the cutting step, it can be cut on the two wing sides of the one-piece molding base 1200 except for the first end side and the second end side to obtain the molding base 12, and the portion 1200B of the molding base corresponding to the second end side is not cut, so that the photosensitive assembly 10 having a portion 1200C of the one-piece molding base on a pair of opposite wing sides is obtained.

As shown in FIG. 6A, correspondingly, the photosensitive assembly 10 includes the circuit board 11, the photosensitive element 13 and the molding base 12. The circuit board 11 includes the rigid region 111 and the flexible region 112 combined with each other. The molding base 12 is integrally molded on the circuit board 11 and the photosensitive element 13 and forms the light window 122 that provides a light path for the photosensitive element 13. The circuit board 11 and the photosensitive element 13 are connected through a series of connecting wires 15. A portion 12A of the molding base corresponding to the first end side of the molding base 12 adjacent to the flexible region 112 has a first side surface 1201, the first side surface 1201 includes the first partial surface 1203 provided adjacent to the photosensitive element 13 and the second partial surface 1204 connected to the first partial surface, and a first angle of the first partial surface 1203 relative to the optical axis of the camera module is greater than a second angle of the second partial surface 1204 relative to the optical axis. A portion 12B of the molding base corresponding to the opposite second end side of the molding base 12 away from the flexible region 112 has a second side surface 1202, the second side surface 1202 includes the third partial surface 1205 provided adjacent to the photosensitive element 13 and the fourth partial surface 1206 connected to the third partial surface, and a third angle of the third partial surface 1205 relative to the optical axis of the camera module is greater than a fourth angle of the fourth surface portion 1206 relative to the optical axis.

As shown in FIG. 6B, accordingly, in order to further reduce the size of the photosensitive assembly 10, at least a part of the photosensitive assembly 10 on the opposite second end side of the molding base 12 away from the flexible region 112 is suitable for being removed, such as cutting with a knife, or grinding. Here, those skilled in the art can understand that the arrangement of the side surfaces is the same as that shown in FIG. 6A, and will not be repeated here.

Figure 1B:
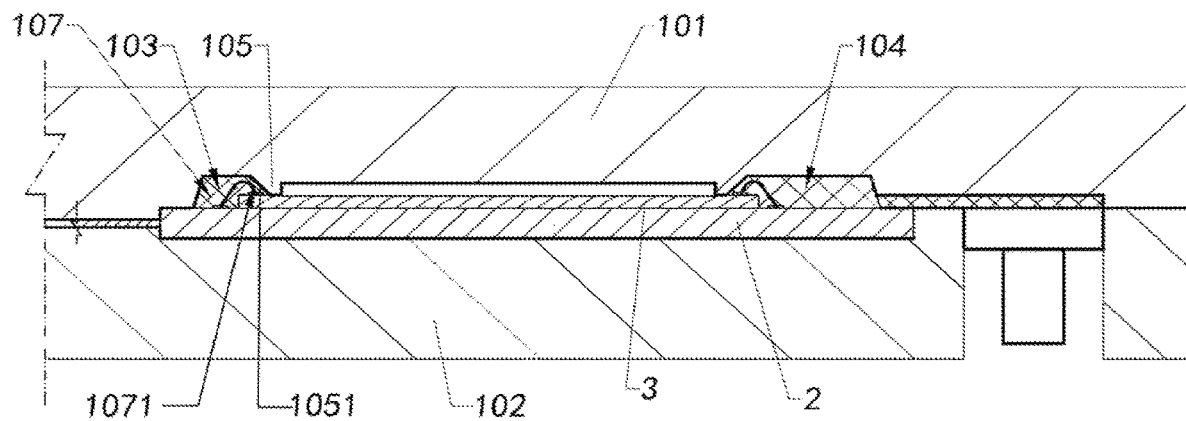
FIG. 1B is a schematic view of a molding process of forming an integrated packaging assembly by the existing integrated package process.
Figure 1C:
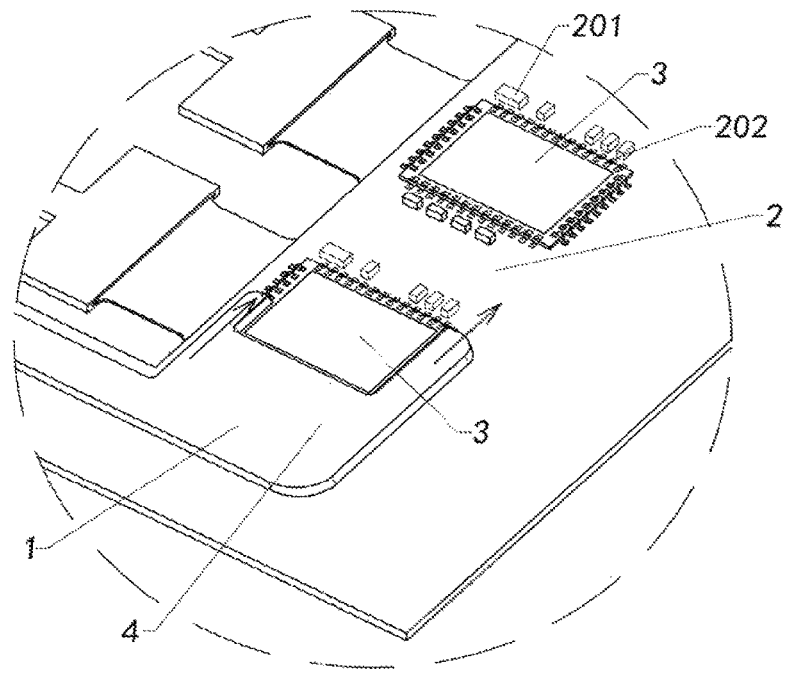
FIG. 1C is an enlarged structure view illustrating the forward flow of the packaging material along with two flow passages in the existing integrated packaging process.
Figure 1D:
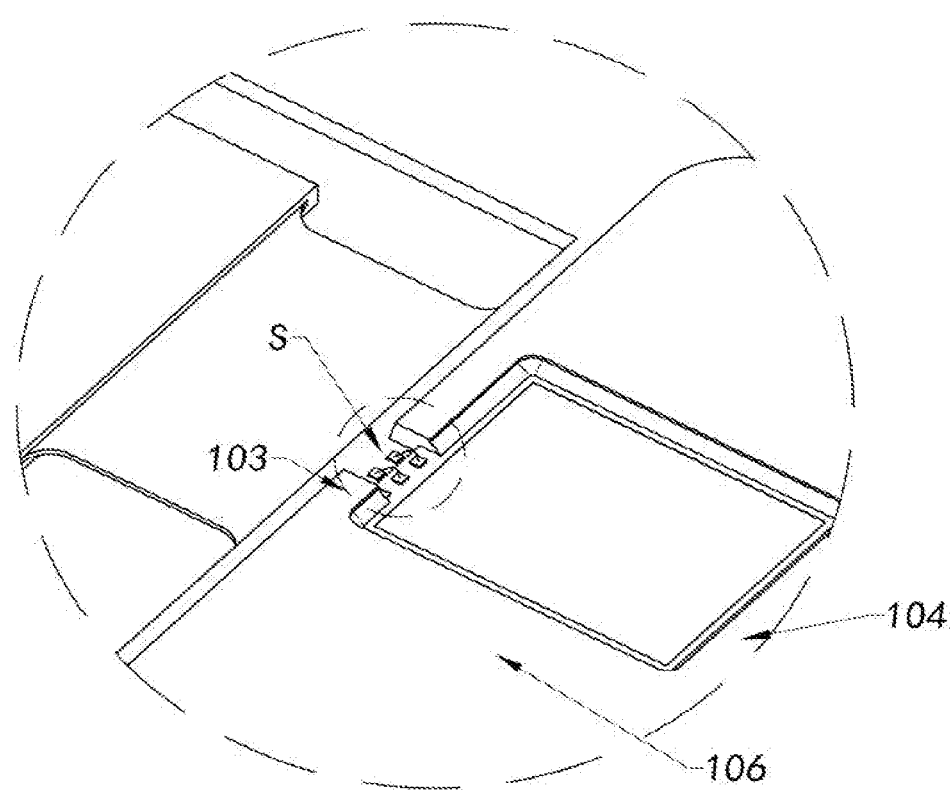
FIG. 1D is an enlarged structure view illustrating that the packaging material is partially not filled with in the existing integrated packaging process.
Figure 1E:
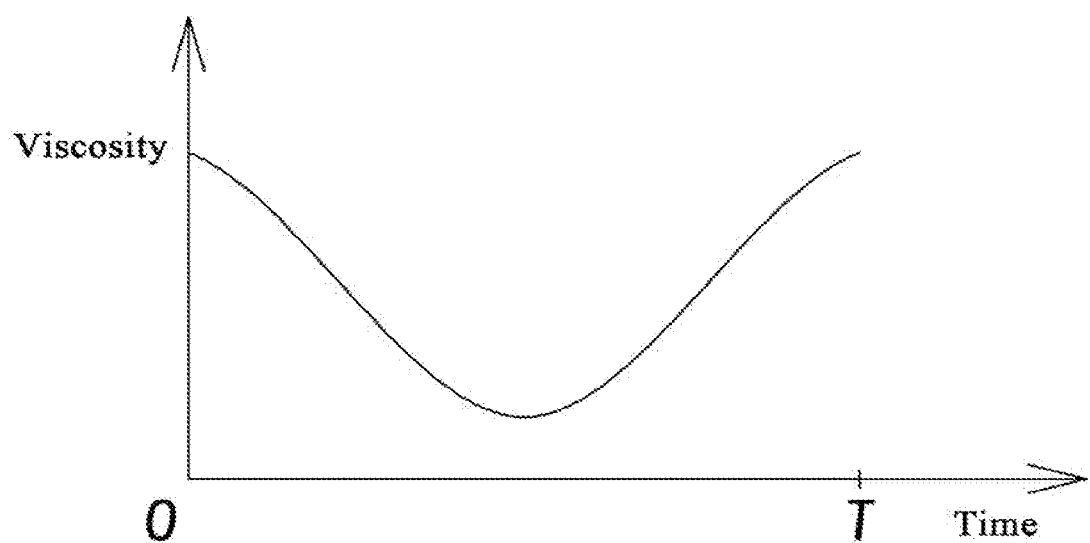
FIG. 1E is a schematic diagram of a viscosity change tendency of a molding material during curing time.
Figure 1F:
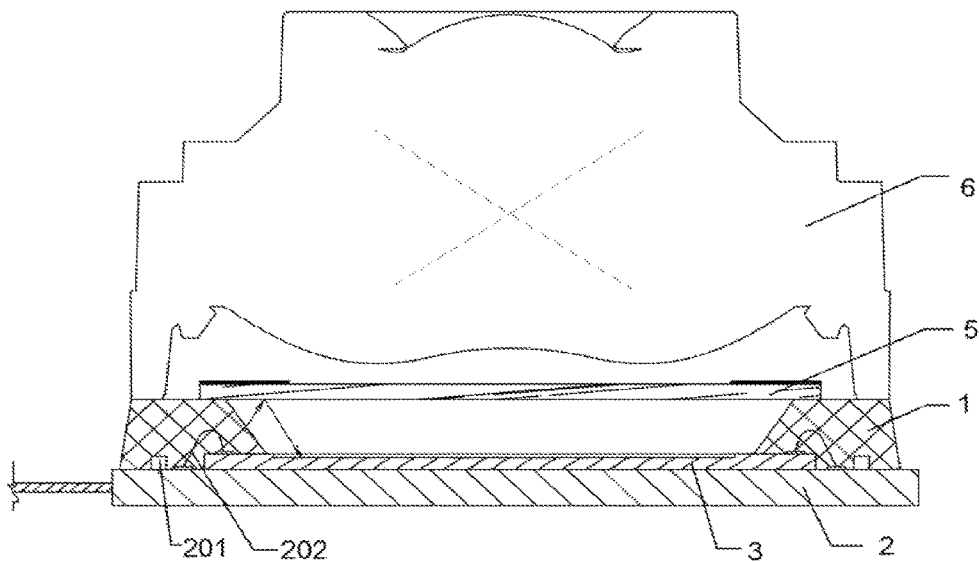
FIG. 1F is a schematic structural view of a camera module made of a photosensitive assembly packaged by the existing integrated packaging process.
Figure 2:
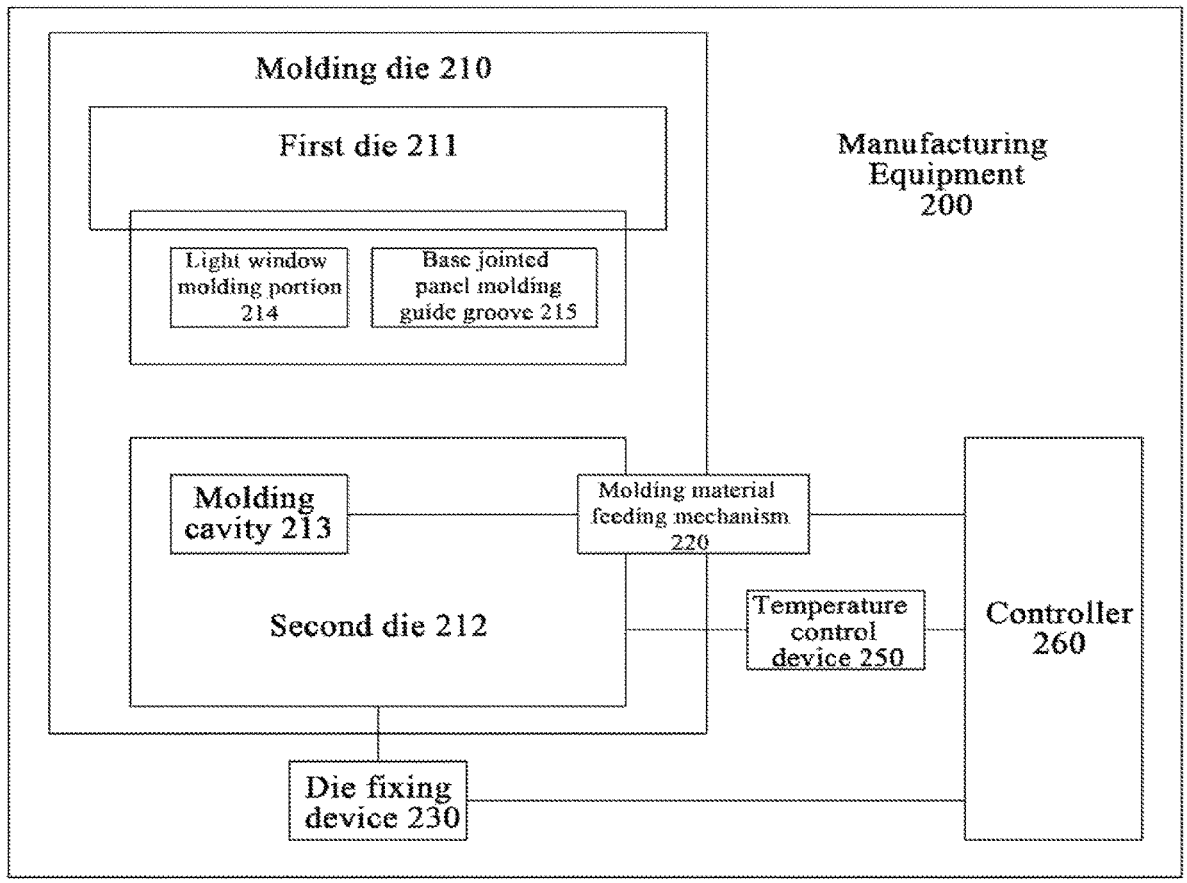
FIG. 2 is a schematic block view of a manufacturing equipment of a photosensitive assembly jointed panel for a camera module according to the first preferred embodiment of the present application.
Figure 3A:
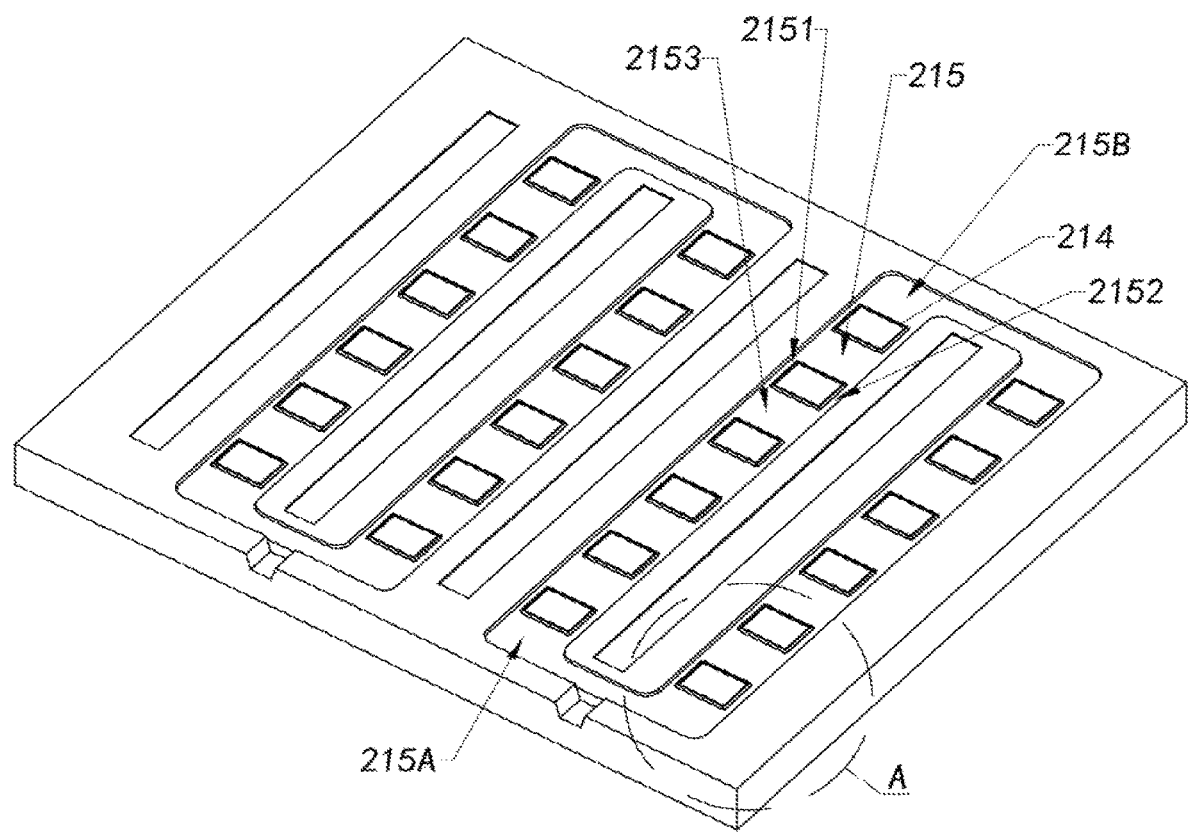
FIG. 3A is a schematic structural view of a molding die of the manufacturing equipment for the photosensitive assembly jointed panel of the camera module according to the above mentioned first preferred embodiment of the present application.
Figure 3B:
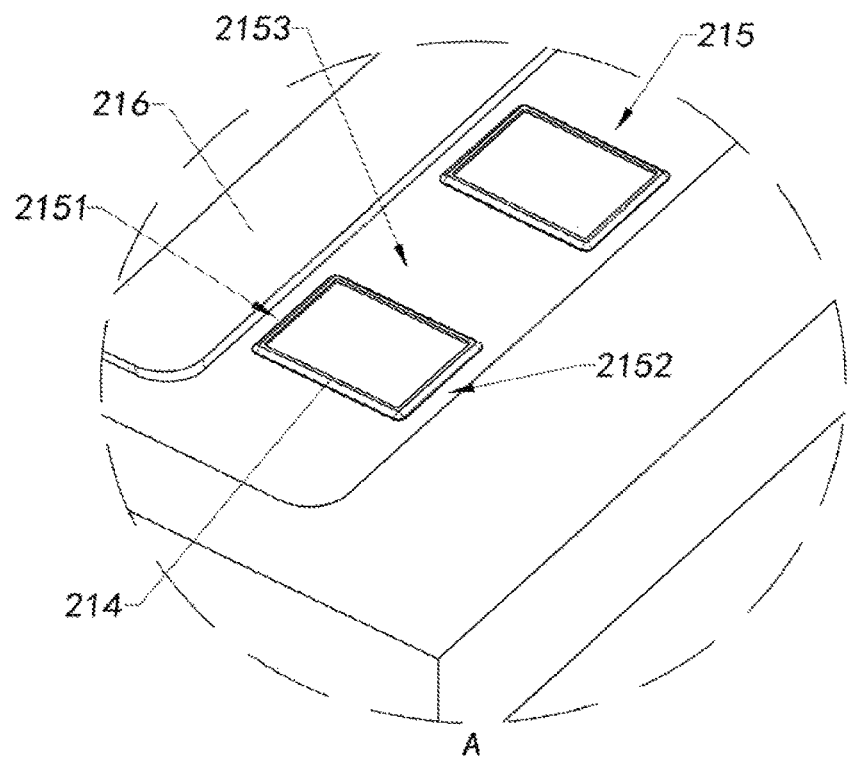
FIG. 3B is an enlarged structural schematic view of a partial region A of a first die of the molding die of the manufacturing equipment of the photosensitive assembly jointed panel of the camera module according to the above mentioned first preferred embodiment of the present application.

By smooth flow of the molding material 14 in the diversion groove, in the molding process, the molding material 14 can form the one-piece molding base 1200 on the circuit board jointed panel 1100, and the one-piece molding base 1200 can form the light window 122 closed all around at the position corresponding to each of the photosensitive elements 13, so that after cutting the formed one-piece photosensitive assembly jointed panel 1200, the molding base 12 having the light window 122 is formed on each of the circuit boards 11 and the corresponding photosensitive elements 13 to prevent a part of the molding base from forming an opening similar to that shown in FIG. 1C to communicate the light window 122 to the outside of the molding base 12.

That is, the molding material 14 of the present application can flow forward from the feeding ends 215A of the two diversion grooves 2151 and 2152 and fill the diversion grooves 2151 and 2152 and the filling groove 2153 of the entire base jointed panel molding guide groove 215. The molding material 14 can flow from the feed end 215A to the terminal end 215B along the two diversion grooves 2151 and 2152 before being cured. And before the viscosity of the molding material 14 reaches a high value and is cured, the molding material 14 can fill the base jointed panel molding guide groove 215, thereby preventing the connecting wire 15 between the circuit board 11 and the photosensitive elements 13 from being damaged by the molding material 14 having a high viscosity and flowing forward. In addition, through the symmetrical design of the two diversion grooves 2151 and 2152, the fluid in the two diversion grooves 2151 and 2152 flows substantially at the same step, and the two fluids are converged substantially in the filling groove 2153 to prevent the molding material 14 in a certain diversion groove from flowing to another diversion groove to hinder the molding material 14 in the another diversion groove from flowing forward. Moreover, no turbulence or sinuous flow is generated, the turbulence or sinuous flow would causes the connecting wires 15 connecting the circuit board 11 and the photosensitive element 13 to swing irregularly, resulting in deformation and damage. Accordingly, the molding material 14 of the present application can also be selected from a material with a relatively high viscosity range, thereby avoiding that when a material with a small viscosity range is selected, the molding material 14 easily enters into the photosensitive region 131 of the photosensitive element 13 to form a flash in the molding process.

In addition, it is worth mentioning that, as shown in FIG. 7B, in order to facilitate demolding and pressing on the rigid region 111 of the circuit board 11, the first die 211 further includes a plurality of pressing blocks 216. An outer edge 1201 of the molding base 12 and an outer edge of the rigid region 111 of the circuit board 11 will form a crimping edge 1111, that is, in the mold process, a region suitable for the pressing block 216 to be pressed onto the rigid region 111 of the circuit board 11. The pressing block 216 is further pressed over the flexible region 112 of each row of the circuit boards 11 to prevent the molding material 14 from flowing to the flexible region 112. In addition, the rigid regions 111 of each row of the circuit boards 11 are integrally molded to form an integrated rigid region jointed panel 110, thereby facilitating the pressing of the first die to each row of the circuit boards 11. As shown in FIG. 7A, on the side adjacent to the flexible region 112, a width W of a bottom end of the first diversion groove 2151 is 0.2 mm to 1 mm, which is suitable for manufacturing the photosensitive assembly 10 with a small size. Accordingly, the resulting photosensitive assembly 10 has a distance W between an inner edge and a outer edge of the portion 12A of the molding base on a side adjacent to the flexible region 112 of 0.2 mm to 1 mm.

Accordingly, the present application provides a method for manufacturing the photosensitive assembly 12 of the camera module 100, which includes the following steps:

fixing the circuit board jointed panel 1100 to the second die 212 of the molding die 210, wherein the circuit board jointed panel 1100 includes one or more rows of the circuit boards, and each row of the circuit boards includes one or more circuit board 11 arranged side by side, each of the circuit boards 11 includes a rigid region 111 and a flexible region 112 combined with each other, and each of the circuit boards 11 is operatively connected to the photosensitive element 13;

clamping the second die 212 and a first die 211 by the die fixing device 213, and filling a molten molding material 14 in abase jointed panel molding guide groove 215 in the molding die 210, wherein a position corresponding to the light window molding portion 214 is prevented from being filled with the molding material 14;

curing the molding material 14 in the base jointed panel molding guide groove 215 to form the one-piece molding base 1200 at a position corresponding to the base jointed panel molding guide groove 215, wherein the one-piece molding base 1200 is integrally molded on corresponding each row of the circuit board 11 and each row of the photosensitive elements 13 to form a photosensitive assembly jointed panel 1000 and forms a light window 122 that provides a light path for each of the photosensitive elements 13 at a position corresponding to the light window molding portion 214, wherein the base jointed panel molding guide groove 215 has a first diversion groove 2151 corresponding to a first end side of the one-piece molding base 1200 adjacent to the flexible region 112 and a second diversion groove 2152 corresponding to the one-piece molding base 1200 away from the flexible region 112, and a filling groove 2153 extending between the first diversion groove 2151 and the second diversion groove 2152 for filling the molding material 14 between the two adjacent photosensitive elements 13 in each row of the photosensitive elements 13 and between the two adjacent light window molding portions 214, wherein the first diversion groove 2151 has a first side surface 1201 facing the light window, the second diversion groove 2152 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surfaces 1204 relative to the optical axis, and a third angle of the third partial surface 1205 relative to the optical axis is greater than a fourth angle of the fourth partial surface 1206 relative to the optical axis, so that the cross-sectional shapes of the first diversion groove 2151 and the second diversion groove 2152 enable the molding material 14 to fill the base jointed panel molding guide groove 215 in the molding process of forming the one-piece molding base 1200 and the molding material 14 can reach the terminal ends 215B of the first diversion groove 2151 and the second diversion groove 2152 from the feeding ends 215A of the first diversion groove 2151 and the second diversion groove 2152, respectively;

cutting the photosensitive assembly jointed panel 1000 to obtain a plurality of photosensitive assemblies 10, wherein each of the photosensitive assemblies 10 includes the circuit board 11, the photosensitive element 13, and the molding base 12, wherein the molding base 12 is integrally molded on the circuit board 11 and the photosensitive element 13 and forms the light window 122 that provides a light path for the photosensitive element 13.

And, the method may further include the step of cutting a portion of the photosensitive assembly corresponding to the opposite second end side of the molding base 12 away from the flexible region 112, that is, a part of a portion 12B of the molding base and a part of the circuit board 11, so that the molding base 12B has a cutting surface 125 on the opposite second end side away from the flexible region 112.

As shown in FIGS. 5A to 6B, the circuit board 11 includes a plurality of electronic components 113 formed in the rigid region 111 and mounted by such as SMT process. The electronic components 113 include, but are not limited to, resistors, capacitors, driving devices, etc. In this embodiment of the present application, the molding base 12 integrally covers the electronic component 113, so as to prevent dust and debris from adhering to the electronic component 113, as in a conventional camera module, and further contaminating the photosensitive element 13, thereby affecting the imaging effect. In addition, preferably, the plurality of the electronic components 113 are provided on a first end side 11A and a second end side 11B of the rigid area 111 of the circuit board 11 except for the region adjacent to the flexible area 112 and away from the flexible area 112, and at least one wing side 11C on both sides of the photosensitive element 11 on the rigid region 111, wherein the molding base 12 integrally embeds the electronic component 113.

That is, referring to FIGS. 8 and 9, in the corresponding first diversion groove 2151 and second diversion groove 2152, the electronic component 113 is not included, and the electronic component 113 may be collectively provided in the filling groove 2153, so that during the molding process, there will not be any block in the first diversion groove 2151 and the second diversion groove 2152, so as not to affect the molding material 14 from flowing forward along with the first diversion groove 2151 and the second diversion groove 2152, so that the molding material 14 flows from the feeding end 215A to the terminal end 215B as soon as possible.

It can be understood that the connecting wires 15 may be provided on four sides of the photosensitive element 13 or may be collectively provided on both wing sides 11C of the rigid region 111 of the circuit board 11, so that they are also collectively located in the filling groove 2153 during the molding process, thereby not affecting the forward flow of the molding material 14 along with the first diversion groove 2151 and the second diversion groove 2152.

As shown in FIGS. 11 to 14, the camera module 100 to which the photosensitive assembly 10 of the present application is applied is manufactured. The camera module includes a photosensitive assembly 10, a lens 20 and a filter assembly 30. The photosensitive assembly 10 includes the circuit board 11, the molding base 12 and the photosensitive assembly 13. The lens 20 includes a structural member 21 and one or more lenses 22 accommodated in the structural member 21. The filter assembly 30 includes a filter element lens holder 31 and a filter element 32. The filter element lens holder 31 is assembled on the top side of the molding base 12, and the lens 20 is directly assembled on the top side of the filter element lens holder 31 to form a fixed focus camera module. Wherein in this embodiment, the top side of the molding base 12 is a flat surface, the filter element lens holder 31 is assembled on the flat top surface of the molding base 12, and the filter element 32 plays a role of filtering the light passing through the lens 20, for example, it can be implemented as a filter for filtering infrared rays, which is located between the lens 20 and the photosensitive element 13. In this way, the light passing through the lens 30 can pass through the filter element 32 and reach the photosensitive element 13 through the light window 122, so that after the photoelectric conversion effect, the camera module 100 can be made to provide an optical image.

Figure 13A:
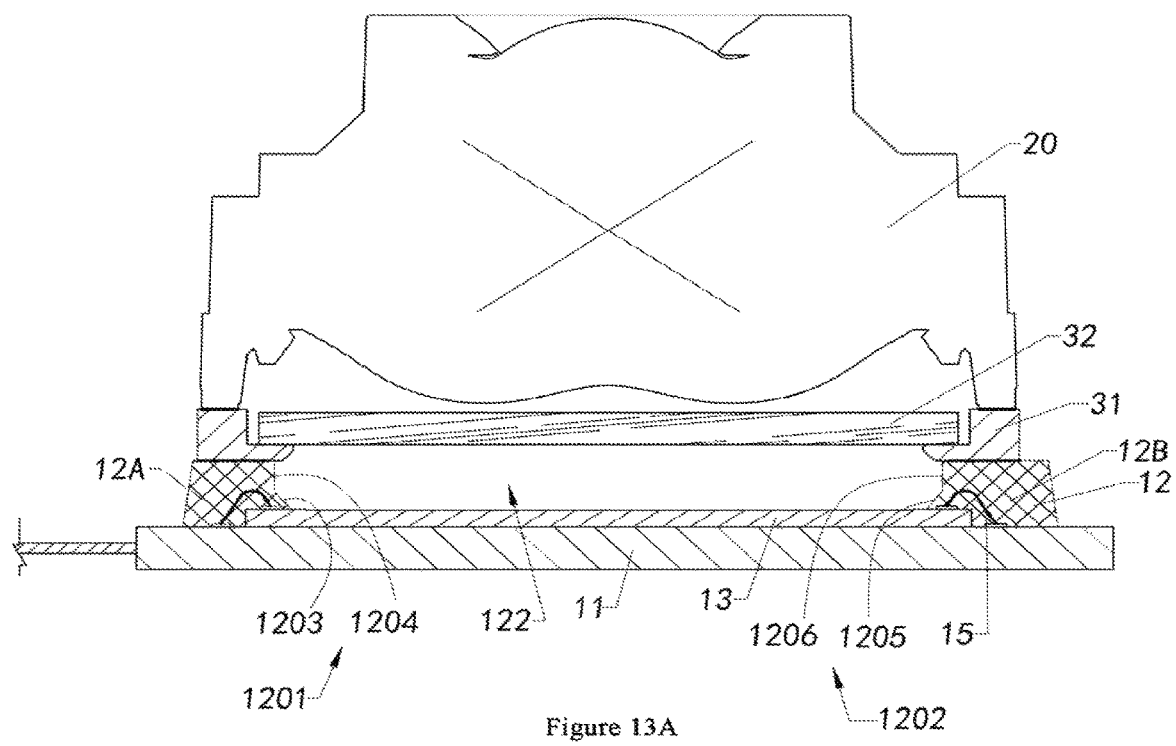
FIG. 13A is a cross-sectional view illustrating the camera module according to the above mentioned first preferred embodiment of the present application, taken along line D-D in FIG. 12.
Figure 13B:
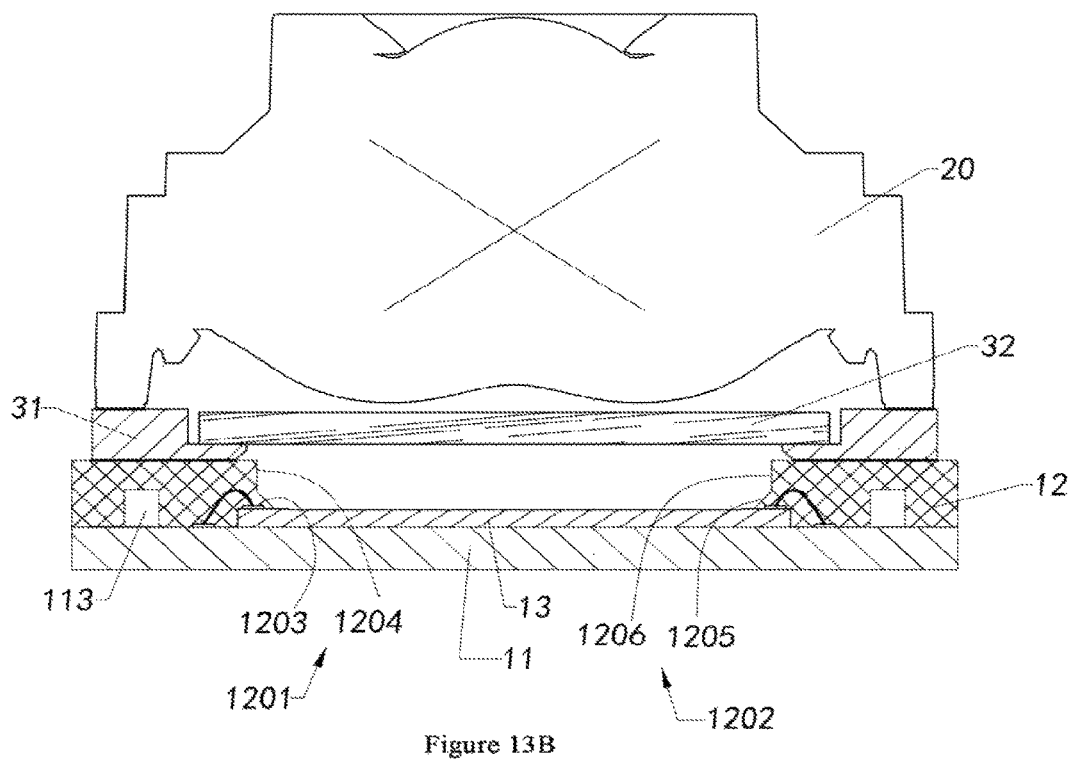
FIG. 13B is a cross-sectional view illustrating the camera module according to the above mentioned first preferred embodiment of the present application, taken along line E-E in FIG. 12.
Figure 14:
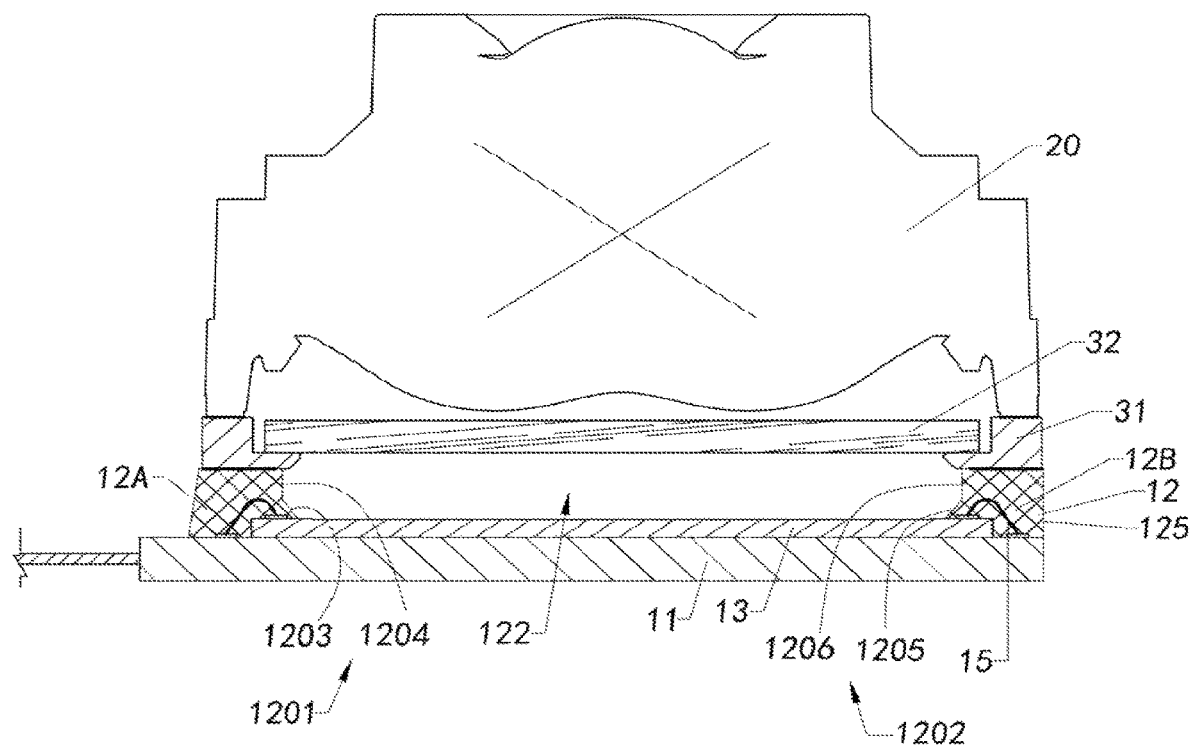
FIG. 14 is a cross-sectional view illustrating a variant embodiment of the camera module according to the above mentioned first preferred embodiment of the present application.

As shown in FIG. 13A, in the photosensitive assembly 10 of the camera module 100, a portion 12A of the molding base corresponding to the first end side of the molding base 12 adjacent to the flexible region 112 has a first side surface 1201 facing the light window, and a portion 12B of the molding base corresponding to the opposite second end side of the molding base 12 away from the flexible region 112 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis, so that the small-sized photosensitive assembly 10 can be obtained, so that the overall size of the camera module 100 is further reduced. It can be understood that the opposite second side of the molding base 12 away from the flexible region 112 can be further formed into a cutting side, so that the remaining part after the molding base 12 being cut has a cutting surface 125, as shown in FIG. 4. In addition, as shown in FIG. 13B, it can be seen that, the electronic components 113 may be collectively provided on at least one of the two wing sides of the photosensitive assembly 10, for example, may be collectively located on the two wing sides.

It can be understood that, in another variant embodiment, the filter element lens holder 31 may not be provided, and the filter element 32 may be directly assembled on the molding base 12, or the filter element 32 is assembled on the lens 20, or the filter element 32 is assembled to a load-supporting part of the lens 20, such as a driver or a fixed lens barrel.

Figure 15:
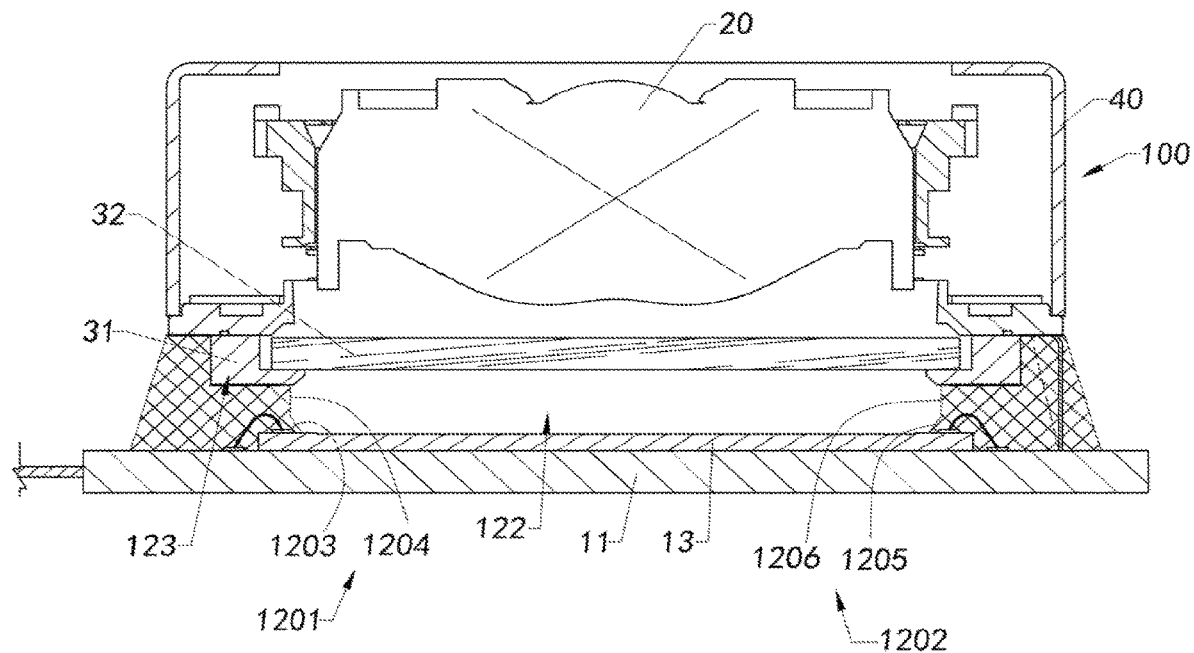
FIG. 15 is a cross-sectional view illustrating a camera module according to another variant embodiment of the camera module of the above mentioned first preferred embodiment of the present application.

As shown in FIG. 15, the camera module 100 may include a load-supporting part 40, which is a driver or a fixed lens barrel, in this figure, it is a driver such as a voice coil motor, a piezoelectric motor, etc., to form a variable-focus camera module, the lens 20 is mounted on the driver. The molding base 12 has a groove 123 on the top side, which can be used to mount the filter element lens holder 31, and the driver can be directly mounted on the top side of the molding base 12. It can be understood that, in another variant embodiment, the load-supporting part 40 may also be mounted on the filter element lens holder 31, or a part of the load-supporting part 40 may be mounted on the filter element lens holder 31, and the other part thereof may be mounted on the molding base 12.

Figure 16:
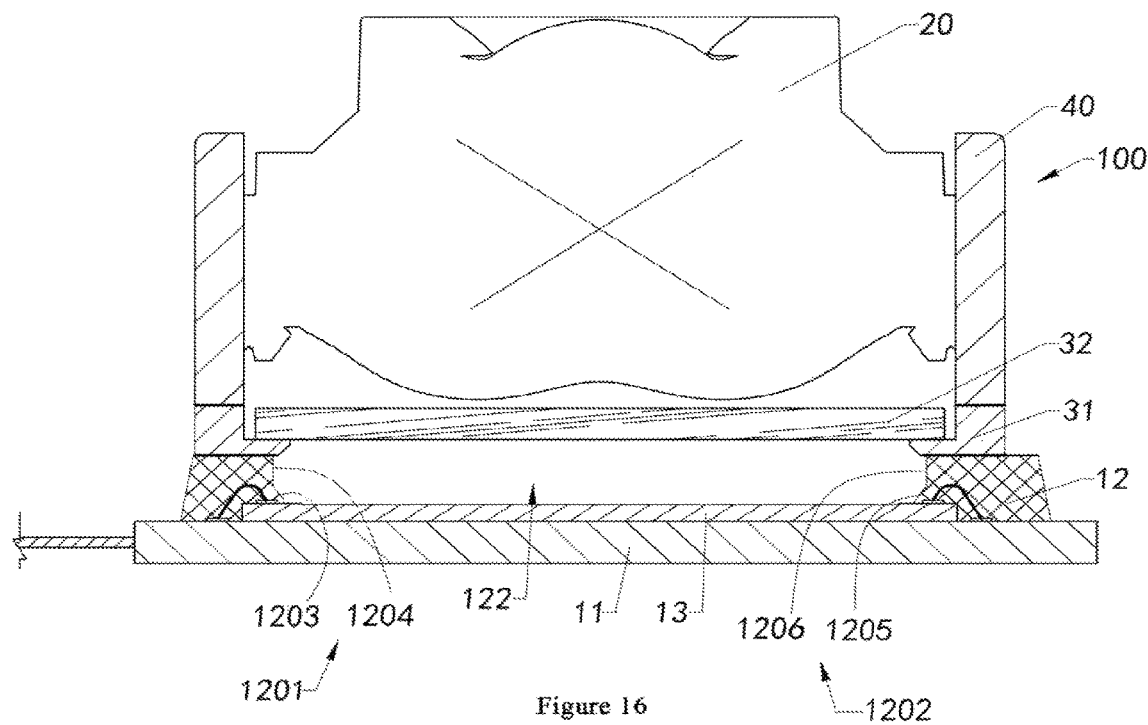
FIG. 16 is a cross-sectional view of a camera module according to another variant embodiment of the camera module of the above mentioned first preferred embodiment of the present application.
Figure 17A:
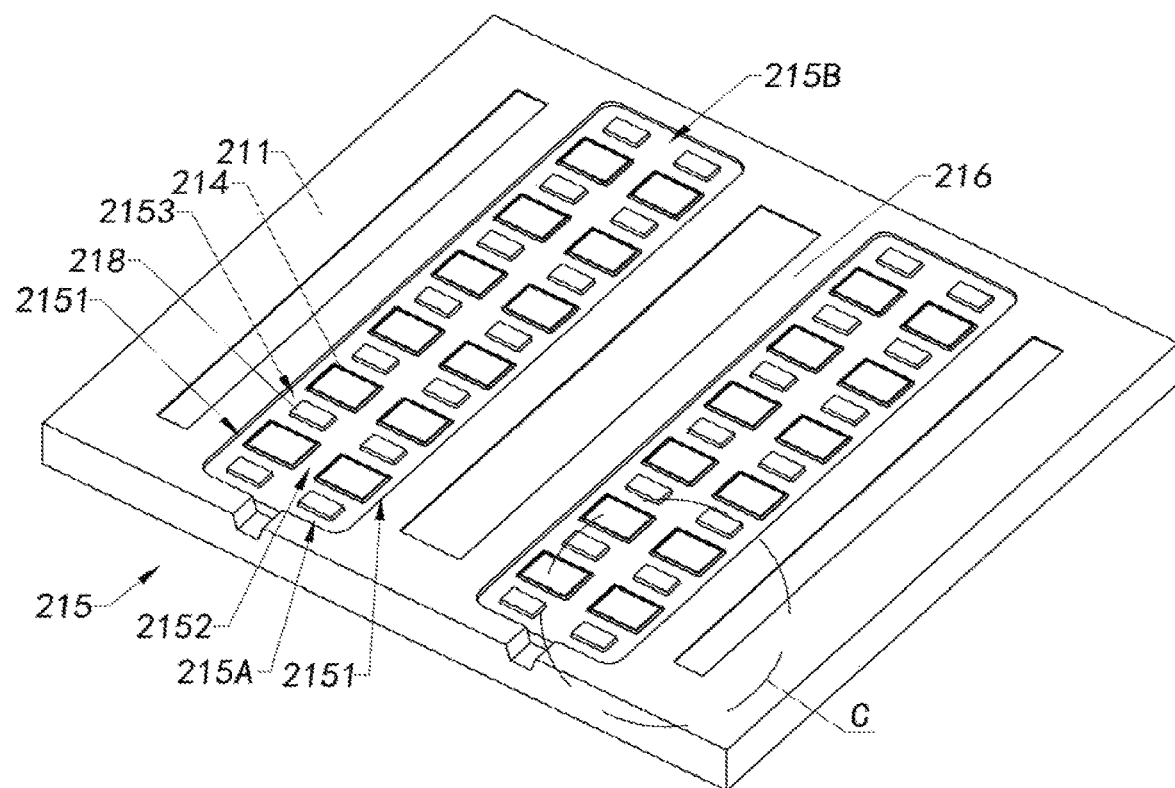
FIG. 17A is a schematic structural view of a molding die of a manufacturing equipment of a photosensitive assembly jointed panel of a camera module according to a second preferred embodiment of the present application.
Figure 17B:
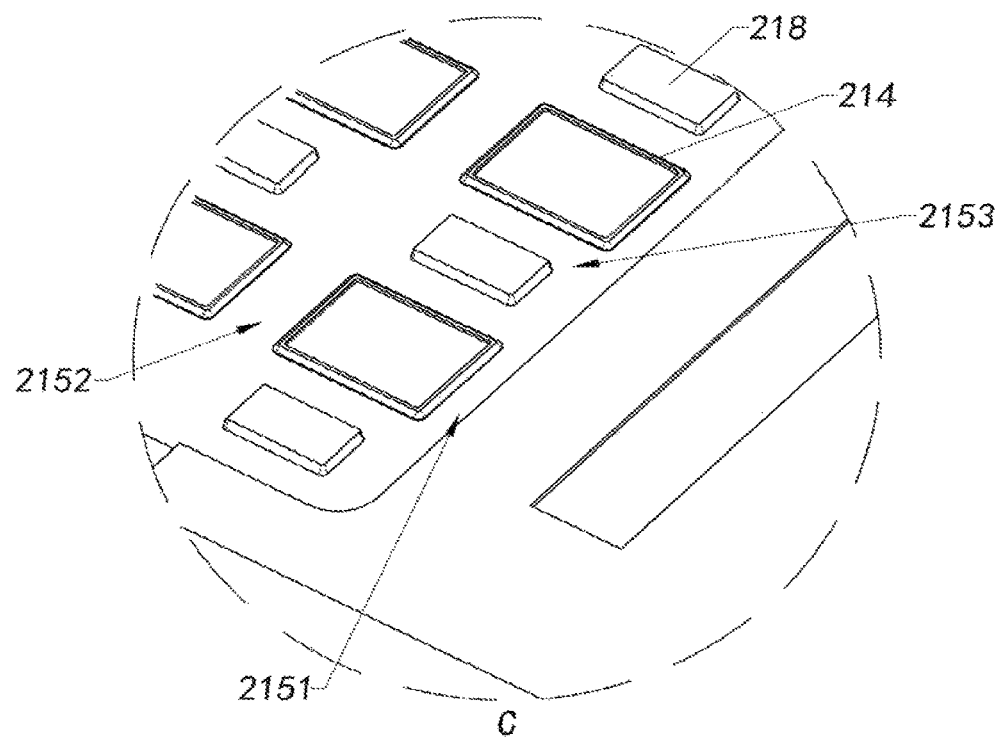
FIG. 17B is an enlarged schematic structural view of a partial region C of a first die of the molding die of the manufacturing equipment of the photosensitive assembly jointed panel of the camera module according to the above mentioned second preferred embodiment of the present application.
Figure 18:
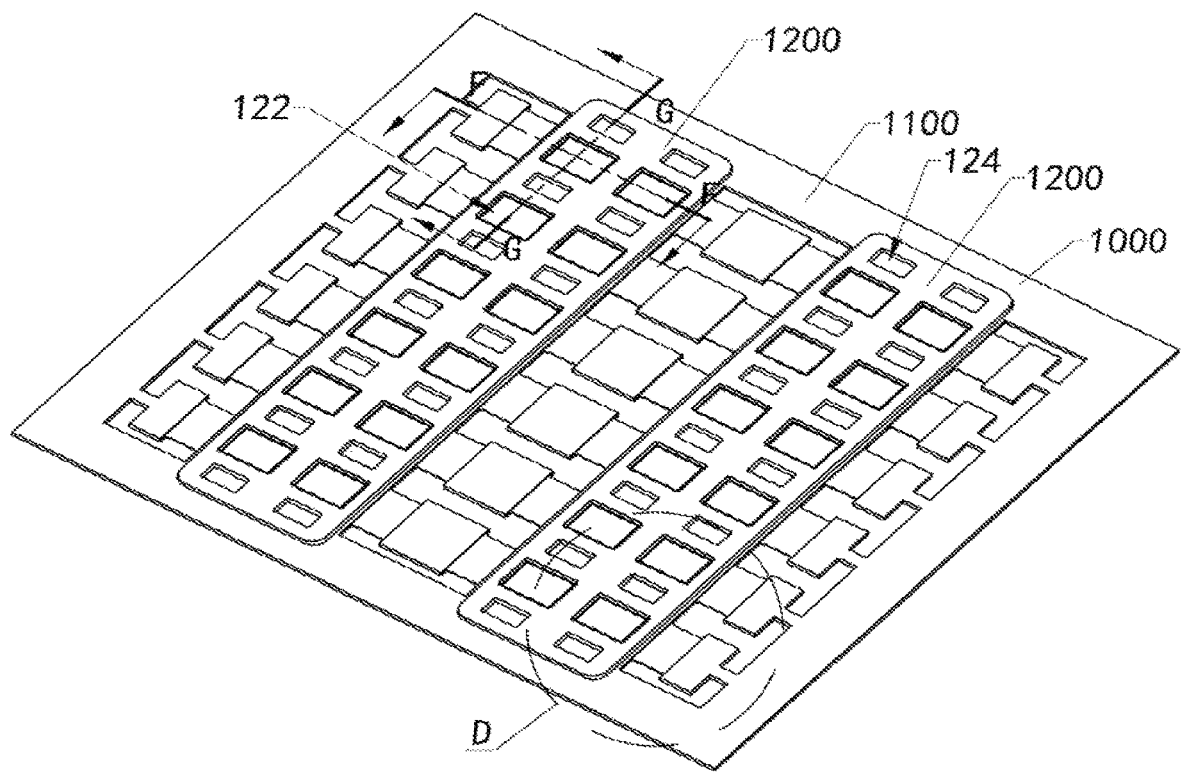
FIG. 18 is a schematic structural view of the photosensitive assembly jointed panel of the camera module according to the above mentioned second preferred embodiment of the present application.
Figure 19A:
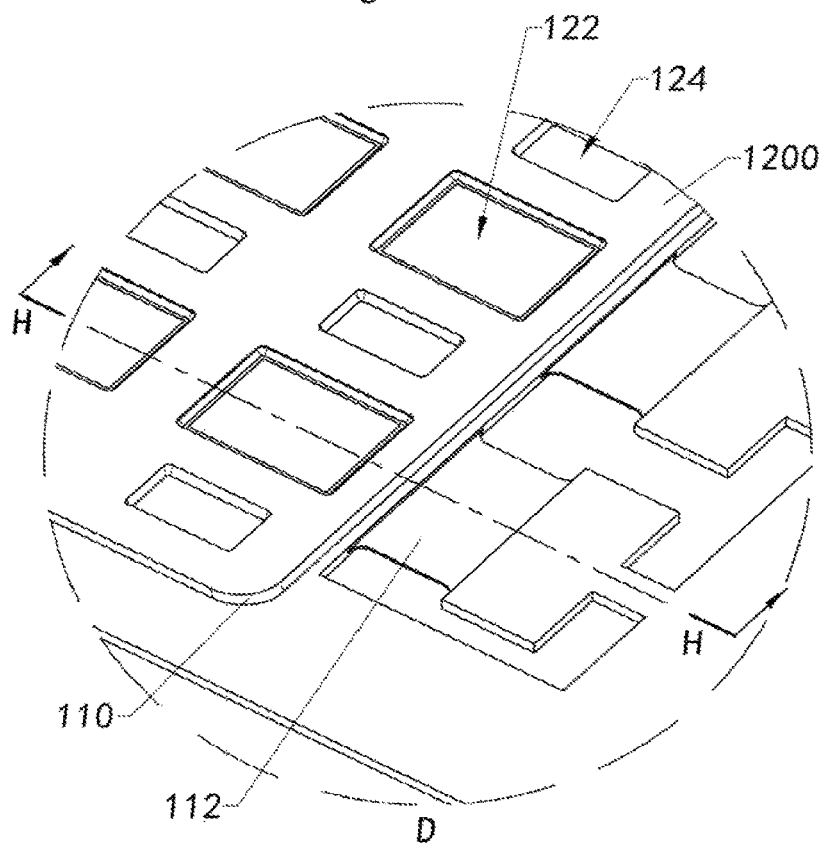
FIG. 19A is an enlarged structural schematic view at D of the photosensitive assembly jointed panel of the camera module according to the above mentioned second preferred embodiment of the present application.
Figure 19B:
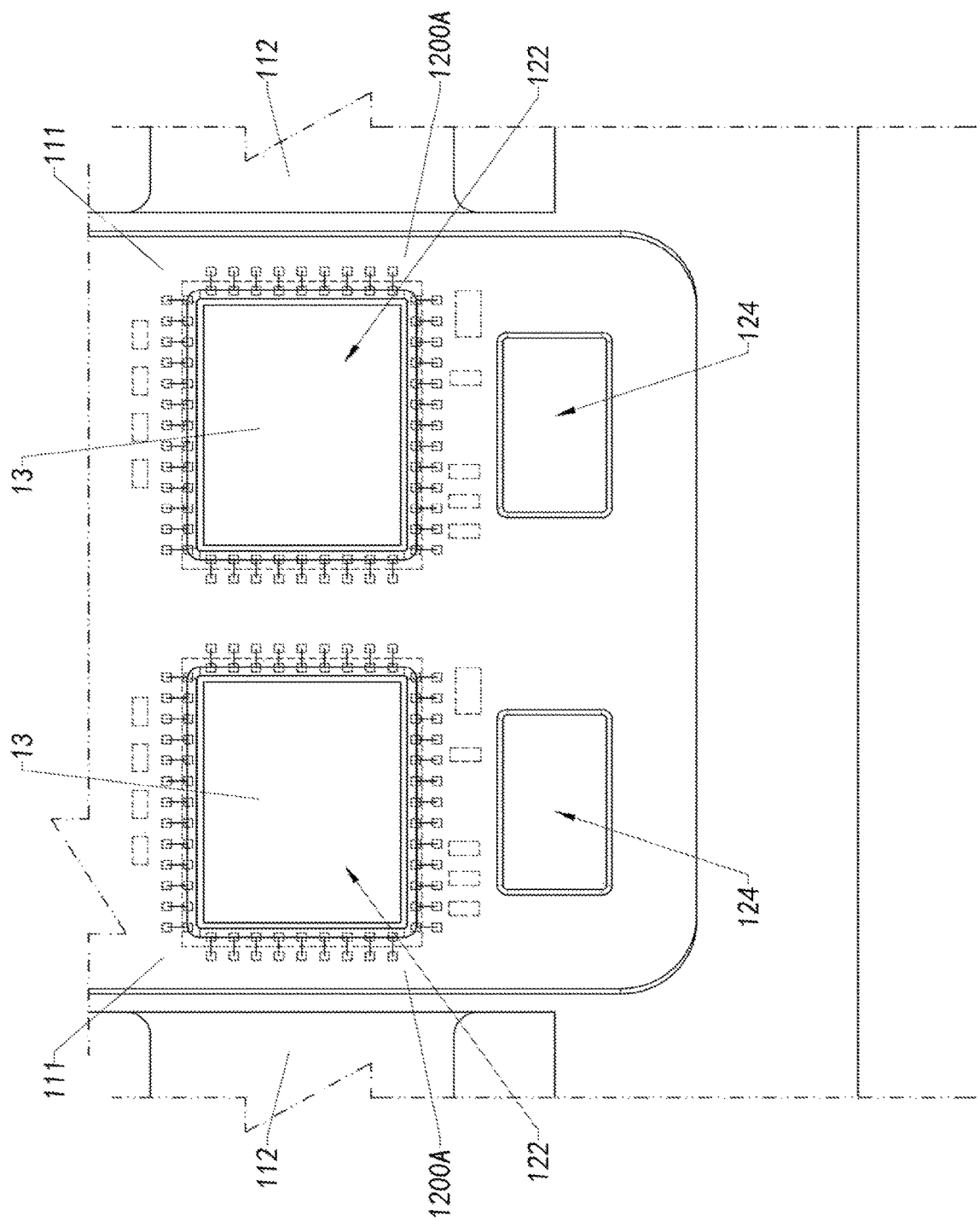
FIG. 19B is an enlarged structural schematic top view of two adjacent photosensitive assemblies of the photosensitive assembly jointed panel of the camera module according to the above mentioned second preferred embodiment of the present application.

As shown in FIG. 16, in this embodiment of the present application and in the drawings, the camera module 100 may include a load-supporting part 40, which is a fixed lens barrel, and the lens 20 is mounted on the fixed lens barrel. The molding base 12 has a groove 123 on the top side, which can be used to mount the filter element lens holder 31, and the fixed lens barrel is mounted on the top side of the molding base 12.

As shown in FIGS. 17A to 24, the photosensitive assembly 10 of the camera module 100 according to a second embodiment of the present application and a manufacturing process thereof are shown. In this embodiment, a photosensitive assembly jointed panel 1000 is also made by a jointed panel operation, and then cut to obtain the photosensitive assembly 10. In the embodiments shown in FIGS. 2 to 16, in a plurality of rows of circuit boards, the rigid regions 111 of one row of the circuit boards are arranged adjacent to the flexible regions 112 of the other row of the circuit boards. In this embodiment, the two adjacent rows of the circuit boards can arrange the rigid regions 111 adjacently, and keep the corresponding flexible regions 112 away from each other. More preferably, the rigid regions 111 of the two adjacent rows of the circuit boards are integrally molded, so that the middle of the two adjacent rows of the circuit boards forms an integral rigid region.

Accordingly, more specifically, the molding die 210 forms a molding cavity 213 when clamping, and provides a plurality of light window molding portions 214 and one or more base jointed panel molding guide grooves 215, each of the base jointed panel molding guide groove 215 includes a first diversion groove 2151 arranged at two ends in a substantially parallel direction in the longitudinal direction, a second diversion groove 2152 located between two of the first guide grooves 2151, and a plurality of the filling grooves 2153 arranged in a horizontal direction extending between the two first diversion grooves 2151 and the second diversion groove 2152, wherein two rows of the filling grooves 2153 extend respectively between the two first diversion grooves 2151 and the second diversion groove 2152.

For example, in this embodiment, the circuit board jointed panel 1100 includes four rows of the circuit boards 11, and two rows of the circuit boards 11 as a group, and the rigid regions 111 of the two rows of the circuit boards 11 of each group of the circuit boards 11 are located in the middle and are integrally molded, for example, each row of the circuit boards 11 has six circuit boards, and its rigid region 111 is integrally molded. The molding die 210 has two base jointed panel molding guide grooves 215, and each of the base jointed panel molding guide grooves 215 has 7 filling grooves 2153 between each of the first diversion groove 2151 and the second diversion groove 2152, and there are filling grooves 2153 between two adjacent light window molding portions 214, each of the light window molding portions 214 is located between two adjacent filling grooves 2153. The molding material 14 flows along the two first diversion grooves 2151 and the middle second diversion groove 2152 from the feeding end 215A to the terminal end 215B, and a two-stage design is adopted for the side surfaces of the first diversion groove 2151 and the second diversion groove 2152 facing the light window, the molding material 14 can fill each of the filling grooves 2153, so that the molding material 14 forms the one-piece molding base 1200 after being cured.

In this embodiment of the present application, the one-piece molding base 1200 is integrally molded on two adjacent rows of the circuit boards 11 and two adjacent rows of the photosensitive elements 13 to form a photosensitive assembly jointed panel 1000 and form a light window 122 that provides a light path for each of the photosensitive elements 13 at a position corresponding to the light window molding portion 214.

Figure 21A:
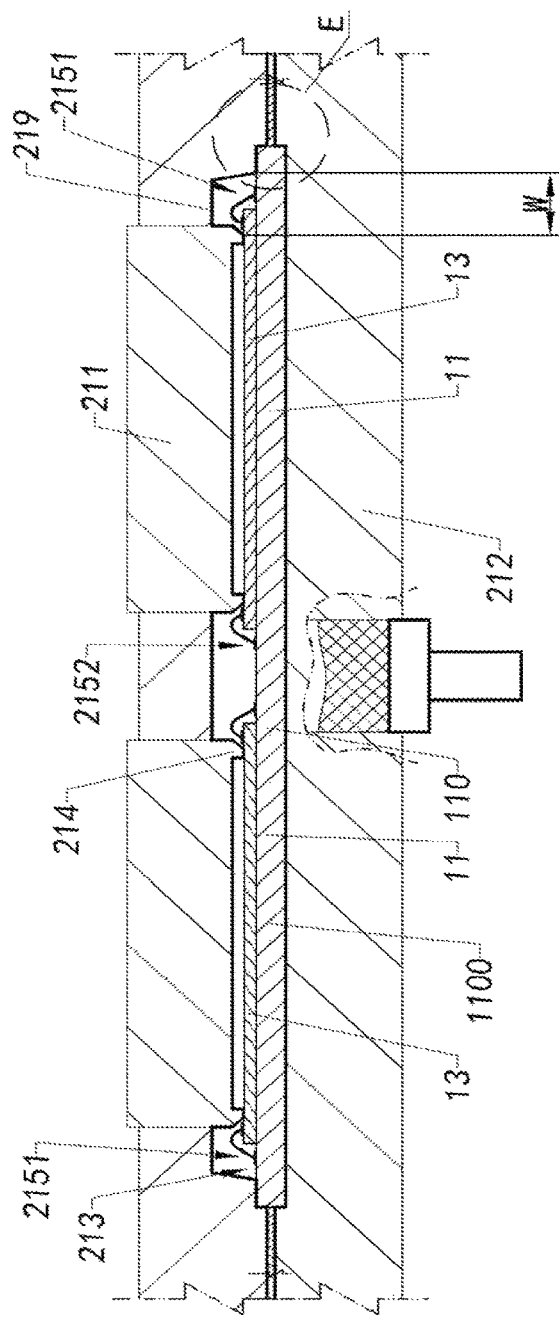
FIG. 21A is a cross-sectional view illustrating when a molten molding material is pushed into a base jointed panel molding guide groove in the molding die of the photosensitive assembly jointed panel according to the above mentioned second preferred embodiment of the present application, wherein the cross-sectional view is a cross-sectional view corresponding to the direction of the F-F line illustrated in FIG. 18.
Figure 21B:
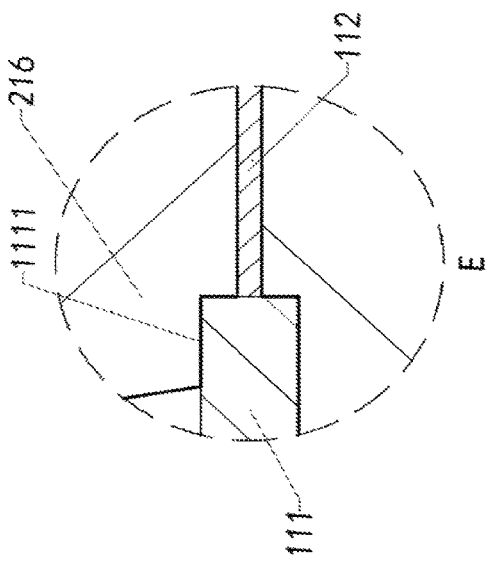
FIG. 21B is a partially enlarged schematic view at E in FIG. 21A.
Figure 22:
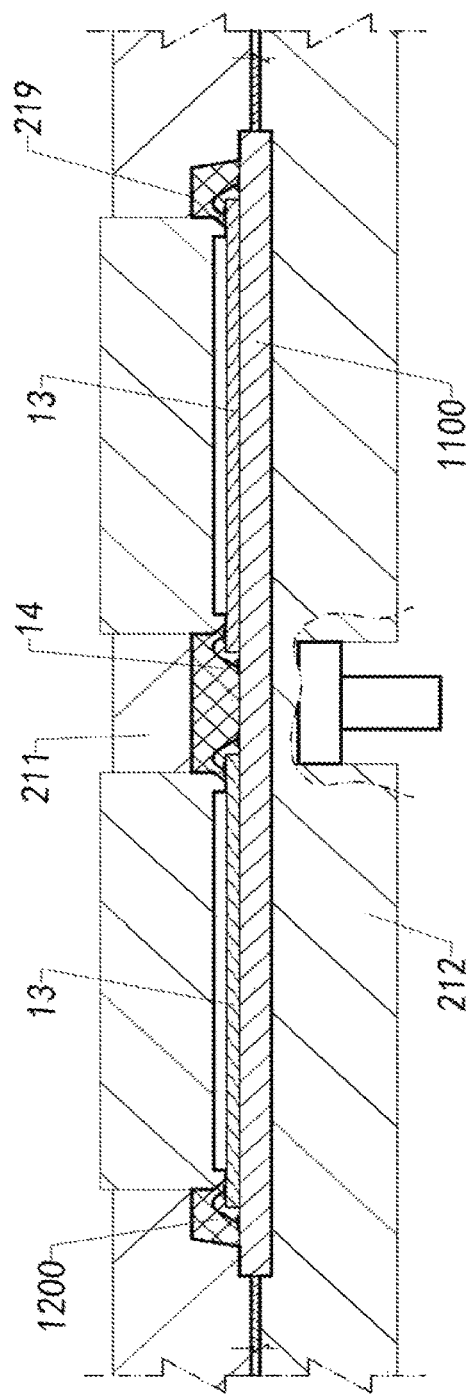
FIG. 22 is a cross-sectional view illustrating when a molten molding material is filled in a base jointed panel molding guide groove in the molding die of the photosensitive assembly jointed panel according to the above mentioned second preferred embodiment of the present application, wherein the cross-sectional view is a cross-sectional view corresponding to the direction of the F-F line illustrated in FIG. 18.
Figure 23:
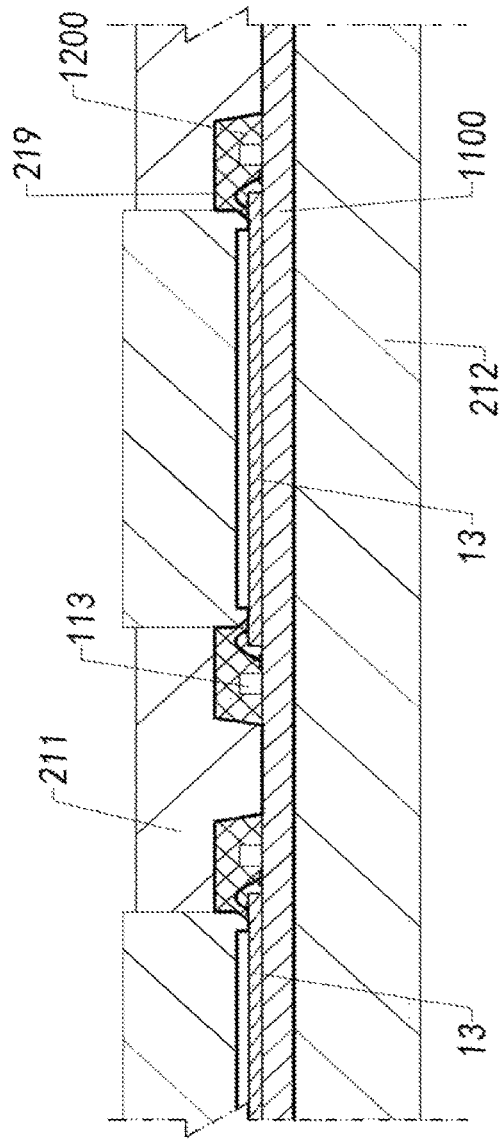
FIG. 23 is a cross-sectional view illustrating when a molten molding material is filled in a base jointed panel molding guide groove in the molding die of the photosensitive assembly jointed panel according to the above mentioned second preferred embodiment of the present application, wherein the cross-sectional view is a cross-sectional view corresponding to the direction of the G-G line illustrated in FIG. 18.

As shown in FIGS. 21A to 24, it is a schematic view of a manufacturing process of the photosensitive assembly jointed panel 1000 of the camera module 100 according to the preferred embodiment of the present application. As shown in FIG. 21A, the molding die 210 is in a clamping state, the circuit board 11 to be molded and the solid molding material 14 are ready to be in place, the solid molding material 14 is heated, thereby when the molding material 14 is melted into a fluid state or a semi-solid and semi-fluid state, it is sent to the base jointed panel molding guide groove 215, and along the first diversion groove 2151 and the second diversion groove 2152 flows forward and fills the filling groove 2153 between two adjacent light window forming portions 214. As shown in FIGS. 22 and 23, when the two first diversion grooves 2151, the second diversion groove 2152, and the filling groove 2153 of the base jointed panel molding guide groove 215 are all filled with the fluid-like molding material 14, then the fluid-like molding material 14 is cured and molded into the one-piece molding base 1200 integrally molded on two adjacent rows of the circuit board 11 and two rows of the photosensitive elements 13 through a curing process.

Figure 24:
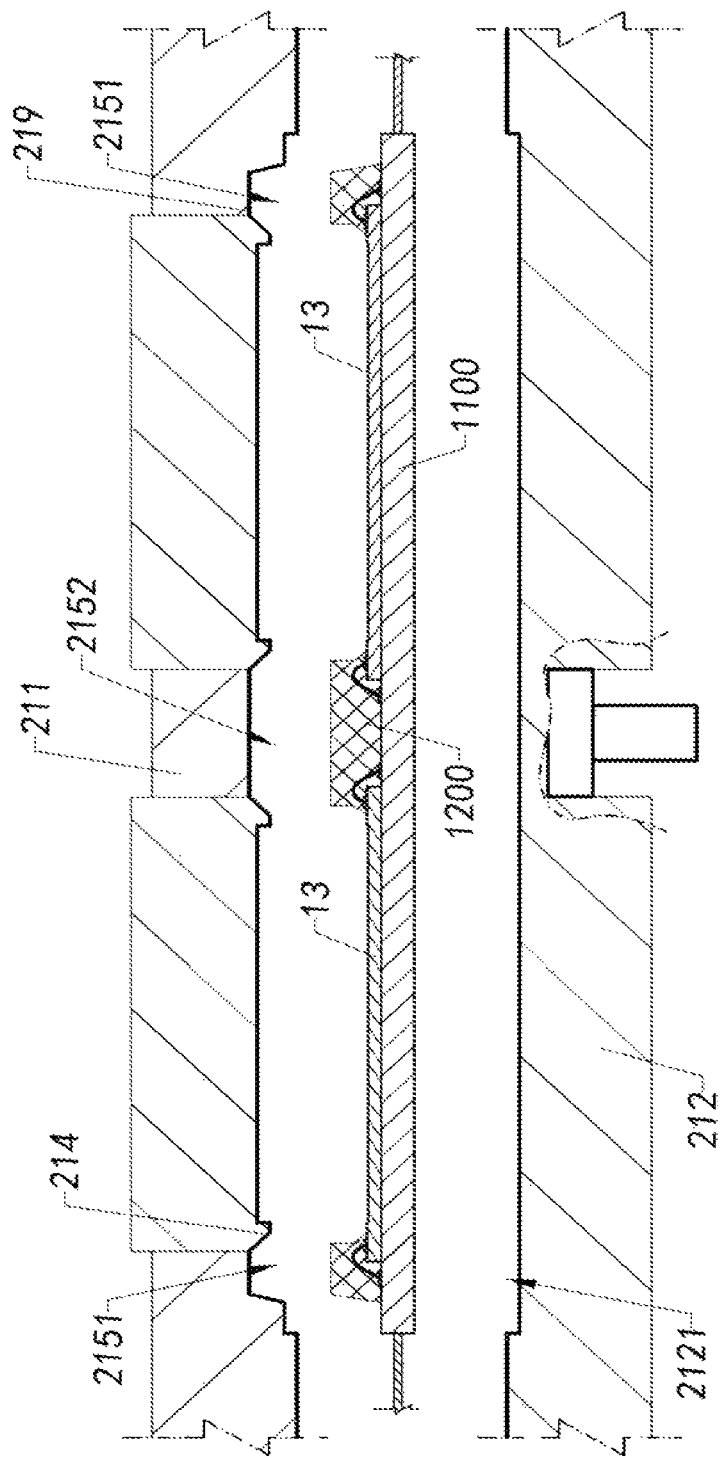
FIG. 24 is a cross-sectional view of performing a demolding step to form a one-piece molding base in the molding die of the photosensitive assembly jointed panel according to the above mentioned first preferred embodiment of the present application, wherein the cross-sectional view is a cross-sectional view corresponding to the direction of the F-F line illustrated in FIG. 18.

As shown in FIG. 24, after the molding material 14 is cured to form the one-piece molding base 1200, the demolding process of the present application is performed, that is, the die fixing device 230 makes the first die 211 and the second die 212 to be away from each other, so that the light window molding portion 214 is separated from the one-piece molding base 1200, so that two rows of the light windows 122 corresponding to each of the photosensitive elements 13 are formed in the one-piece molding base 1200.

As shown in FIG. 20B, the prepared photosensitive assembly jointed panel 1000 can be further cut to obtain an individual photosensitive assembly 10. Each of the photosensitive assemblies 10 includes at least one circuit board 11, at least one photosensitive element 13 and the molding base 12 integrally molded on the circuit board 11 and the photosensitive element 13. As shown in FIGS. 19A to 20B, the rigid regions 111 integrally molded between the two adjacent rows of the circuit boards 11 are separated, so that each of the circuit boards 11 includes a rigid region 111 and a flexible region 112 combined with each other. The molding base 12 integrally molds the rigid region 111 of the circuit board 11 and at least a part of the non-photosensitive region 132 of the photosensitive element 13, and forms the light window 122 that provides a light path for the photosensitive region 131 of the photosensitive element 13.

It is worth mentioning that when each of the individual photosensitive assemblies 10 produced by cutting the photosensitive assembly jointed panel 1000 is used to make a variable-focus camera module, that is, an autofocus camera module, the molding die 210 is further provided with a plurality of driver pin groove molding blocks 218, and each of the driver pin groove molding blocks 218 extends into the filling groove 2153 of the base jointed panel molding guide groove 215, so as not to affect the flow of the molding material 14 in three of the diversion grooves 2151, 2152 and 2153, and during the molding process, the fluid-like molding material 14 does not fill the position corresponding to each of the driver pin groove molding blocks 218, so that after the curing step, a plurality of the light windows 122 and a plurality of driver pin grooves 124 are formed in the one-piece molding base 1200 of the photosensitive assembly jointed panel 1000, and the molding base 12 of each of the individual photosensitive assemblies 10 obtained by cutting is configured with the driver pin groove 124, so that when the variable-focus camera module 100 is manufactured, the driver pins can be connected to the circuit board 11 of the photosensitive assembly 10 by means of soldering or conductive adhesive.

It is worth mentioning that the manufacturing method of the photosensitive assembly jointed panel 1000 of the present application is suitable for manufacturing the photosensitive assembly 10 with a small size. In the molding process, each of the first diversion grooves 2151 has a first side surface 1201 facing the light window, and the second diversion groove 2152 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis. In this way, the fluid-like molding material 14 can flow forward along the two outer first diversion grooves 2151 and the middle second diversion groove 2152, and before the molding material 14 is cured, the entire base jointed panel molding guide groove 215 is filled with the molding material 14.

Accordingly, the molding process of the present application obtains the photosensitive assembly jointed panel 1000, including: one or more rows of the circuit board 11, one or more rows of the photosensitive elements 13, and one or more one-piece molding bases 1200. Each row of the circuit boards 11 includes one or more circuit boards 11 arranged side by side, each of the circuit boards 11 includes the rigid region 111 and the flexible region 112 combined with each other. Each of the one-piece molding bases 1200 is integrally molded on two adjacent rows of the circuit boards 11 and two adjacent rows of the photosensitive elements 13, and forms a light window 122 that provides a light path for each of the photosensitive elements 13, and the two adjacent rows of the circuit boards 11 are arranged so that their flexible regions 112 are away from each other and their rigid regions 11 are adjacent to each other, so that each of the one-piece molding bases 1200 has two end sides adjacent to the flexible regions; wherein a portion 1200A of the one-piece molding base corresponding to each end side of the one-piece molding base 1200 adjacent to the flexible region 112 has a first side surface 1201 facing the light window, a portion 1200B of the one-piece molding base 1200 extended between the two adjacent rows of the photosensitive elements 13 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than the second angle of the second partial surface 1204 relative to the optical axis; and a third angle of the third partial surface 1205 relative to the optical axis is greater than the fourth angle of the fourth partial surface 1206 relative to the optical axis. Wherein, each of the end sides of the one-piece molding base 1200 corresponds to a combined side of the rigid region 111 and the flexible region 112 of the circuit board 11, that is, a proximal side adjacent to the flexible region 112; a distal side of the one-piece molding base 1200 corresponds to the circuit board 11 and away from the flexible region 112 extends between two adjacent rows of the photosensitive elements 13.

After the photosensitive assembly jointed panel 1000 is cut, an individual photosensitive assembly 10 can be obtained, wherein, in the cutting step, it can be cut on the other side of the one-piece molding base 1200 except for the portion 1200A of the end side, so that the molding base 12 is obtained, wherein the portions 1200B of the molding base corresponding to the molding base between two adjacent rows of the photosensitive elements 13 are also cut.

Accordingly, as shown in FIG. 20B, the photosensitive assembly 10 obtained after cutting includes the circuit board 11, the photosensitive element 13 and the molding base 12. Wherein, the circuit board 11 includes the rigid region 111 and the flexible region 112 combined with each other. The molding base 12 is integrally molded on the circuit board 11 and the photosensitive element 13 and forms the light window 122 that provides a light path for the photosensitive element 13. The circuit board 11 and the photosensitive element 13 are connected through a series of connecting wires 15. After cutting the photosensitive assembly jointed panel 1000, each of the photosensitive assemblies 10 has a first end side without cutting and a second end side obtained by cutting similarly to the above embodiment. The portion 12A of the molding base corresponding to the first end side of the molding base 12 adjacent to the flexible region 112 has a first side surface 1201 facing the light window, the portion 12B of the molding base of corresponding to the opposite second end side of the molding base 12 away from the flexible region 112 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis. In this way, the shape of the cross-section is set so that the molding material 14 can fill the base jointed panel molding guide groove 215 in the molding process, thereby avoiding the occurrence of defective products of the photosensitive assembly.

That is, in this embodiment of the present application, the molding material 14 can flow forward from the feeding ends 215A of the three diversion grooves 2151 and 2152 and fill the diversion grooves 2151 and 2152 and the filling groove 2153 of the entire base jointed panel molding guide groove 215. The molding material 14 can flow from the feeding end 215A to the terminal end 215B along with the three diversion grooves 2151 and 2152 before curing. In addition, before the viscosity of the molding material 14 reaches a high value and is cured, the molding material 14 can fill the base jointed panel molding guide groove 215, thereby preventing the connecting wire 15 between the circuit board 11 and the photosensitive elements 13 is damaged by the molding material 14 with a high viscosity flowing forward. And the fluid in the three diversion grooves 2151 and 2152 flows forward substantially at the same step, so as to prevent the molding material 14 in one diversion groove from flowing to the other diversion groove and obstructing the molding material 14 from flowing forward in the other diversion groove. Moreover, no turbulence or sinuous flow is generated, which causes the connecting wires 15 connecting the circuit board 11 and the photosensitive element 13 to swing irregularly, resulting in deformation and damage.

As shown in FIG. 21B, in order to facilitate demolding and pressing of the rigid region 111 of the circuit board 11, the first die 211 further includes a plurality of the pressing blocks 216, and the outer edge 1201 of the molding base 12 and the outer edge of the rigid region 111 of the circuit board 11 will form a pressing edge 1111, that is, in the molding process, the two pressing blocks 216 are pressed on a region of the rigid regions 111 of the two rows of the circuit boards 11. The two pressing blocks 216 are pressed above each group of the flexible regions 112 of the two adjacent rows of the circuit boards 11 to prevent the molding material 14 from flowing to the flexible regions 112. In addition, the rigid regions 111 of the two adjacent rows of the circuit board 11 are integrally molded to form an integrated rigid region jointed panel 110, and the two pressing blocks 216 respectively press on both end sides of the integrated rigid region jointed panel 110, so as to facilitate the pressing of the first die 211 to the adjacent two rows of the circuit boards 11. In addition, a width W of a bottom end of the first diversion groove 2151 is 0.2 mm to 1 mm, which is suitable for manufacturing the photosensitive assembly with a small size. Accordingly, the obtained photosensitive assembly 10 has a distance W between an inner edge and an outer edge of the portion 12A of the molding base on a side adjacent to the flexible region 112 of 0.2 mm to 1 mm.

Accordingly, this embodiment of the present application provides a method for manufacturing the photosensitive assembly 12 of the camera module 100, which includes the following steps:

fixing a circuit board panel 1100 to a second die 212 of a molding die 210, wherein the circuit board panel 1100 includes one or more rows of circuit boards, and each row of circuit boards includes one or more circuit boards 11 arranged side by side, each of the circuit boards 11 includes a combined rigid region 111 and flexible region 112, and each of the circuit boards 11 is operatively connected with a photosensitive element 13;

clamping the second die 212 and a first die 211 through a die fixing device 213 to fill the molten molding material 14 in abase jointed panel molding guide groove 215 in the molding die 210, wherein the position corresponding to a light window molding portion 214 is prevented from being filled with the molding material 14;

curing the molding material 14 in the base jointed panel molding guide groove 215 to form a one-piece molding base 1200 at a position corresponding to the base jointed panel molding guide groove 215, wherein the one-piece molding base 1200 is integrally molded on two adjacent rows of the circuit boards 11 and two adjacent rows of the photosensitive elements 13 to form a photosensitive assembly jointed panel 1000 and form a light window 122 that provides a light path for each of the photosensitive elements 13 at a position corresponding to the light window molding portion 214, wherein the two adjacent rows of the circuit boards 12 are arranged such that their flexible regions 112 are away from each other and their rigid regions 11 are adjacent to each other, wherein the base jointed panel molding guide groove 215 has two first diversion grooves 2151 corresponding to two end sides of the one-piece molding base 1200 adjacent to the flexible region 112 and a second guide groove 2152 corresponding to a region between the two adjacent rows of photosensitive elements 13, and a filling grooves 2153 extending between the first diversion groove 2151 and the second diversion groove 2152 for filling the molding material 14 between two adjacent photosensitive elements 13 in each row of the photosensitive elements 13 and located between two adjacent light window molding portions 214, wherein the first diversion groove 2151 has a first side surface 1201 facing the light window, and the second diversion groove 2152 has a second side surface 1202 facing the light window, wherein the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis.

cutting the photosensitive assembly jointed panel 1000 to obtain a plurality of the photosensitive assemblies 10, wherein each of the photosensitive assemblies 10 includes the circuit board 11, the photosensitive element 13 and the molding base 12, wherein, the molding base 12 is integrally molded on the circuit board 11 and the photosensitive element 13 and forms the light window 122 that provides a light path for the photosensitive element 13.

In addition, the method may further include the step of cutting a part of the photosensitive assembly 10 located between the two adjacent rows of the photosensitive elements 13 to obtain a portion 12B of the molding base of corresponding to the opposite other end side of the molding base 12 away from the flexible region 112. That is, from the molding base 12 of the photosensitive assembly 10 and the rigid region 111 of the circuit board 11 between the two adjacent rows of the photosensitive elements 13, it is suitable to be cut so that the distal sides of the two adjacent rows of the photosensitive elements 10 away from the flexible region 112 are cutting sides, and respectively form cutting surfaces 125.

The circuit board 11 includes a plurality of electronic components 113 formed in the rigid region 111, and mounted such as by an SMT process, in corresponding two of the first diversion grooves 2151 and the second diversion grooves 2152, there is no electronic component 113, the electronic component 113 can be collectively provided in the filling groove 2153, so that in the molding process, there will be no obstruction in the two first diversion grooves 2151 and the second diversion groove 2152, so that the molding material 14 will not be affected to flow forward along with two first diversion grooves 2151 and the second diversion groove 2152, so that the molding material 14 tries to flow from the feeding end 215A to the terminal end 215B in a relatively short time.

In the step of manufacturing the individual photosensitive assembly 10: the photosensitive assembly jointed panel 1000 may be cut to obtain a plurality of independent photosensitive assemblies 10 for manufacturing an individual camera module. It is also possible to cut and separate two or more of the photosensitive assemblies 10 integrally connected from the photosensitive assembly jointed panel 1000 to be used to make a separate array camera module, that is, each of the camera modules of the array camera modules has the independent photosensitive assembly 10, wherein two or more of the photosensitive assemblies 10 can be respectively connected to a control motherboard of a same electronic device, so that an array camera module made by two or more of the photosensitive assemblies 10 can transmit the images captured by the multiple camera modules to the control motherboard for image information processing.

As shown in FIG. 25A, the photosensitive assembly 1000 according to another variant embodiment based on the first embodiment of the present application, which includes an inventive molding process to obtain the photosensitive assembly 1000, including: one or more rows of the circuit board 11, one or more rows of the photosensitive elements 13, one or more rows of protective frames 16, and one or more of the one-piece molding bases 1200. Each row of the circuit boards 11 includes one or more circuit boards 11 arranged side by side, and each of the circuit boards 11 includes a rigid region 111 and flexible region 112 combined with each other. Each of the protective frames 16 is formed in the photosensitive element 13 and is located in the non-photosensitive region 132 of the photosensitive element 13, that is, it is located outside the photosensitive region 131, and each of the one-piece molding bases 1200 is integrated molded on a row of the circuit boards 11, a row of the photosensitive elements 13, and a row of the protective frames 16 and forms the light windows 122 that provide a light path for each of the photosensitive elements 13.

That is, before the one-piece molding base 1200 is molded, the protective frame 16 is formed on each of the photosensitive elements 13 in advance, which may be formed of another material different from the molding material 14, for example, it may be glue applied to the non-photosensitive region 132 of the photosensitive element 13, or it may be a rigid frame and attached to the non-photosensitive region 132 of the photosensitive element 13 by glue. Therefore, in the process of molding and forming the one-piece molding base 1200, the light window molding portion 214 is pressed on the protective frame 16 having a predetermined hardness, when the fluid-like molding material 14 enters the base jointed panel molding guide groove 215, the fluid-like molding material 14 can be prevented from flowing into the photosensitive region 131 of the photosensitive element 13, thereby forming a molding flash. For example, in a specific example, the protective frame 16 is formed of glue, which has a predetermined elasticity and hardness, and can be further implemented to be still sticky after being cured, so as to be used for adhering dust particles in the photosensitive assembly 10 of the obtained camera module. More specifically, in some embodiments, the Shore hardness of the protective frame 16 ranges from A50 to A80, and the elastic modulus ranges thereof is from 0.1 Gpa to 1 Gpa. Similarly, a portion 1200A of the one-piece molding base corresponding to the first end side of the one-piece molding base 1200 adjacent to the flexible region 112 has a first side surface 1201 facing the light window; a portion 1200B of the one-piece molding base corresponding to the opposite second end of the one-piece molding base 1200 away from the flexible region 112 has a second side surface 1202 facing the light window. Wherein, the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis. Wherein, the first end side of the one-piece molding base 1200 corresponds to a combined side of the rigid region 111 and the flexible region 112 of the circuit board 11, that is, the proximal side near the flexible region 112; the second end side of the one-piece molding base 1200 corresponds to the distal side of the circuit board 11 away from the flexible region 112.

After the photosensitive assembly jointed panel 1000 is cut, a single the photosensitive assembly 10 can be obtained, as shown in FIG. 25C, wherein in the cutting step, it can be cut on the two wing sides of the one-piece molding base 1200 except for the first end side and the second end side to obtain the molding base 12, and the portion 1200B of the molding base corresponding to the second end side is not cut, so that the photosensitive assembly 10 with a portion 1200C of the one-piece molding base on a pair of opposite wing sides is obtained.

Accordingly, the photosensitive assembly 10 includes the circuit board 11, the photosensitive element 13, the protective frame 16, and the molding base 12. Wherein, the circuit board 11 includes a rigid region 111 and flexible region 112 combined with each other. The molding base 12 is integrally molded on the circuit board 11, the photosensitive element 13 and the protective frame 16 and forms the light window 122 that provides a light path for the photosensitive element 13. The circuit board 11 and the photosensitive element 13 are connected through a series of connecting wires 15. The protection frame 16 may be located at inner side of the connection wire 15, or may cover at least a part of the connection wire 15. The portion 12A of the molding base corresponding to the first end side of the molding base 12 adjacent to the flexible region 112 has a first side surface 1201; the portion 12B of the molding base corresponding to the opposite second end side of the molding base 12 away from the flexible region 112 has a second side surface 1202. Wherein, the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis.

As shown in FIG. 25C, accordingly, in order to further reduce the size of the photosensitive assembly 10, at least a part of the photosensitive member 10 of the opposite second end side of the molding base 12 away from the flexible region 112 is suitable to be removed to form a cutting surface 125.

As shown in FIG. 25B, the photosensitive assembly jointed panel 1000 is obtained by a molding process according to the variant embodiment of the above-mentioned second embodiment of the present application, and it includes: one or more rows of the circuit boards 11, one or more rows of the photosensitive elements 13, one or more rows of protective frames 16, and one or more of the one-piece molding base 1200, each of the protective frames 16 is formed on the corresponding photosensitive element 13. Each row of the circuit boards 11 includes one or more circuit boards 11 arranged side by side, and each of the circuit boards 11 includes a rigid region 111 and flexible region 112 combined with each other. Each of the one-piece molding bases 1200 is integrally molded in two adjacent rows of the circuit boards 11, two adjacent rows of the photosensitive elements 13, and two adjacent rows of the protective frames 16 and form a light window 122 that provides a light path for each photosensitive element 13, and the two adjacent rows of the circuit boards 11 are arranged such that their flexible regions 112 are far away from each other and their rigid regions 11 are adjacent to each other, so that each of the one-piece molding bases 1200 has two end sides adjacent to the flexible region 112; wherein portions 1200A of the one-piece molding base corresponding to respective end sides of the one-piece molding base 1200 adjacent to the flexible region 112 has a first side surface 1201; the one-piece molding base 1200 extends between the two adjacent rows of the photosensitive elements 13 and has a second side surface 1202. Wherein, the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis. Wherein, each of the end sides of the one-piece molding base 1200 corresponds to a combined side of the rigid region 111 and the flexible region 112 of the circuit board 11, that is, the proximal side near the flexible region 112; the distal side of the one-piece molding base 1200 corresponding to the circuit board 11 away from the flexible region 112 extends between two adjacent rows of the photosensitive elements 13.

After the photosensitive assembly jointed panel 1000 is cut, an individual photosensitive assembly 10 can be obtained, wherein, in the cutting step, the other side of the one-piece molding base 1200 except for portion 1200A of the end side can be cut, so that the molding base 12 is obtained, wherein a portion 1200B corresponding to the molding base between two adjacent rows of the photosensitive elements 13 are also cut, so that the photosensitive assembly 10 with the portion 1200C of the one-piece molding base on a pair of opposite wing sides is obtained. A portion 12A of the molding base corresponding to the first end side of the molding base 12 adjacent to the flexible region 112 has a first side surface 1201; the portion 12B of the molding base corresponding to the opposite second end side of the molding base 12 away from the flexibility region 112 has a second side surface 1202. Wherein, the first side surface 1201 includes a first partial surface 1203 provided adjacent to the photosensitive element 13 and a second partial surface 1204 connected to the first partial surface 1203, the second side surface 1202 has a third partial surface 1205 provided adjacent to the photosensitive element 13 and a fourth partial surface 1206 connected to the third partial surface 1205, wherein a first angle of the first partial surface 1203 relative to an optical axis of the camera module is greater than a second angle of the second partial surface 1204 relative to the optical axis, and a third angle of the third partial surface 1205 relative to the optical axis is greater than a fourth angle of the fourth partial surface 1206 relative to the optical axis, as shown in FIG. 25C.

Figure 26A:
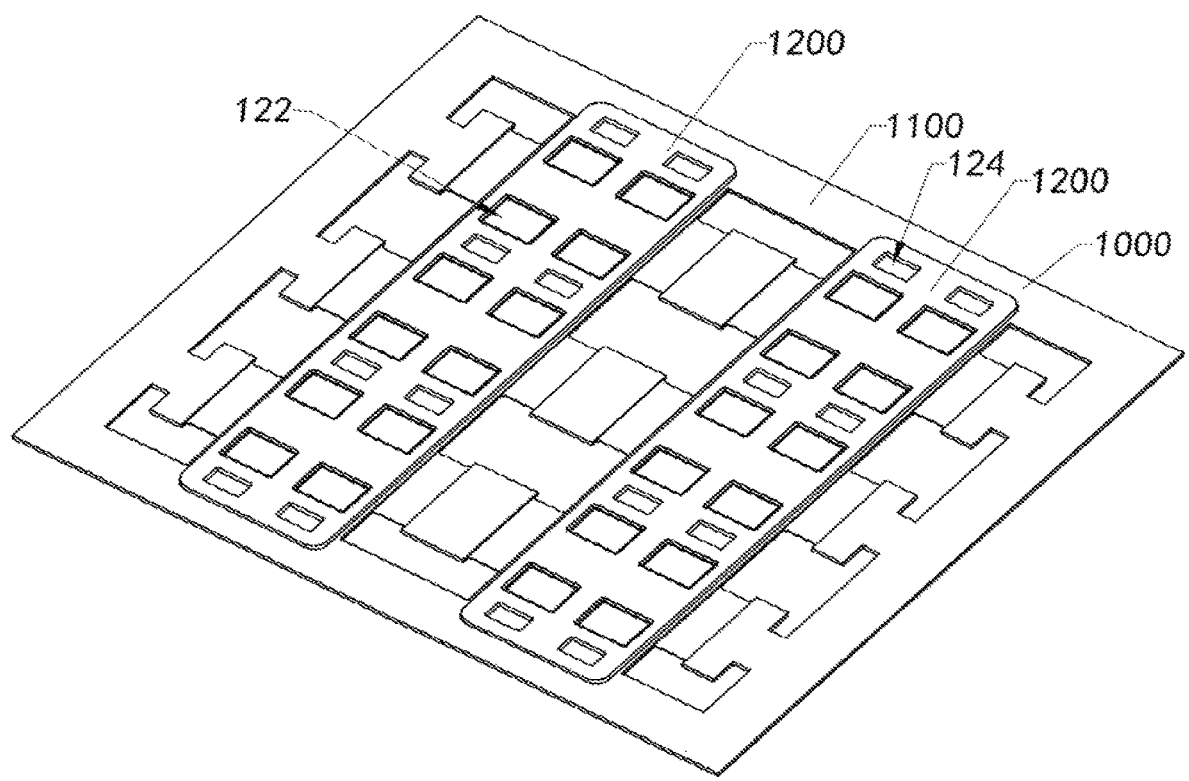
FIG. 26A is a schematic structural view illustrating a photosensitive assembly jointed panel according to another variant embodiment of the above mentioned second preferred embodiment of the present application.
Figure 26B:
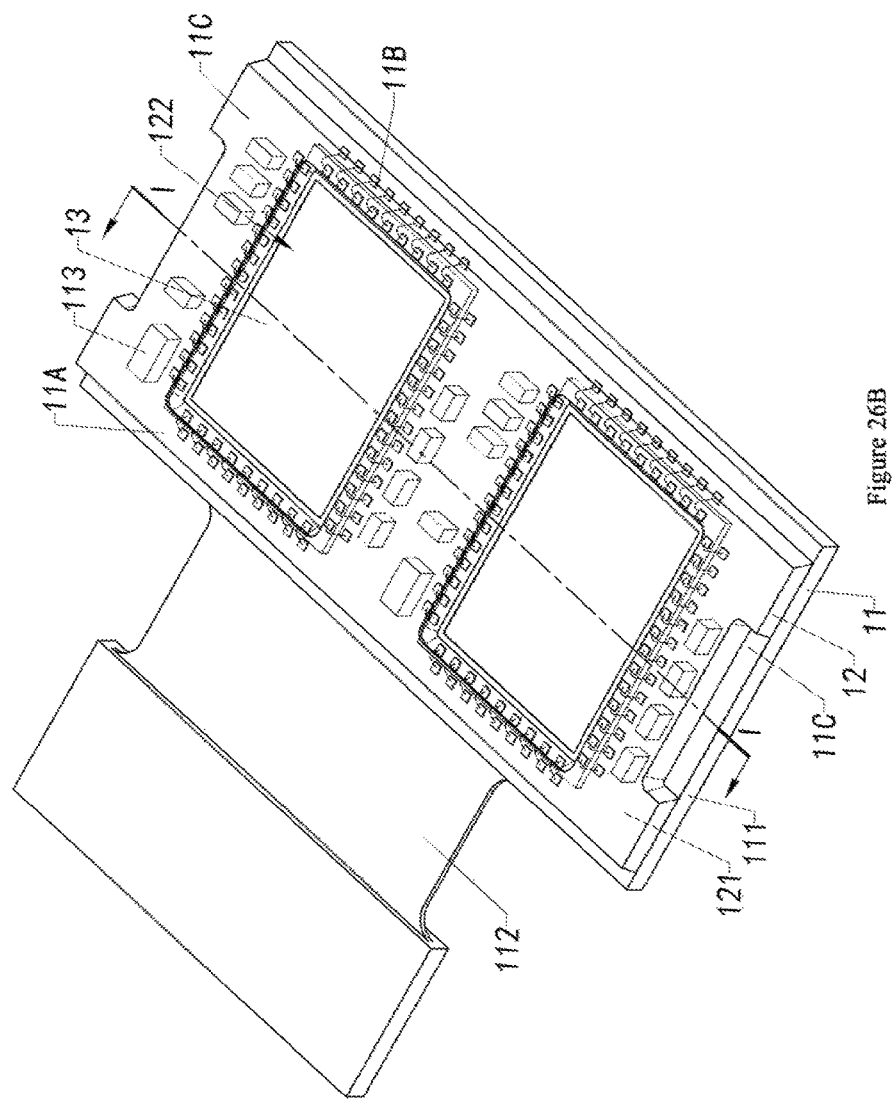
FIG. 26B is a schematic enlarged structure view of a photosensitive assembly according to another variant embodiment of the above mentioned second preferred embodiment of the present application.
Figure 27:
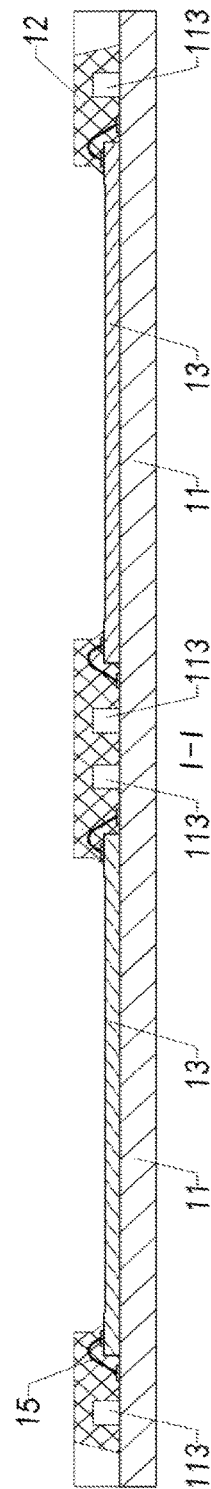
FIG. 27 is a cross-sectional view illustrating the photosensitive assembly according to the another variant embodiment of the above mentioned second preferred embodiment of the present application, taken along the line I-I in FIG. 26B.
Figure 28:
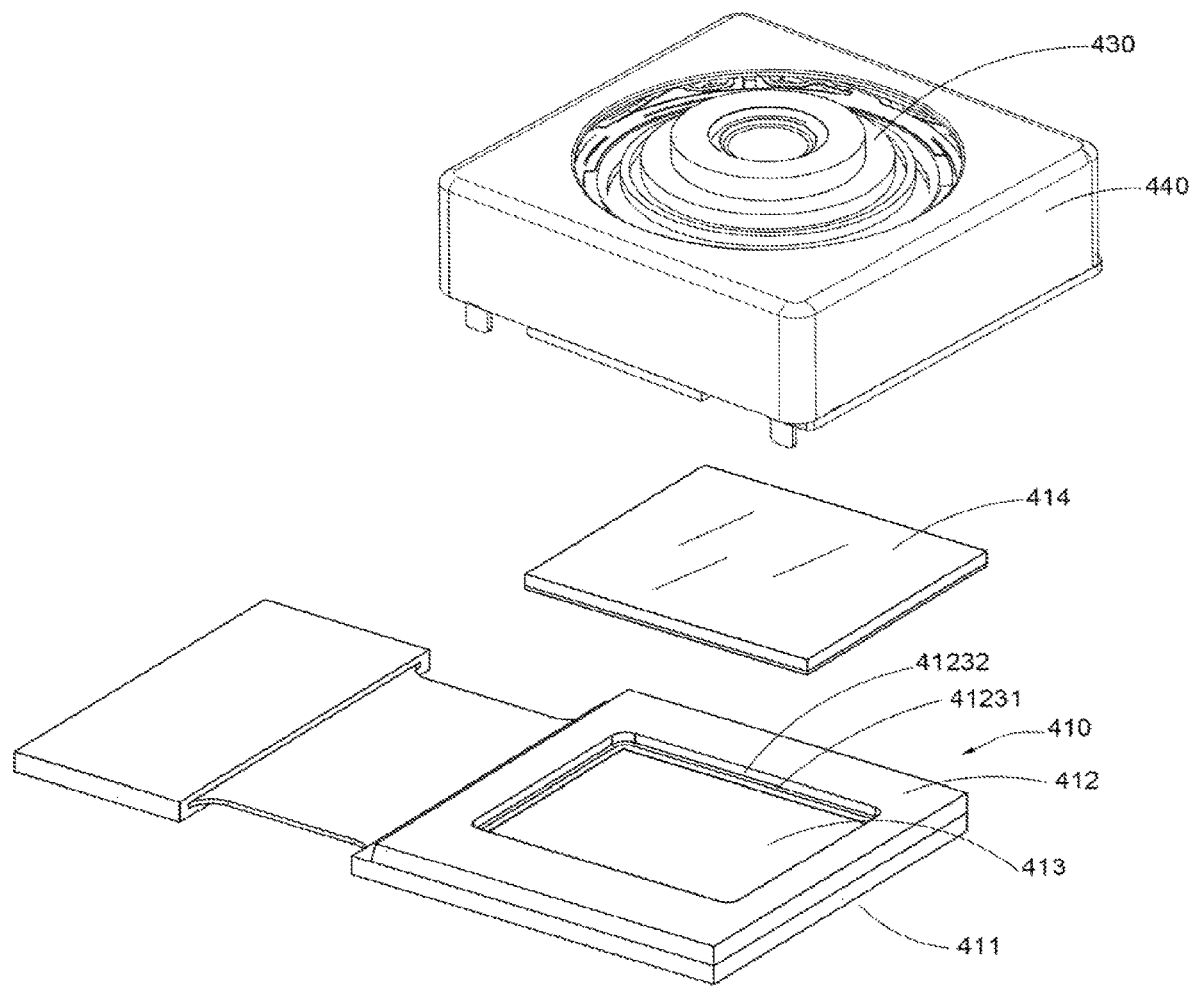
FIG. 28 is a three-dimensional exploded view of a camera module according to a third preferred embodiment of the present application.

As shown in FIGS. 26A to 27, the molding process of the jointed paneling operation can also be used to make a photosensitive assembly 10 having two or more of the light windows 122, wherein such a photosensitive assembly 10 can be used to fabricate an array camera module that shares a substrate. That is, taking the photosensitive assembly 10 for making a dual-camera module as an example, during the molding process of each circuit board 11 of the circuit board jointed panel 1100, one circuit board substrate 111 is correspondingly provided with two light window molding portions 214, so that after the molding process and cutting are completed, each of the circuit boards 11 forms a molding base 12 having two of the light windows 122 sharing one circuit board 11, and correspondingly mounts the two photosensitive elements 13 and two lenses 30. In addition, the circuit board 11 can be connected to a control motherboard of an electronic device. In this way, the array camera module manufactured in this embodiment can transmit images captured by multiple camera modules to the control motherboard for image information processing.

As shown in FIGS. 28A to 31C are a camera module 400 and a photosensitive assembly 410 thereof according to a third preferred embodiment of the present application. The camera module 400 can be applied to various electronic devices 300, as shown in FIG. 44, the electronic device 300 includes a device main body 301 and one or more camera modules mounted in the device main body 301. The electronic device 300 is exemplified, but not limited to, a smart phone, a wearable device, a computer device, a television, a vehicle, a camera, a monitoring device, etc., and the camera module cooperates with the electronic device to implement image acquisition and reproduction of a target object.

More specifically, the camera module 400 illustrated in the figure includes the photosensitive assembly 410 and a lens 430. The photosensitive assembly 410 includes a circuit board 411, a molding base 412, a photosensitive element 413, and a filter element 414. The molding base 412 includes a base main body 4121, which is integrally molded on the circuit board 411 and the photosensitive element 413 and form a light window 4122. The light window 4122 is a closed space and provides a light path for the photosensitive element 413. Wherein, the molding base 412 of the present application is integrally molded on the circuit board 411 and the photosensitive element 413 through a molding process, such as a transfer molding process, so that the molding base 412 can replace a lens holder or a bracket of a conventional camera module and does not need to be attached to the circuit board 411 by glue as in a conventional packaging process. The filter element 414, for example, an infrared filter element, is assembled on the top side of the molding base 412 and is located between the photosensitive element 413 and the lens 430 so as to filter infrared light passing through the lens 430.

The circuit board 411 may be a hard board, a soft-board, a soft-hard combined board, a ceramic substrate, or the like. In this embodiment, the circuit board 411 is a soft-hard combined board including a substrate 4111 and a plurality of the electronic components 4112 formed on the substrate 4111, such as being mounted by an SMT process. The electronic components 4112 include but not limited to resistors, capacitors, driving devices, etc. In this embodiment of the present application, the molding base 412 integrally covers the electronic component 4112, so as to prevent dust and sundries from sticking to the electronic component 4112 and further contaminating the photosensitive element 413 as in a conventional camera module, thereby affecting the imaging effect. It can be understood that, the circuit board 411 may not have the electronic component 4112, and the electronic component 4112 may be mounted on the top surface of the substrate 4111 or may be mounted on the bottom surface of the substrate 4111, or may be buried in the substrate 4111. When provided on the top surface of the substrate 4111, the electronic component 4112 may be provided around the photosensitive element 413 and located on multiple sides of the photosensitive element 413, for example, the electronic component 4112 may be provided on the two pairs of opposite sides of the photosensitive element 413, or may also be provided on a pair of opposite sides of the electronic component 4112.

The circuit board 411 and the photosensitive element 413 are operatively connected, as shown in the figures, the surfaces of the circuit board 411 and the photosensitive element 413 each have an electrical connection element, such as a pad, and the two are connected by one or more sets of connecting wires 415, and the molding base 412 integrally embeds the connecting wires 415.

In this preferred embodiment of the present application, the camera module 400 includes the photosensitive assembly 410, the lens 430, and a lens supporting element 440. The lens 430 is assembled on the lens supporting element 440 to form a lens assembly. The lens supporting element 440 may be a driver or a fixed lens barrel. In this embodiment, the lens supporting element is a driver, and the driver may be implemented as a voice coil motor, a piezoelectric motor, a thermodynamic driver, a micro-electro-mechanical driver, etc. to implement an autofocus function, thereby forming an autofocus camera module. It can be understood that, in another embodiment, the lens 430 may be directly assembled on the molding base 412 of the photosensitive assembly 410.

The filter element 414 includes a filter element main body 4141 and a light shielding layer 4142. The light shielding layer 4142 is located on a bottom side of the filter element main body 4141 and is located between the filter element main body 4141 and the molding base 412, and the light shielding layer 4142 is a light-absorbing material, which makes the filter element main body 4141 form an intermediate effective light transmitting region 41411 and a surrounding region 41412, the light passing through the lens 430 can only reach the inside of the molding base 412 through the effective light transmitting region 41411, the material of the filter element main body 141 may include an IR film (infrared cut film), an AR film (anti-reflection coating), white glass, blue glass, resin materials, coated composite materials, crystals, etc. The light shielding layer 4142 is a ring structure, and an opening window is formed in the middle, That is, the light shielding layer 4142 forms a light path 41420 for allowing light to enter the light window 4122 and then reach the photosensitive element 413 and reduce the stray light reaching the photosensitive element 413.

The photosensitive element 413 has a photosensitive region 4131 in the middle and a non-photosensitive region 4132 located around the photosensitive region 4131. Light shielding layer 4142 has an inner edge 41421 and an outer edge 41422. The distance between the inner edge 41421 of the light shielding layer 4142 and the optical axis X is greater than or equal to, or slightly smaller than the distance between the outer edge 41311 of the photosensitive region 4131 and the optical axis X.

The outer edge 41422 of the light shielding layer 4142 is located outside the inner edge 41241 of the top surface 4124 of the molding base 412, that is, no light transmitting region is formed between the inner edge 41241 of the top surface 4124 of the molding base 412 and the outer edges 41422 of the light shielding layer 4142.

Figure 29A:
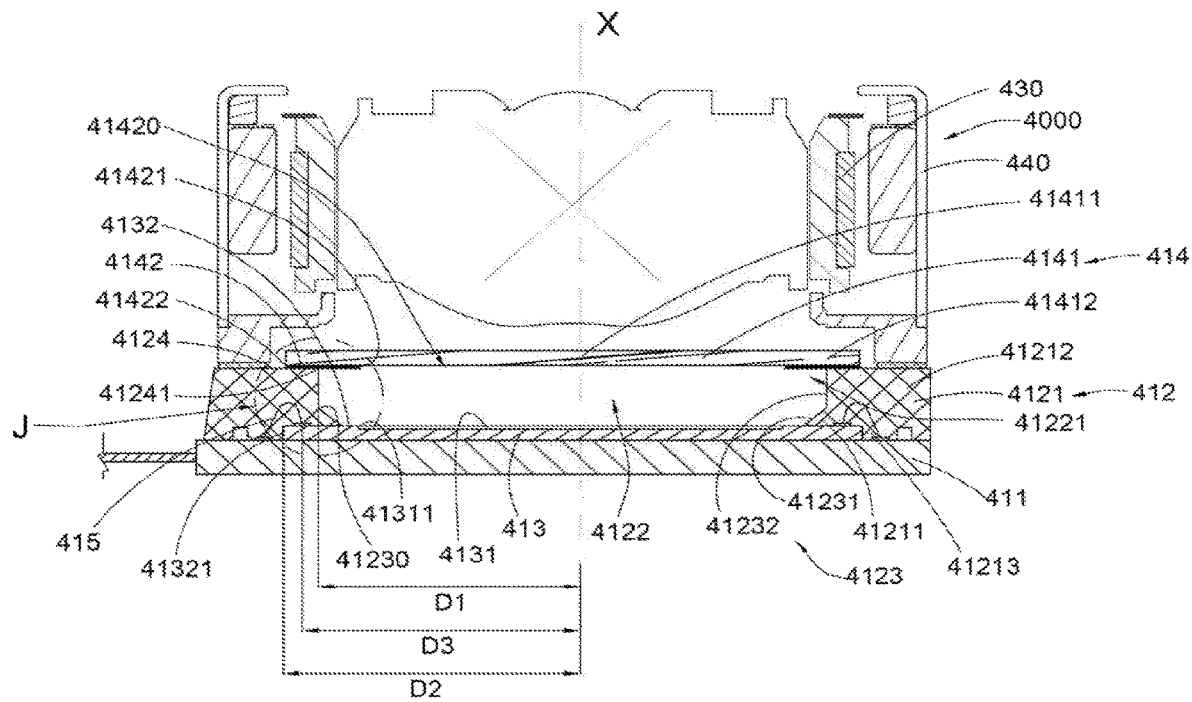
FIG. 29A is a schematic structural diagram of a camera module according to a third preferred embodiment of the present application.

In this embodiment of the present application, the inner surface of the base main body 4121 of the molding base 412 has a plurality of sections of an inner surface along its surrounding direction, for example, it may be four sections of the inner surface, and each of the sections of the inner surface includes multiple parts extending in different directions, for example, the base main body 4121 of the molding base 412 include three parts, that is, a photosensitive element coupling portion 41211 and a top side extending portion 41212 located around the light window 4122 as shown in FIG. 29A, and a circuit board coupling portion 41213 integrally coupled to the outer peripheral surface of the photosensitive element 413 and the top surface of the circuit board 411 located around the photosensitive element 413, these three parts are integrally extended to form a whole structure. The photosensitive element coupling portion 41211 and the photosensitive element coupling portion 41211 have an inner surface integrally extending from the photosensitive element 413, wherein at least a section of the inner surface of the surrounding inner surface integrally extending from the photosensitive element 413 is defined as a first portion inner surface 41231 of the molding base 412, and the top side extending portion 41212 has an inner surface extending integrally from the photosensitive element coupling portion 41211, which forms a second portion inner surface 41232 of the molding base 412, the second portion inner surface 41232 integrally extends from the first portion inner surface 41231. It can be understood that, each of the first portion inner surfaces 41231 and the second portion inner surfaces 41232 is a certain section of the inner surface of the surrounding inner surface of the base main body 4121; or the first portion inner surface 41231 and the second portion inner surface 41232 with the same configuration of a plurality of the sections of the inner surface; or the first portion inner surface 41231 and the second portion inner surface 41232 of all the inner surfaces. The inner surfaces 41231 and 41232 of the photosensitive element coupling portion 41211 and the top side extending portion 41212 extend at different slopes, respectively, the second portion inner surface 41232 of the top side extending portion 41212 extends upward with a greater slope with respect to the first portion inner surface 41231 of the photosensitive element coupling portion 41211, or the second portion inner surface 41232 of the top side extending portion 41212 extends upward without a slope, that is, the second portion inner surface 41232 of the top side extending portion 41212 extends substantially perpendicular to the top surface of the photosensitive element 413, the top side extending portion 41212 becomes a vertical extending portion, so that the area of the top surface of the top side extending portion 41212 can be relatively large, that is, the top surface of the top side extending portion 41212 determines the area of the top surface 4124 of the molding base 412, an extension structure of such the photosensitive element coupling portion 41211 and the top side extending portion 41212 can increase the area of the top surface 4124 of the molding base 412, so that a greater mounting area can be provided for a lens or a lens assembly above the photosensitive assembly 410 to more securely mount the lens or lens assembly above, and can reduce the area of the filter element 414.

That is, in order to facilitate the demolding of the molding process and prevent the stray light, the first portion inner surface 41231 defined by the structure formed by the photosensitive element coupling portion 41211 for its inner surface extends obliquely upward from the photosensitive element 413 with a relatively small slope, and the second portion inner surface 41232 defined by the inner surface of the top side extending portion 41212 extends integrally from the first portion inner surface 41231 in a twisted manner, and extends upward with a relatively large slope or no slope, that is, an included angle is formed between the second portion inner surface 41232 and the first portion inner surface 41231 of the molding base 412, so that, with respect to the oblique upward extension with a fixed slope, the area of the top surface 4124 of the molding base 412 can be effectively increased.

Figure 29B:
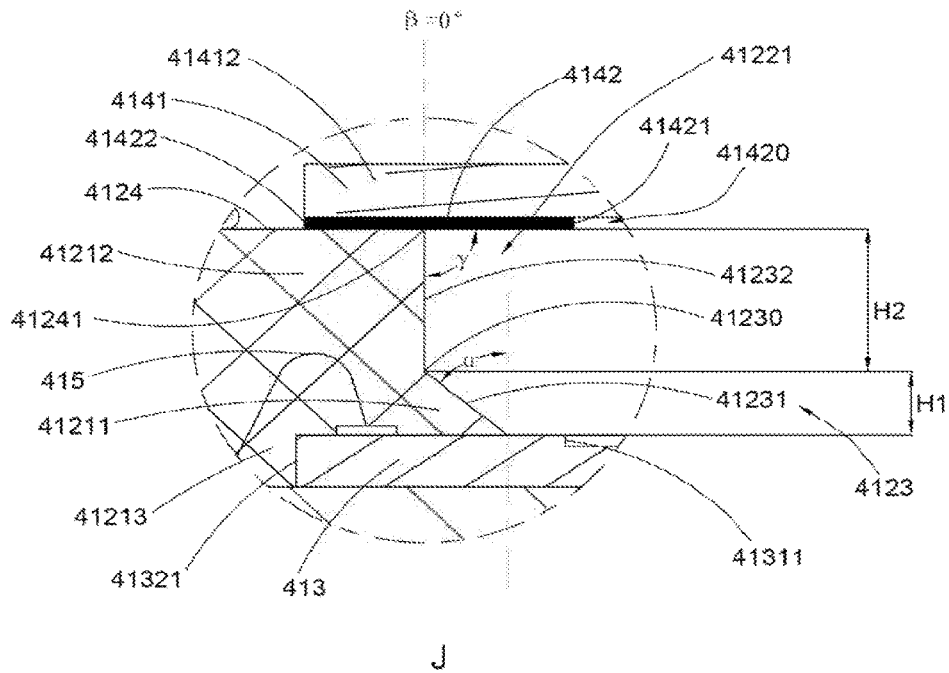
FIG. 29B is an enlarged structural schematic diagram at J in FIG. 29A.

As shown in FIG. 29B, an included angle of the first portion inner surface 41231 defined by the inner surface of the photosensitive element coupling portion 41211 relative to the optical axis X of the camera module 400 is α, and an included angle of the second portion inner surface 41232 defined by the inner surface of the top side extending portion 41212 relative to the optical axis X of the camera module 400 is β, wherein the value of α ranges from 3°~80°, and the value of β ranges from 0°~10°, and α>β. For example, in a specific embodiment, the value of α is 3°, and the value of β is 0°; in a specific embodiment, the value of α is 30°, and the value of β is 0°; in a specific embodiment, the value of α is 60°, the value of β is 0°; in a specific embodiment, the value of α is 45°, and the value of β is 5°; in a specific embodiment, the value of α is 80°, β The value is 10°.

That is, the included angle β of the second portion inner surface 41232 defined by the inner surface of the top side extending portion 41212 relative to the optical axis X of the camera module 400 has a smaller angle with respect to the included angle α of the first portion inner surface 41231 defined by the inner surface of the photosensitive element coupling portion 41211 relative to the optical axis X of the camera module 400, so that the second portion inner surface 41232 of the top side extending portion 41212 extends upward with a greater slope or in a direction perpendicular to the photosensitive element 413, thereby increasing the area of the top surface 4124 of the molding base 412.

As shown in FIG. 29B, in this preferred embodiment of the present application, preferably, a value of a thickness H1 of the photosensitive element coupling portion 41211 ranges from 0.05 mm~0.7 mm, and a value of α thickness H2 of the top side extending portion 41212 ranges from 0.02 mm~0.6 mm. For example, in a specific embodiment, the value of the thickness H1 of the photosensitive element coupling portion 41211 is 0.08 mm, and the value of the thickness H2 of the top side extending portion 41212 is 0.5 mm; in a specific embodiment, the value of the thickness H1 of the photosensitive element coupling portion 41211 is 0.4 mm, and the value of the thickness H2 of the top side extending portion 41212 is 0.3 mm; in a specific embodiment, the value of the thickness H1 of the photosensitive element coupling portion 41211 is 0.5 mm, the value of the thickness H2 of the top side extending portion 41212 is 0.1 mm.

It can be understood that, the second portion inner surface 41232 of the top side extending portion 41212 turns from the first portion inner surface 41231 and extends in a direction with a smaller angle relative to the optical axis X, so that in the molding process, an indenter pressed onto the photosensitive element 413 can avoid the connecting wire 415 between the circuit board 411 and the photosensitive element 413, thereby preventing the connecting wire 415 from being crushed. That is, in some cases, if the molding base 412 to be formed extends with a relatively small fixed slope, for example, the angle of the inner surface relative to the optical axis X is 45°~80°, the indenter pressed on the photosensitive element 413 during the molding process may touch the connecting wire 415 and cause the connecting wire 415 to be damaged.

Figure 30:
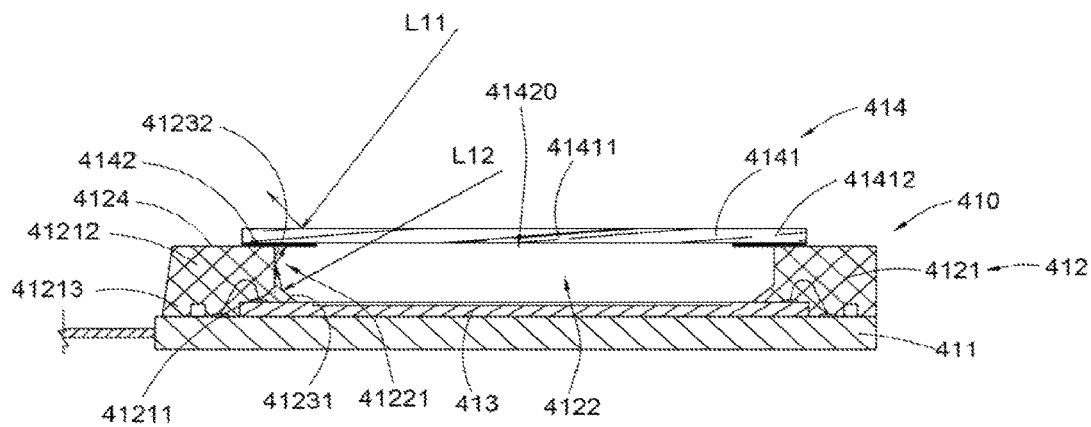
FIG. 30 is a schematic view illustrating that a light shielding layer is attached to a bottom side of the photosensitive assembly of the camera module according to the above-mentioned third preferred embodiment of the present application to effectively reduce stray light reflected to the photosensitive element.

As shown in FIG. 30, an included angle α of the first portion inner surface 41231 defined by the inner surface of the photosensitive element coupling portion 41211 relative to the optical axis X of the camera module 400 may be relatively large, so that the light L12 incident on the first portion inner surface 41231 is not directly reflected to the photosensitive element 413 to form stray light. That is, the photosensitive element coupling portion 41211 and the top side extending portion 41212 cooperate with each other, the structure of the photosensitive element coupling portion 41211 facilitates demolding and reduces the stray light. The top side extending portion 41212 is used to increase the area of the top surface 4124 of the molding base 412, and such structure of the top side extending portion 41212 prevents the connecting wire 415 from being crushed by the indenter during the molding process.

That is, preferably, as shown in FIG. 29B, a position 41230 where the first portion inner surface 41231 and the second portion inner surface 41232 are connected is located at inner side of the outer edge 41321 of the photosensitive element 413, that is, a distance D1 between the position 41230 where the first portion inner surface 41231 and the second portion inner surface 41232 are connected and the optical axis X is smaller than a distance D2 between the outer edge 41321 of the non-photosensitive region 4132 of the photosensitive element 413 and the optical axis X, so that the size of the part between the photosensitive element coupling portion 41211 and the photosensitive element 413 is smaller, thereby reducing the possibility that the molding material 416 generates "flash" in the molding process.

Further preferably, a position 41230 where the first portion inner surface 41231 and the second portion inner surface 41232 are connected is located at inner side of the connecting wire 415, and the distance D1 between the position 41230 where the first portion inner surface 41231 and the second portion inner surface 41232 are connected and the optical axis X is smaller than the distance D3 between the connecting wire 415 and the optical axis X. A turning point between the photosensitive element coupling portion 41211 and the top side extending portion 41112 does not exceed the position where the connecting wire 415 is located, that is, the photosensitive element coupling portion 41211 completes the transition to the top side extending portion 41112 before it has not yet extended to the position of the connecting line 415, so as to prevent the connecting wire 415 from being crushed by the indenter during the molding process. For example, when the top side extending portion 41212 is a vertical extending portion, a distance between a position of the inner edge 41241 of the top surface 4124 of the molding base 412 and the optical axis X of the camera module 400 is not smaller than the distance between the connecting wire 415 and the optical axis X of the camera module, so that the top side extending portion 41212 increases the area of the top surface 4124 of the molding base 412 and is integrally embedded the connecting wire 415 without damaging the connecting wire 415.

It can be understood that the inner surface 41231 of the photosensitive element coupling portion 41211 of the molding base 412 extends obliquely to facilitate the demolding operation in the molding process and reduce stray light reaching the photosensitive element 413, and the inner surface 41232 of the top side extending portion 41212 extends integrally from the inner surface 41231 of the photosensitive element coupling portion 41211 in a twisted manner, so that the photosensitive element coupling portion 41211 and the top side extending portion 41212 cooperate to maximize the area of the top surface of the molding base 412, in the case of reducing the stray light.

In addition, when the filter element 414 is provided with light shielding layer 4142 on the bottom side, as shown in FIG. 30, a part of stray light L11 incident on the top surface of the filter element main body 4141 of the filter element 414 is reflected by the upper surface of the filter element main body 4141 without entering the light window 4122 of the molding base 412, and when refracting into the surrounding region 41412 outside the light transmitting region 41411 above the light shielding layer 4142, it will be absorbed by the light shielding layer 4142 and cannot enter the light window 4122 inside the molding base 412, so as to block a part of the stray light.

When another part of stray light L12 passes through the effective light transmitting region 41411 of the filter element main body 4141 and incidents on the first portion inner surface 41231, it will be reflected upward to the light shielding layer 4142 by the inclined first portion inner surface 41231 of the molding base 412 or further reflected to light shielding layer 4142 by the second portion inner surface 41232, so as to be absorbed by light shielding layer 4142, so as not to be further reflected and reach the photosensitive element 413, thereby affecting the imaging quality of the camera module 400. Accordingly, the light shielding layer 4142 is adjacent to the second portion inner surface 41232 of the molding base 412, and the second portion inner surface 41232 of the molding base 412 extends downward from the light shielding layer 4142, and a light suppression groove 41221 is formed between the light shielding layer 4142, the first portion inner surface 41231 and the second portion inner surface 41232, and on an outer side portion of the light window 4122, the light suppression groove 41221 is a space for suppressing stray light. More specifically, as shown in FIG. 30, the stray light L12 enters the light suppression groove 41221, so that it cannot be emitted from the light suppression groove 41221.

It can be understood that, because the light shielding layer 4142 is adjacent to the second portion inner surface 41232 of the molding base 412, so that the light shielding layer 4142 effectively reduces the light passing through the filter element main body 4141 to the second portion inner surface 41232, thereby preventing the light incident on the second portion inner surface 41232 from being reflected by the second portion inner surface 41232 and reaching the photosensitive element 413 to form stray light and affect the imaging quality of the camera module 400. As shown in FIG. 30, the second portion inner surface 41232 extends downward from the light shielding layer 4142, the light shielding layer 4142 extends horizontally from the second portion inner surface 41232, an included angle γ is formed by the light shielding layers 4142 and the second portion inner surfaces 41232, and the included angle γ is an acute angle or a right angle, so that the light suppression groove 41221 formed in such a structure prevents the light incident on the inner surface 4123 from being reflected toward the photosensitive element 413 to generates stray light.

The filter element 4141 may be mounted on the top surface 4124 of the molding base 412, such as being adhered to the top surface 4124 of the molding base 412 by glue. The light shielding layer 4142 is a black light absorbing opaque material, and can be formed on the bottom surface of the filter element main body 4141 in various ways, such as being attached to the bottom surface of the filter element main body 4141, or the light shielding layer 4142 is formed on the bottom surface of the filter element main body 4141 by using a yellow light process or a screen printing process.

Figure 31A:
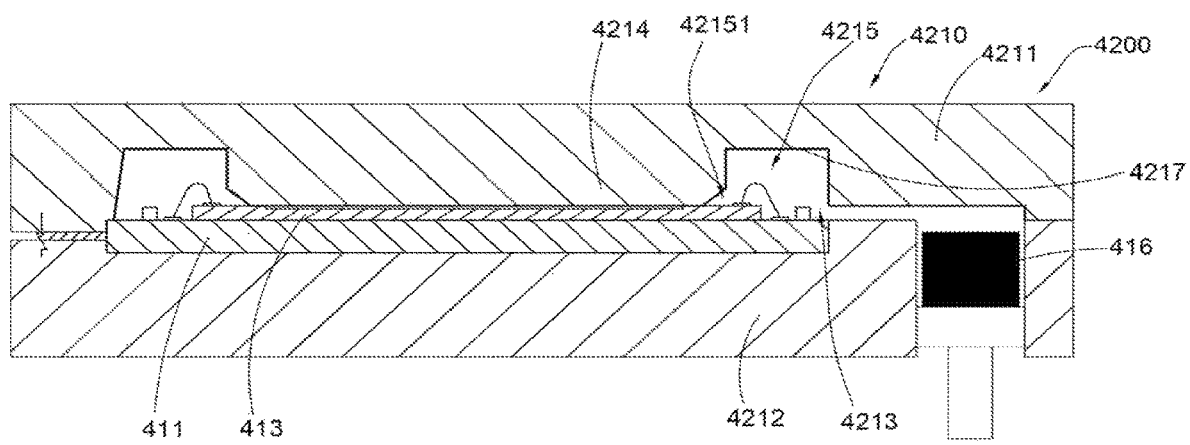
FIG. 31A is a cross-sectional view illustrating when a molten molding material is pushed into a base molding guide groove in a molding die in a molding process according to the above-mentioned third preferred embodiment of the present application.
Figure 31B:
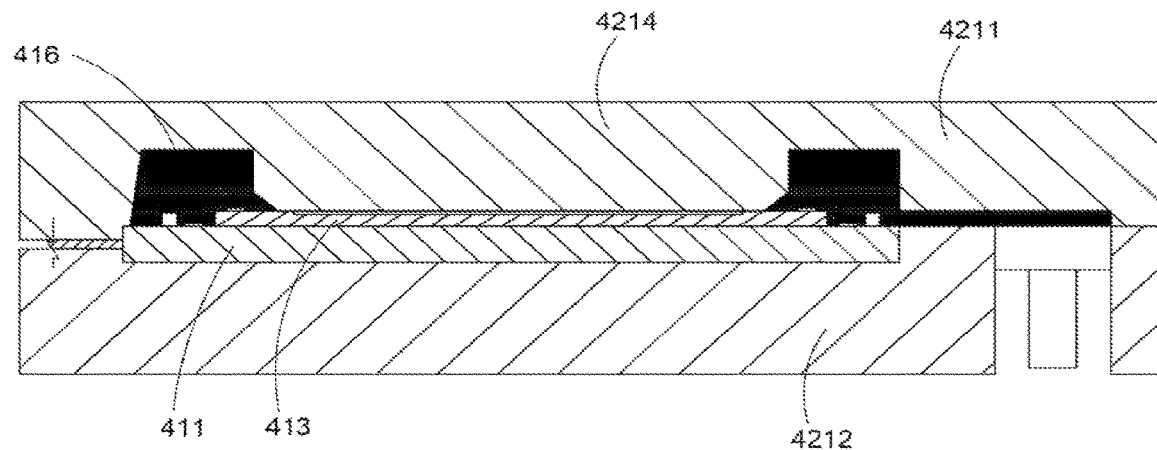
FIG. 31B is a cross-sectional view illustrating when the molten molding material is filled in the base molding guide groove in the third preferred embodiment of the present application.
Figure 31C:
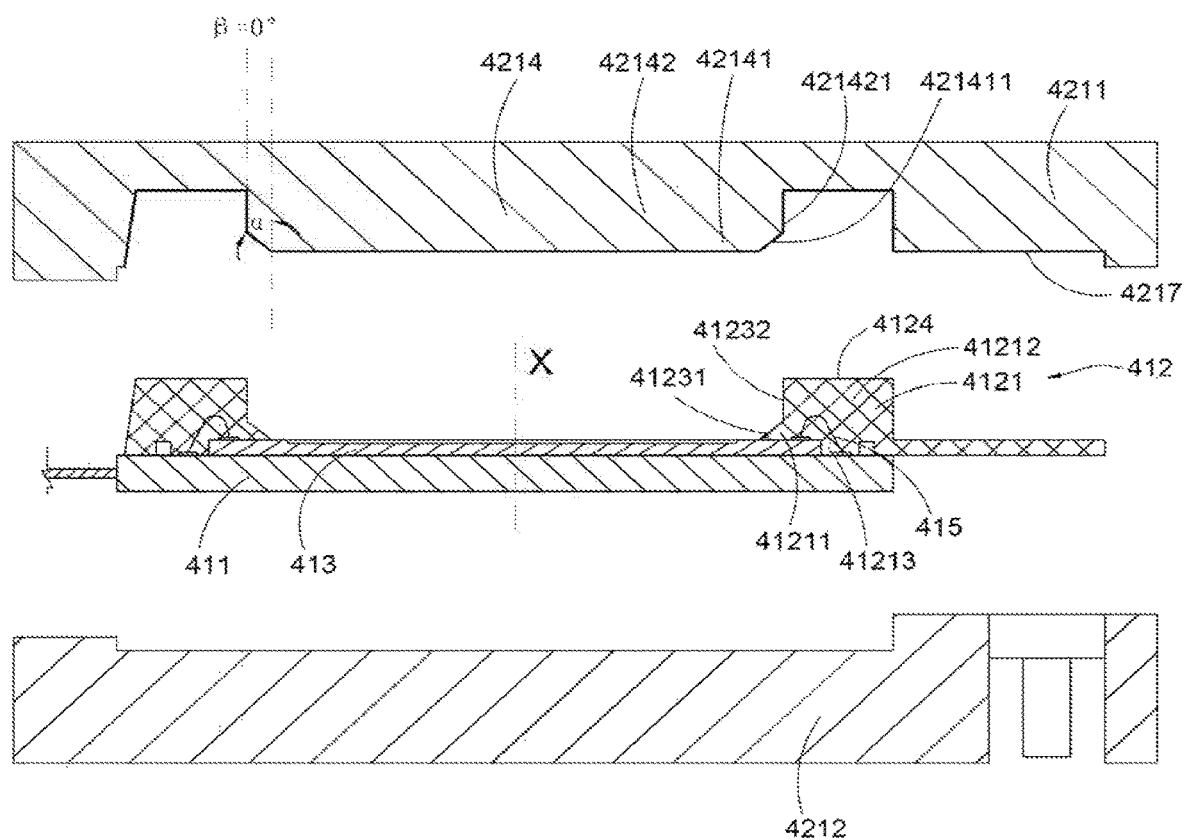
FIG. 31C is a cross-sectional view illustrating the formation of a molding base by performing a demolding step according to the above-mentioned third preferred embodiment of the present application.

FIGS. 31A to 31C are schematic diagrams illustrating a manufacturing process of the integrated assembly of the integrated circuit board 411, the molding base 412, and the photosensitive element 413 of the photosensitive assembly 410 according to the present application. The manufacturing equipment 4200 includes a molding die 4210, which includes a first die 4211 and a second die 4212 that is capable of die opening and clamping, that is, a mold fixing device is capable of making the first die 4211 and the second die 4212 being separated and closely contacted to form a molding cavity 4213. When clamping, the circuit board 411 connected to the photosensitive element 413 is fixed in the molding cavity 4213, and the fluid-like molding material 416 enters the molding cavity 4213, so as to be integrally molded on the circuit board 411 and the photosensitive element 413, and after being cured, the molding base 412 integrally molded on the circuit board 411 and the photosensitive element 413 is formed. It can be understood that, in the production process, the above-mentioned integrated assembly is usually generated in a jointed panel manner, that is, a one-piece molding base is formed on a circuit board jointed panel, then is cut to form the integrated assembly of the present application. In FIGS. 31A to 31C, description is made by using an example to illustrate the formation process of one integrated assembly.

More specifically, the molding die 4210 further has a base molding guide groove 4215 and a light window molding portion 4214 located in the base molding guide groove 4215. When the first die 4211 and the second dies 4212 are clamped, the light window molding portion 4214 and the base molding guide groove 4215 extend in the molding cavity 4213, and the fluid-like molding material 416 is filled into the base molding guide groove 4215, and the position corresponding to the light window molding portion 4214 cannot be filled with the fluid-like molding material 416, so that at the position corresponding to the base molding guide groove 4215, after being cured, the fluid-like molding material 416 can form the molding base 412, which includes a ring-shaped molding base main body 4121 corresponding to the molding base 412 of each of the photosensitive assemblies 410, and the light window 4122 of the molding base 412 is formed at a position corresponding to the light window molding portion 4214. The molding material 416 may be selected from, but not limited to, nylon, LCP (Liquid Crystal Polymer), PP (Polypropylene), epoxy resin, and the like.

More specifically, when the first and second dies 4211 and 4212 are clamped and a molding step is performed, the light window molding portion 4214 is superimposed on the top surface of the photosensitive element 413 and closely adhered, so that the fluid-like molding material 416 is prevented from entering the photosensitive region 4131 of the photosensitive element 413 on the circuit board 411, so that the light window 4122 of the molding base 412 can be finally formed at a position corresponding to the light window molding portion 4214. It can be understood that, the light window molding portion 4214 may be a solid structure or a structure having a groove shape inside as shown in the figure. It can be understood that, in another variation, an elastic film 4217 may be further provided on the bottom side of the first die 4211 to provide cushioning and facilitate demolding after the molding process.

As shown in FIGS. 31A to 31C, the light window molding portion 4214 is pressed on the photosensitive element 413, for correspondingly forming the photosensitive element coupling portion 41211 and the top side extending portion 41212 of the molding base 412, the light window molding portion 4214 has a bottom side molding portion 42141 and a top side molding portion 42142, the bottom side molding portion 42141 is a frustum shaped structure and has a gradually increasing inner diameter from the bottom side toward the top side. Wherein, An included angle α is formed between the outer surface 421411 of the bottom side molding portion 42141 and the optical axis X (vertical direction shown in the Figure) perpendicular to the photosensitive element 413, an included angle β is between the outer surface 421421 of the top side molding portion 42142 and the optical axes X perpendicular to the photosensitive elements 413. Accordingly, the value of α ranges from 3°~80°, the value of β ranges from 0°~10°, and α>β. The top side molding portion 42142 extends from the bottom side molding portion 42141 in a twist manner, and it will not be pressed against the connecting wire 415 during the molding process to cause damage to the connecting wire 415. The outer surface 411411 of the bottom side molding portion 42141 extends obliquely instead of directly forming a sharp right angle, and its height is at least 0.05 mm, so as to prevent the elastic film 4217 from being punctured during the molding process.

The light window molding portion 4214 has a first portion outer surface 421411 and a second portion outer surface 421421 in a direction from the bottom side toward the top side, which respectively form angles α and β with the optical axis X perpendicular to the photosensitive element 413, the value of α ranges from 3°~80°, the value of β ranges from 0°~10°, and α>β. Thus, after the molding process, the molding base 412 is formed into the photosensitive element coupling portion 41211 and the top side extending portion 41212, and the first portion inner surface 41231 defined by the structure formed by the photosensitive element coupling portion 41211 of which is an inner surface thereof extends obliquely upward from the photosensitive element 413 with a relatively small slope, and the second portion inner surface 41232 defined by the inner surface of the top side extending portion 41212 extends integrally from the first portion inner surface 41231 in a twisted manner, and extends upward with a relatively large slope or no slope. That is, the included angle of the first portion inner surface 41231 defined by the inner surface of the photosensitive element coupling portion 41211 relative to the optical axis X of the camera module 400 is α, the included angle of the second partial inner surface 41232 defined by the inner surface of the top side extending portion 41212 relative to the optical axis X of the camera module 400 is β, wherein the value of α ranges from 3°~80°, and the value of β ranges from 0°~10°, and α>β. It can be understood that, such structure of the light window molding portion 4214 extending in a twisted manner can reduce the molding material 416 entering the non-photosensitive region 4132 of the photosensitive element 413 and the space 41251 of the bottom side portion of the base molding guide groove 4215 of the first portion outer surface 421411 of the light window molding portion 4214 in the molding process, so that the volume of the molding material 416 in the space is small, and the pressure and pressure force generated are relatively small, so that it is not easy to enter the photosensitive region 4131 of the photosensitive element 413, that is, avoiding the occurrence of "flash".

In this molding process of the present application, a portion of the bottom side of the base molding guide groove 4215 located between the photosensitive element 413 and the first portion outer surface 421411 of the molding base 412 forms a fill groove 42151. The molding material 416 that is molded to form the molding base 412 does not easily enter between the photosensitive element 413 and the bottom surface of the light window molding portion 4214 to form a "flash", thereby reducing the possibility that the photosensitive region 4131 of the photosensitive element 413 is contaminated. More specifically, by reducing the volume of the filling groove 42151 between the photosensitive element 413 and the first portion outer surface 421411 of the light window molding portion 4214, the pressure and pressure force generated by the material 416 entering the filling groove 42151 is reduced, so that the possibility that the molding material 416 enters between the photosensitive element 413 and the bottom surface of the light window molding portion 4214 to form a "flash" is reduced.

Figure 32A:
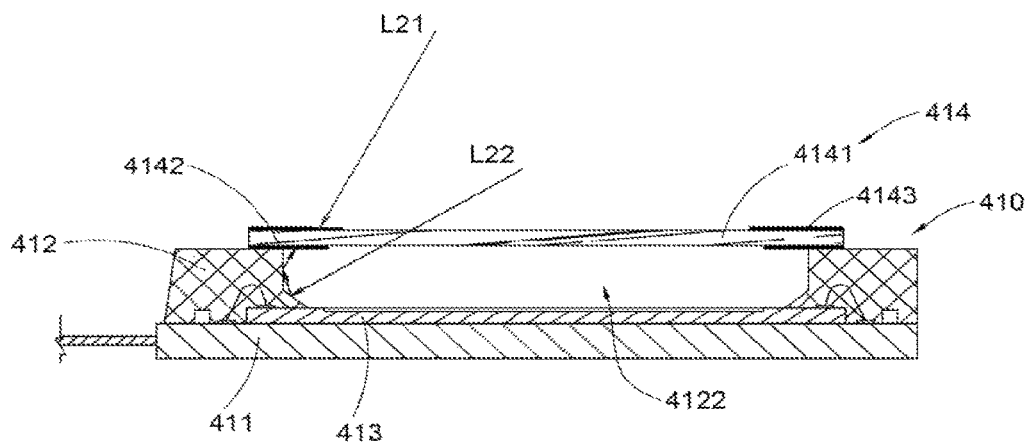
FIG. 32A is a schematic view illustrating that a light shielding layer is attached to both sides of a photosensitive assembly according to a variant embodiment of the third preferred embodiment of the present application to effectively reduce stray light.

In this preferred embodiment of the present application, the outer surface of the light window molding portion 4214 has an outer surface extending in different directions, and the included angle of the top side outer surface of the light window molding portion 4214, i.e., the second portion outer surface 421421, relative to the optical axis X of the photosensitive assembly is smaller than the included angle of the outer surface of the bottom side of the light window molding portion 4214, i.e., the first portion outer surface 421411, relative to the optical axis X, thereby reducing the volume of the filling groove 42151 formed between the first portion outer surface 421411 of the light window molding portion 4214 and the photosensitive element 413, thereby reducing the possibility of the occurrence of "flash". In addition, the second portion outer surface 421421 of the top side of the light window molding portion extends in a direction with a small included angle with the optical axis X, so that unlike the inclined outer surface illustrated in FIG. 1B, which is convenient to guide the packaging material into the filling groove, in this embodiment of the present application, the second portion outer surface 421421 of the top side of the light window molding portion can play a certain degree of blocking effect, that is, because it is from the first portion outer surface 421411 extends integrally in a twist manner, not similar to the guide surface structure extending linearly and obliquely in FIG. 1B, thereby slowing down the flow rate of the molding material 416 entering the filling groove 42151 to a certain extent, and reducing the pressure force generated when the molding material 416 enters the filling groove 42151, thereby reducing the possibility of the occurrence of "flash". Moreover, since the molding material 416 is not easy to form a "flash" in the integral molding process, the light window molding portion 4214 does not need to be pressed onto the photosensitive element 413 with a large pressure, thereby avoiding the photosensitive element 413 is crushed. As shown in FIG. 32A, according to a variant embodiment of the third preferred embodiment of the present application, in this embodiment, a top side light shielding layer 4143 is further provided on the top surface of the filter element main body 4141, so that the top side light shielding layer 4143 and light shielding layer 4142 cooperate to enhance the effect of reducing the stray light. More specifically, the light L21 incident on the top side light shielding layer 4143 is absorbed by the top side light shielding layer 4143, and the light L22 is absorbed by light shielding layer 4142. It can be understood that, the above third preferred embodiment may also be provided with the top side light shielding layer 4143.

Figure 32B:
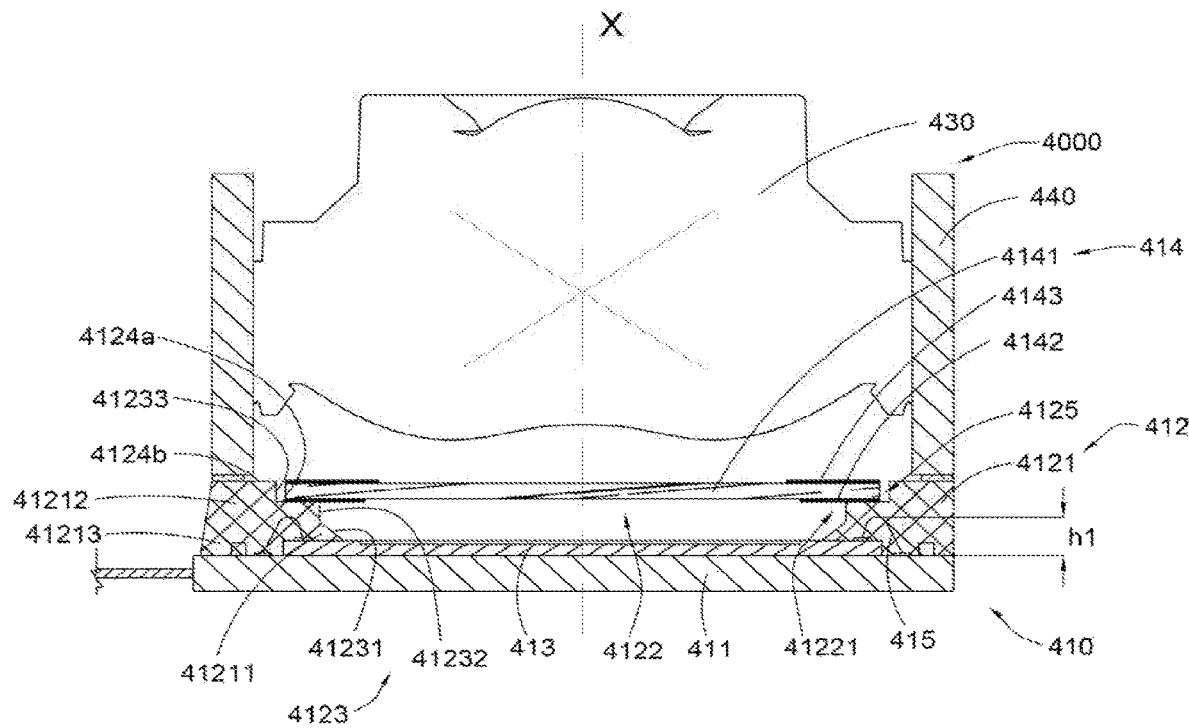
FIG. 32B is a cross-sectional view illustrating a camera module according to another variant embodiment of the third preferred embodiment of the present application.

As shown in FIG. 32B, according to a variant embodiment of the third preferred embodiment of the present application, the camera module 400 includes the photosensitive assembly 410, the lens 430, and a lens supporting element 440. The lens 430 is assembled on the lens supporting member 440 to form a lens assembly. The lens supporting element 440 may be a fixed lens barrel, thereby forming a fixed focus camera module.

Accordingly, the photosensitive assembly 410 includes a circuit board 411, a molding base 412, a photosensitive element 413, and a filter element 414. The molding base 412 includes a base main body 4121, which is integrally molded on the circuit board 411 and the photosensitive element 413 and form a light window 4122. The light window 4122 is a closed space and provides a light path for the photosensitive element 413. The filter element 414 includes a filter element main body 4141 and a light shielding layer 4142. The light shielding layer 4142 is a light absorbing opaque material, which is located on the bottom side of the filter element main body 4141 and is located between the filter element main body 4141 and the molding base 412.

Wherein, the molding base 412 has a top side groove 4125 on a top side thereof, and the top side groove 4125 is used for assembling the filter element 414. That is, in this embodiment of the present application, the top surface 4124 of the molding base 412 may be a multi-step surface, and the top surface 4124 is divided into non-coplanar multi-portion top surfaces, such as a first portion top surface 4124a and a second portion top surface 4124b, the first portion top surface 4124a being recessed toward the photosensitive element 413 with respect to the second portion top surface 4124b, so that a top side groove 4125 is formed on the top side of the first partial top surface 4124a, and the filter element 414 is assembled on the top side groove 4125.

The top side extending portion 41212 of the molding base 412 is correspondingly two-staged, and the top side groove 4125 is formed on the top side thereof. The inner surface 4123 of the molding base 412 includes the first portion inner surface 41231 of the photosensitive element coupling portion 41211 and the second portion inner surface 41232 and the third portion inner surface 41233 formed by the top side extending portion 41212, the light shielding layer 4142 is adjacent to the second portion inner surface 41232 of the molding base 412, and forms The light suppression groove 41221 with the first portion inner surface 41231 and the second portion inner surface 41232, so that a space for the stray light emission is formed. That is, the light incident on the first portion inner surface 41231 is directly reflected to light shielding layer 4142 or is further reflected to light shielding layer 4142 by the second portion inner surface 41232 to be absorbed by light shielding layer 4142, thereby reducing the stray light. The top side of the filter element 414 is also provided with the top side light shielding layer 4143 to enhance the effect of eliminating stray light.

It can be understood that, in the embodiments shown in FIGS. 28 to 33, the wiring direction of the connecting wire 415 is from the photosensitive element 413 to the circuit board 411, that is, by providing a photosensitive element connecting plate on the photosensitive element 413, a top end of the photosensitive element connecting plate is wired to form a first end of the connection line 415 connected to the photosensitive element connecting plate, and then a preset position is raised, and then moved toward the circuit board connecting plate on the circuit board and lowered again to form a second end of the connecting wire 415 connected to the circuit board connecting plate at the top end of the circuit board connecting plate.

Figure 33:
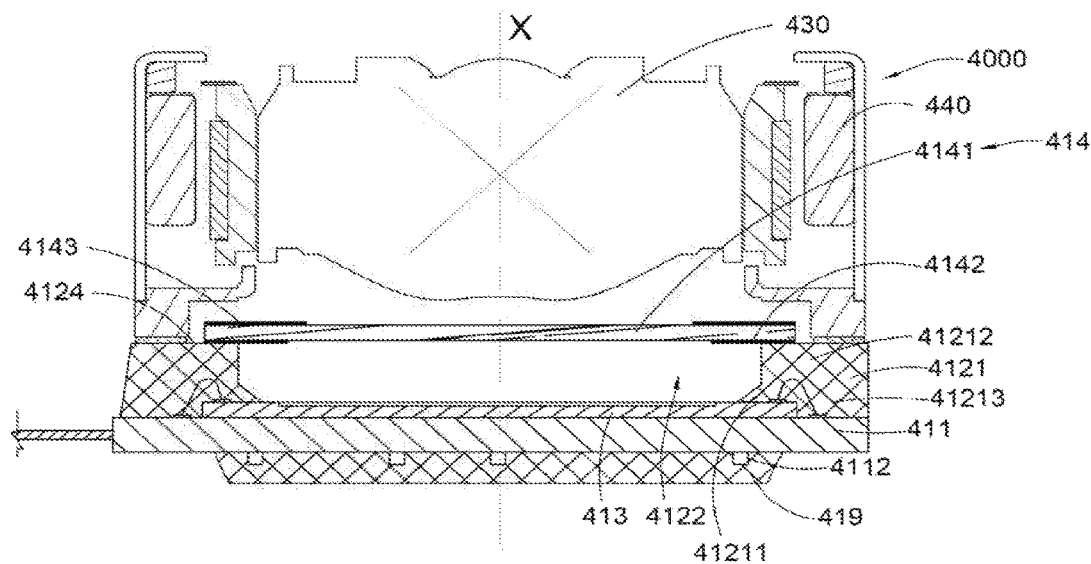
FIG. 33 is a cross-sectional view illustrating a camera module according to another variant embodiment of the third preferred embodiment of the present application.

As shown in FIG. 33, according to another variant embodiment of the above-mentioned third preferred embodiment of the present application, the electronic components 4112 of the circuit board 411 of the photosensitive assemble 410 of the camera module 400 are mounted on the bottom side of the circuit board, the photosensitive assembly 410 accordingly further includes one or more bottom side molding portions 419, which integrally embed the electronic component 4112. That is, the electronic component 4112 is not mounted on the top side of the circuit board 411, these electronic components 4112 are provided on the bottom side of the circuit board 411, and by the bottom side molding portion 419, they can be multiple independent parts, and can also form an integrally molding base, which embed the electronic component 4112 to form a flat support surface on the bottom side. The bottom side molding portion 419 and the molding base 412 may be formed independently, or may be formed in a single molding process. For example, the circuit board 411 may have perforations, and the molding material 416 can reach both sides of the circuit board 411 during the molding process.

It can be understood that, the space on the bottom side of the circuit board 411 under the photosensitive element 413 can also be used for arranging the electronic components 4112, so unlike the above embodiment, the electronic components 4112 need to be arranged around the photosensitive element 413, in this embodiment, the area of the circuit board 411 is significantly reduced.

Accordingly, the molding base 412 includes the photosensitive element coupling portion 41211 and the top side extending portion 41212, so that when the size of the photosensitive assembly 410 is further reduced, the area of the top surface 4124 of the molding base 412 is increased by the top side extending portion 41212 extending in a twisted manner, so as to provide a greater mounting surface for the lens supporting element 440 and the filter element 414. In addition, the filter element 414 includes a bottom side light shielding layer 4142 and a top side light shielding layer 4143 provided on both sides of the filter element main body 4141, thereby enhancing the effect of eliminating the stray light.

Figure 34:
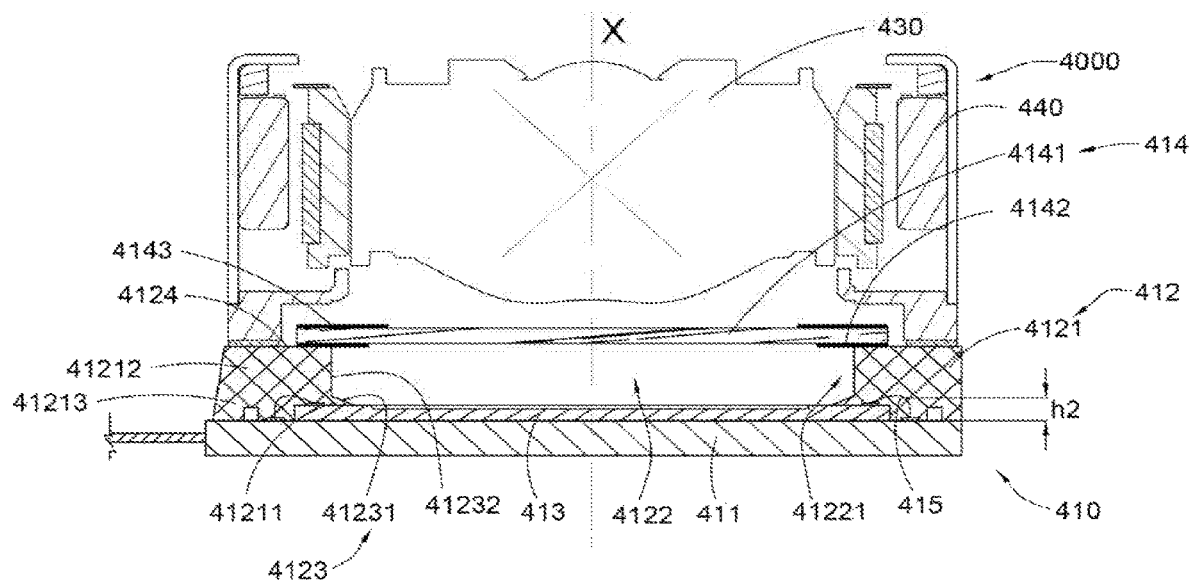
FIG. 34 is a cross-sectional view illustrating a camera module according to another variant embodiment of the third preferred embodiment of the present application.

As shown in FIG. 34, the wired connection between the photosensitive element 413 and the circuit board 411 is from the circuit board 411 to the photosensitive element 413. That is, by providing a circuit board connecting plate on the circuit board 411, a top end of the circuit board connecting plate is wired to form a second end of the connection line 415 connected to the circuit board connecting plate, and then a preset position is raised, and then moved toward the circuit board connecting plate and lowered again to form an opposite first end of the connecting wire 415 connected to the photosensitive element connecting plate at the top end of the photosensitive element connecting plate, in this way, the connecting wire 415 extends in a curved shape, and it causes the height h2 of the top end of the connecting wire 415 to be lower than the height h1 of the top end of the connecting wire in the embodiments of FIGS. 28 to 33, taking FIG. 33 as an example, so that, in the molding process, a space needed for the light window molding portion 4214 of the molding die 4210 to avoid the connecting wire 415 is reduced, thereby the height of the top side extending portion 41212 can be higher.

Figure 35:
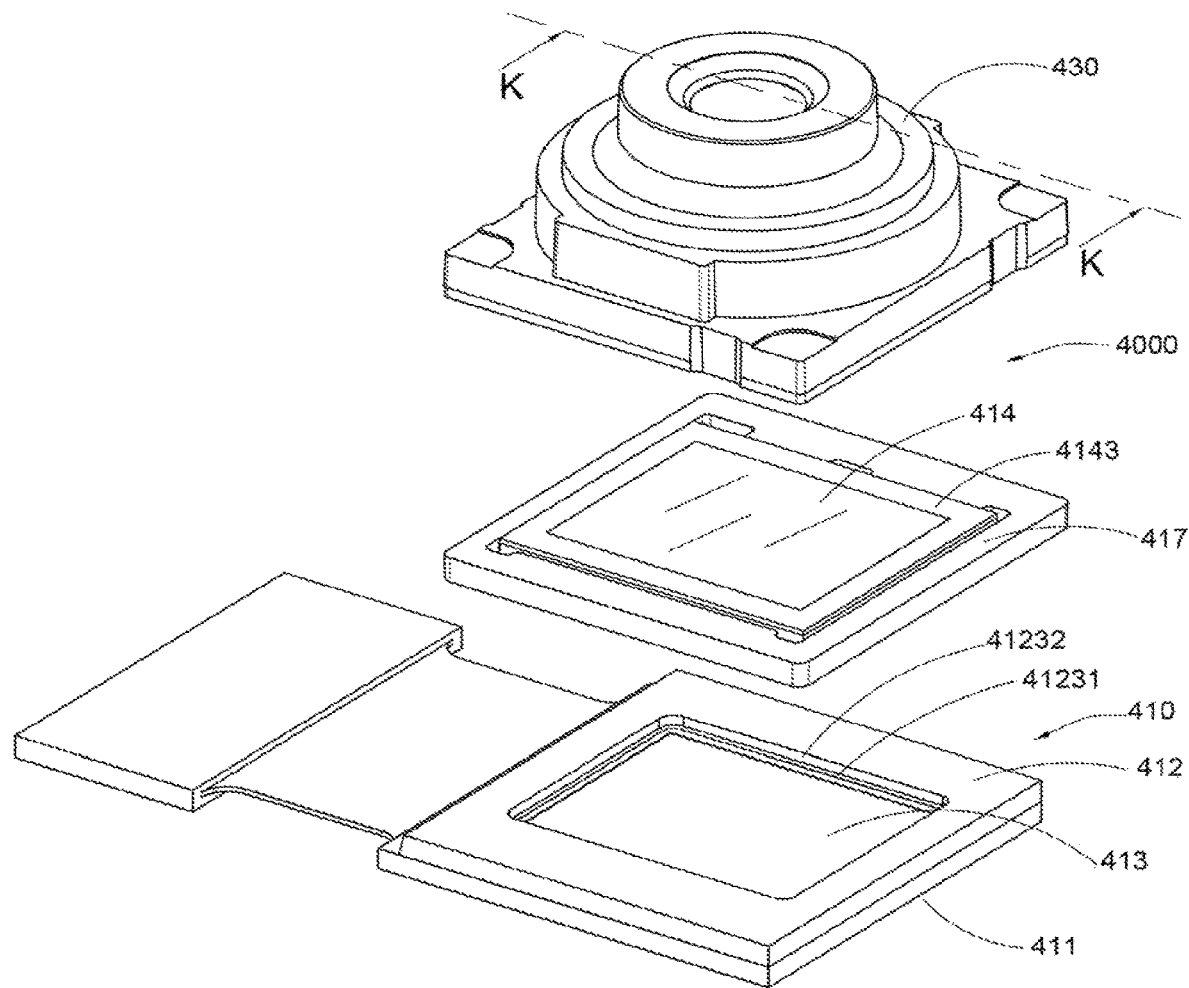
FIG. 35 is a three-dimensional exploded view illustrating a camera module according to a fourth preferred embodiment of the present application.
Figure 36A:
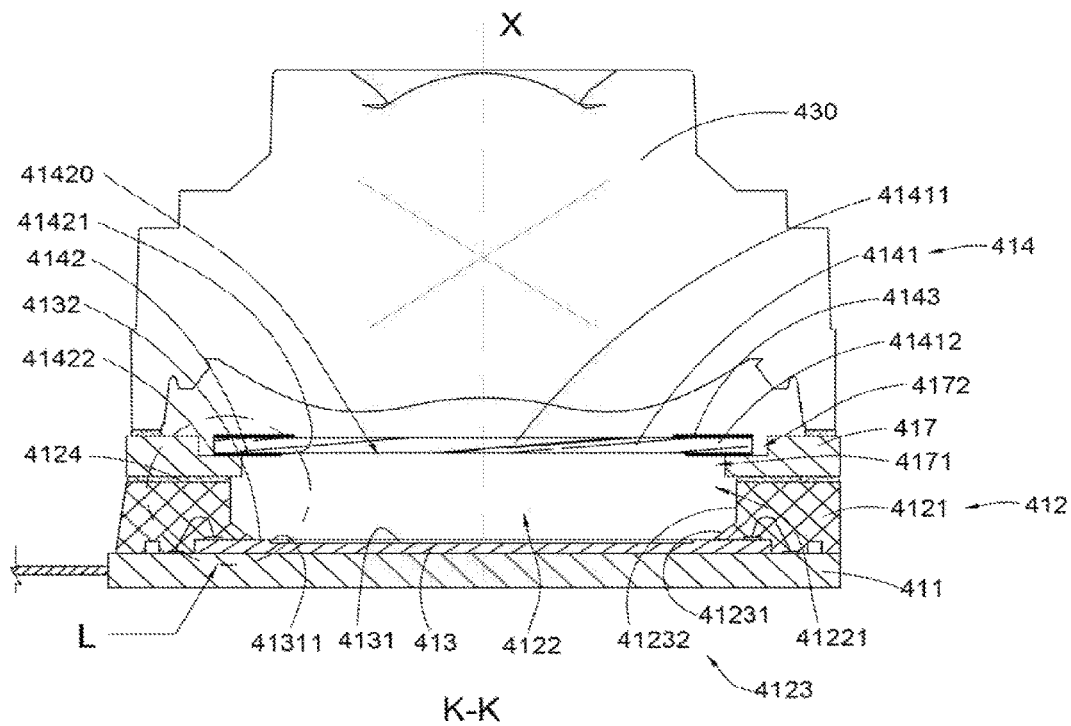
FIG. 36A is a cross-sectional view of the camera module according to the above-mentioned fourth preferred embodiment of the present application, taken along the line K-K in FIG. 35.
Figure 36B:
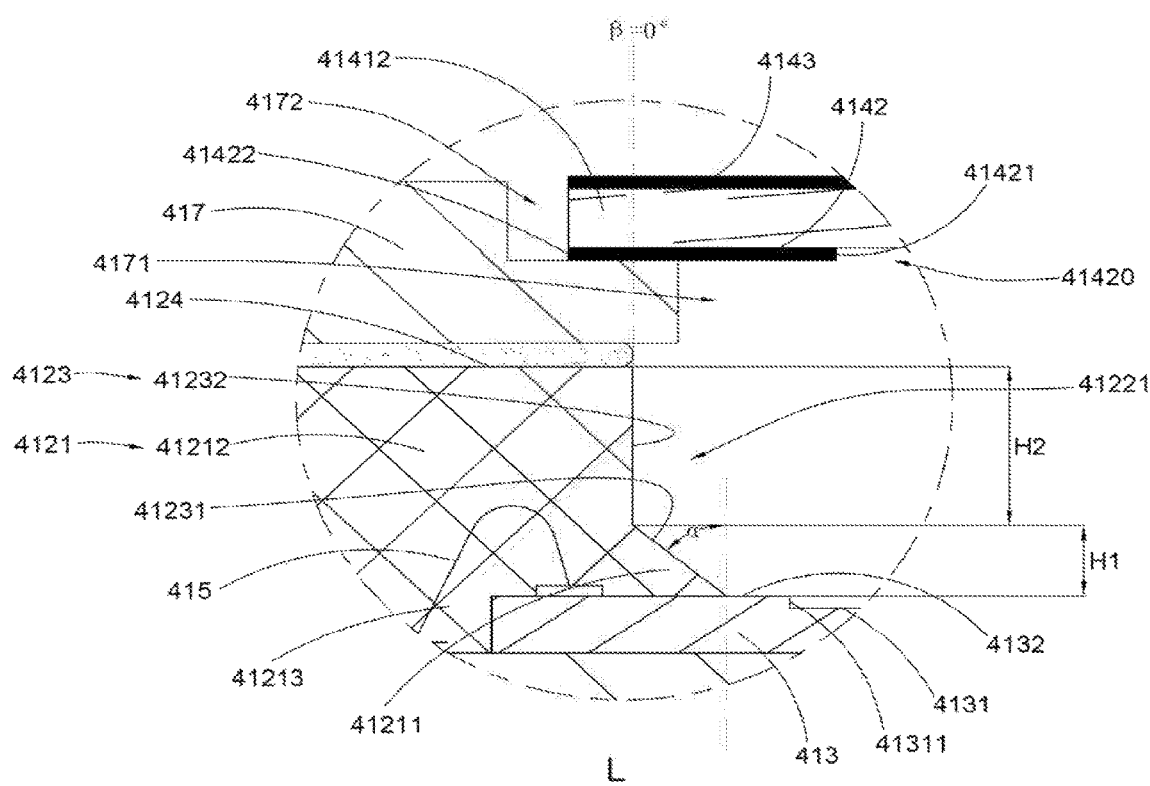
FIG. 36B is an enlarged schematic view at L in FIG. 36A.
Figure 37:
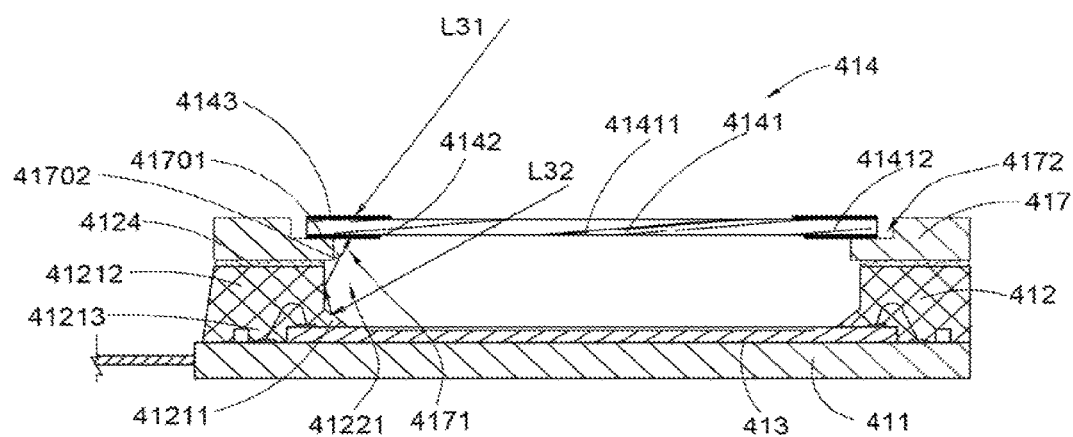
FIG. 37 is a schematic view illustrating that a light shielding layer is attached to a bottom side of the photosensitive assembly of the camera module according to the above-mentioned fourth preferred embodiment of the present application to effectively reduce stray light reflected to the photosensitive element.

As shown in FIGS. 35 to 37, a camera module 400 according to a fourth preferred embodiment of the present application is shown, wherein the camera module 400 includes a photosensitive assembly 410 and a lens 430. The lens 430 is assembled on the photosensitive assembly to form a fixed focus camera module. It can be understood that, in another variant embodiment, the lens may also be provided on a driver or a fixed lens barrel to form a lens assembly, and the lens assembly is assembled on the photosensitive assembly.

Accordingly, the photosensitive assembly 410 includes a circuit board 411, a molding base 412, a photosensitive element 413, a filter element 414, and a filter element holder 417, the molding base 412 includes a base main body 4121, which is integrally molded on the circuit board 411 and the photosensitive element 413 and forms a light window 4122, the light window 4122 is a closed space and provides a light path for the photosensitive element 413.

The filter element holder 417 is assembled on the molding base 412 and has an opening window 4171 on the bottom side and a top side mounting groove 4172, the filter element 414 is assembled on the top side mounting groove 4172, so that the filter element 414 assembled on the filter element holder 417 is less likely to be damaged than the filter element 412 directly assembled on the molding base 412.

The filter element 414 includes a filter element main body 4141, a bottom side light shielding layer 4142, and a top side light shielding layer 4143, the light shielding layer 4142 is located on the bottom side of the filter element main body 4141 and is located between the filter element main body 4141 and the inner top surface of the filter element holder 417, the light shielding layer 4142 is a light absorbing material, which makes the filter element main body 4141 form a middle effective light transmitting region 41411 and a surrounding region 41412, the light passing through the lens 430 can only reach the inside of the molding base 412 through the effective light transmitting region 41411. The light shielding layer 4142 has a ring structure, and an opening window is formed in the middle, that is, the light shielding layer 4142 forms a light path 41420 for allowing light to enter the light window 4122 and reduce the stray light reaching the photosensitive element 413, and the top side light shielding layer 4143 can enhance the effect of reducing stray light.

The photosensitive element 413 has a photosensitive region 4131 in the middle and a non-photosensitive region 4132 located around the photosensitive region 4131, the light shielding layer 4142 has an inner edge 41421 and an outer edge 41422. The distance between the inner edge 41421 of the light shielding layer 4142 and to the optical axis X is greater than or equal to, or slightly smaller than the distance between the outer edge 41311 of the photosensitive region 4131 and the optical axis X.

The outer edge 41422 of the light shielding layer 4142 is located outside the inner edge 41701 of the top surface of the filter element holder 417, that is, no light transmitting region is formed between the inner edge of the top surface of the filter element holder 417 and the outer edges 41422 of the light shielding layer 4142.

In this embodiment of the present application, the base main body 4121 of the molding base 412 includes a plurality of segments of an inner surfaces in a circumferential direction, each of segments of the inner surface has a plurality of the portions extending in different directions, such as the base main body 4121 of the molding base 412 includes three portions, that is, a photosensitive element coupling portion 41211 and a top side extending portion 41212 located around the light window 4122 shown in FIGS. 36A and 36B, and a circuit board coupling portion 41213 on the bottom side of the photosensitive element coupling portion 41211. The photosensitive element coupling portion 41211 has an inner surface integrally extending from the photosensitive element 413, and at least a segment of the inner surface integrally extending from the photosensitive element 413 is defined as a first portion inner surface 41231 of the molding base 412, the top side extending portion 41212 has an inner surface extending integrally from the photosensitive element coupling portion 41211, and forms a second portion inner surface 41232 of the molding base 412, the second portion inner surface 41232 is integrally extending from the first portion inner surface 41231. It can be understood that, each of the first portion inner surfaces 41231 and the second portion inner surfaces 41232 is a certain section of the inner surface of the surrounding inner surface of the base main body 4121; or a plurality of sections of the inner surface have the first portion inner surface 41231 and the second portion inner surface 41232 of the same structure; or all of the inner surfaces have the first portion inner surface 41231 and the second portion inner surface 41232.

The inner surfaces 41231 and 41232 of the photosensitive element coupling portion 41211 and the top side extending portion 41212 extend at different slopes, respectively, the second portion inner surface 41232 of the top side extending portion 41212 extends upward with a greater slope with respect to the first portion inner surface 41231 of the photosensitive element coupling portion 41211, or the second portion inner surface 41232 of the top side extending portion 41212 extends upward without a slope, that is, the second portion inner surface 41232 of the top side extending portion 41212 extends substantially perpendicular to the top surface of the photosensitive element 413, so that the area of the top surface of the top side extending portion 41212 can be relatively large, that is, the top surface of the top side extending portion 41212 determines the area of the top surface 4124 of the molding base 412, and such extension structure of the photosensitive element coupling portion 41211 and the top side extending portion 41212 can increase the area of the top surface 4124 of the molding base 412, so that it can provide a greater mounting area for the lens or the lens assembly or the filter element holder 417 above the photosensitive assembly 410, for example, in this embodiment, the top surface 4124 of the molding base 412 allows the filter element holder 417 above to be more firmly mounted. And such a structure can reduce the area of the filter element 414.

That is, in order to facilitate the demolding of the molding process and prevent the stray light, the first portion inner surface 41231 defined by the structure formed by the photosensitive element coupling portion 41211 for its inner surface extends obliquely upward from the photosensitive element 413 with a relatively small slope, and the second portion inner surface 41232 defined by the inner surface of the top side extending portion 41212 extends integrally from the first portion inner surface 41231 in a twist manner, and extends upward with a relatively large slope or no slope, that is, an included angle is formed between the second portion inner surface 41232 and the first portion inner surface 41231 of the molding base 412, so that, in comparison to the oblique upward extension with a fixed slope, the area of the top surface 4124 of the molding base 412 can be effectively increased. It can be understood that, the inner surfaces of the molding base 412 extending in the circumferential direction may all have the above mentioned first portion inner surface 41231 and the above mentioned second portion inner surface 41232, and the first portion inner surface 41231 may have the same included angle α, or the included angle can be different. These second portion inner surfaces 41232 may have the same angle β, or the included angle can be different.

As shown in FIG. 36B, an included angle of the first portion inner surface 41231 defined by the inner surface of the photosensitive element coupling portion 41211 relative to the optical axis X of the camera module 400 is α, and an included angle of the second portion inner surface 41232 defined by the inner surface of the top side extending portion 41212 relative to the optical axis X of the camera module 400 is β, wherein the value of α ranges from 3°~80°, and the value of β ranges from 0°~10°, and α>β.

That is, the included angle β of the second portion inner surface 41232 defined by the inner surface of the top side extending portion 41212 relative to the optical axis X of the camera module 400 has a smaller angle relative to the included angle α of the first portion inner surface 41231 defined by the inner surface of the photosensitive element coupling portion 41211 relative to the optical axis X of the camera module 400, so that the second portion inner surface 41232 of the top side extending portion 41212 extends upward with a greater slope or in a direction perpendicular to the photosensitive element 413, thereby increasing the area of the top surface 4124 of the molding base 412 and reducing the area of the filter element, and reducing the possibility of generating "flashing" of the molding material 416 during the molding process.

As shown in FIG. 36B, in this preferred embodiment of the present application, preferably, the value of the thickness H1 of the photosensitive element coupling portion 41211 ranges from 0.05 mm~0.7 mm, and the value of the thickness H2 of the top side extending portion 41212 ranges from 0.02 mm~0.6 mm.

In addition, the filter element 414 is provided with the light shielding layer 4142 and the top side light shielding layer 4143, and as shown in FIG. 37, a part of the stray light L31 incidents on the upper surface of the filter element main body 4141 of the filter element 414 is absorbed by the top side light shielding layer 4143, so as to block a part of the stray light.

When another part of the stray light L32 passes through the effective light transmitting region 41411 of the filter element main body 4141 and incidents on the first portion inner surface 41231, it will be reflected upward to the light shielding layer 4142 by the inclined first portion inner surface 41231 of the molding base 412 or further reflected to the light shielding layer 4142 by the second portion inner surface 41232, so as to be absorbed by light shielding layer 4142, so as not to be further reflected and reach the photosensitive element 413, thereby affecting the imaging quality of the camera module 400. Accordingly, the light shielding layer 4142 is adjacent to an inner surface 41702 of the filter element holder 417 located below the filter element, and the inner surface 41702 of the filter element holder 417 located below the filter element extends downward from the light shielding layer 4142, and a light suppression groove 41221 is formed on the light shielding layer 4142, on the inner surface 41702 of the filter element holder 417 below the filter element, between the first portion inner surface 41231 and the second portion inner surface 41232, on the outer side portion of the light window 4122, and the light suppression groove 41221 is a space for suppressing the emission of the stray light. More specifically, as shown in FIG. 37, the stray light L32 enters the light suppression groove 41221, so that it cannot be emitted in the light suppression groove 41221.

Figure 38:
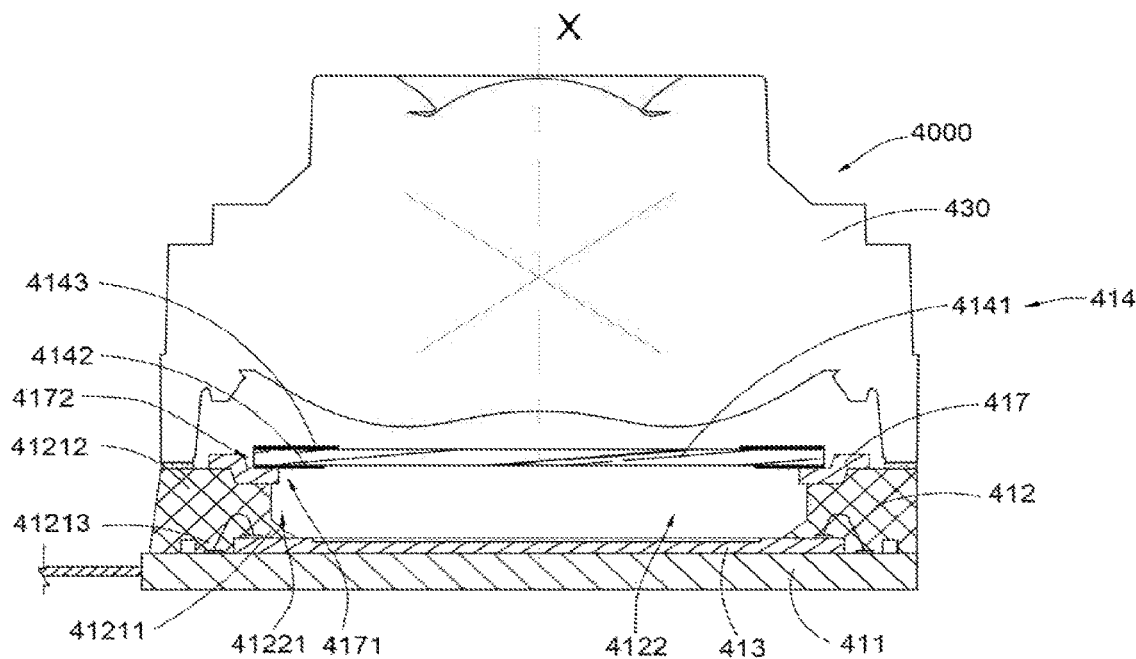
FIG. 38 is a cross-sectional view of a camera module according to a variant embodiment of the above-mentioned fourth preferred embodiment of the present application.

As shown in FIG. 38, according to a variant embodiment of the above mentioned fourth preferred embodiment of the present application, a top side groove 4125 is formed on the top side of the molding base 412, and the filter element holder 417 is assembled on the top side groove 4125 to move its position downward, and the lens 430 can be assembled on the top side of the molding base 412. That is, the top surface 4124 enlarged by the molding base 412 by multi-stage extension is used for assembling the filter element holder 417 and the lens 430.

Figure 39:
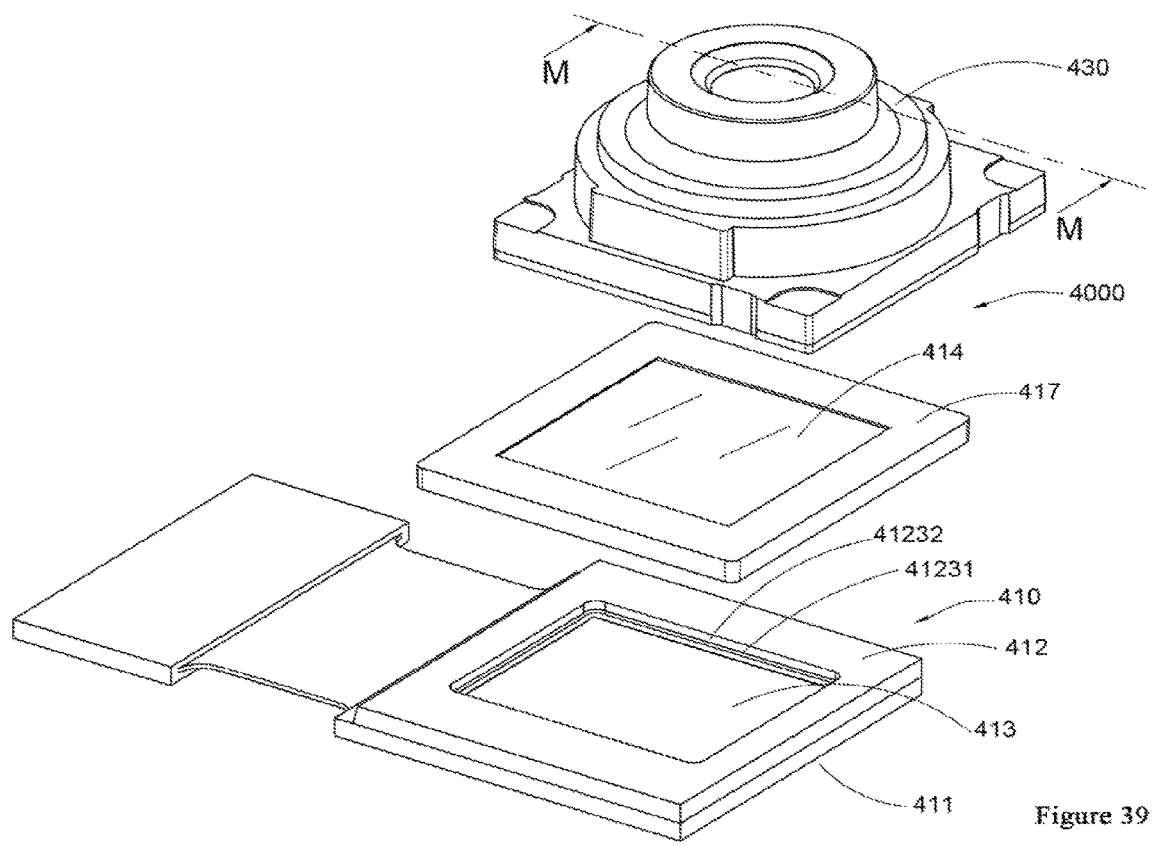
FIG. 39 is a three-dimensional exploded view of a camera module according to a fifth preferred embodiment of the present application.
Figure 40:
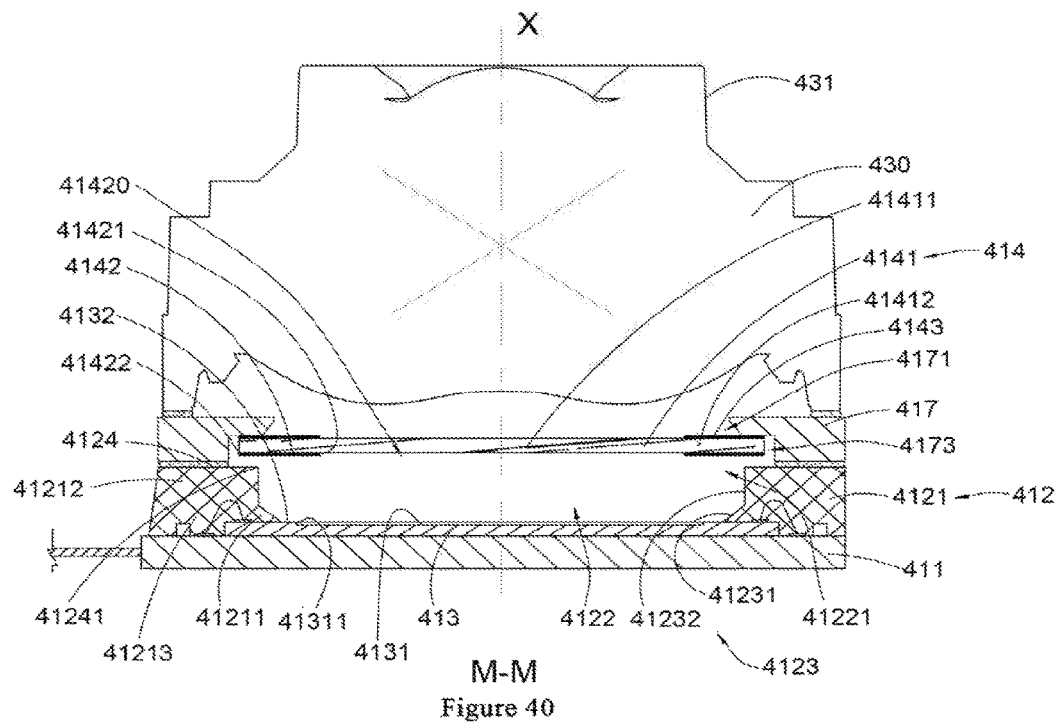
FIG. 40 is a cross-sectional view of the camera module according to the above-mentioned fifth preferred embodiment of the present application, taken along the line M-M in FIG. 39.
Figure 41:
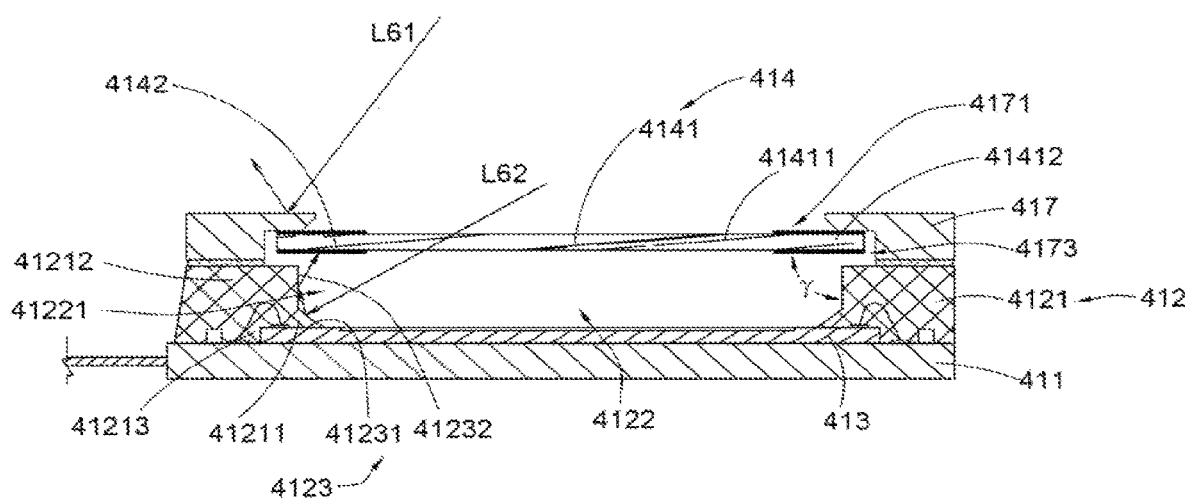
FIG. 41 is a schematic view illustrating that a light shielding layer is attached to a bottom side of the photosensitive assembly of the camera module according to the above-mentioned fifth preferred embodiment of the present application to effectively reduce stray light reflected to the photosensitive element.

As shown in FIGS. 39 to 41, a camera module 400 according to a fifth preferred embodiment of the present application has a structure similar to that of the fourth preferred embodiment. The camera module 400 includes a photosensitive assembly 410 and a lens 430. The lens 430 is assembled on the photosensitive assembly to form a fixed focus camera module. It can be understood that, in another variant embodiment, the lens may also be provided on a driver or a fixed lens barrel to form a lens assembly, and the lens assembly is assembled on the photosensitive assembly.

Accordingly, the photosensitive assembly 410 includes a circuit board 411, a molding base 412, a photosensitive element 413, a filter element 414, and a filter element holder 417, the molding base 412 includes a base main body 4121, which is integrally molded on the circuit board 411 and the photosensitive element 413 and forms a light window 4122, the light window 4122 is a closed space and provides a light path for the photosensitive element 413. The molding base 412 includes a photosensitive element coupling portion 41211 and a top side extending portion 41212 located around the light window 4122, which extends in multi-stage, and the inner surfaces 41231 and 41232 extend in different directions, respectively, so that the stray light is reduced and the area of the top surface 4124 of the molding base 412 is increased.

The filter element holder 417 is assembled on the molding base 412, and has an opening window 4171 on the top side and a bottom side mounting groove 4173, the filter element 414 is assembled on the bottom side mounting groove 4173 in an inverted manner. The filter element 414 includes a filter element main body 4141 and a light shielding layer 4142, the light shielding layer 4142 is provided on the bottom side of the filter element main body 4141. Therefore, similarly, the light shielding layer 4142 can play a role of reducing the stray light reaching the photosensitive element 413.

In addition, the lens 430 includes a supporting member 431 and one or more lenses 432 assembled on the supporting member 431, wherein, because the filter element 414 is inverted mounted on the filter element holder 417, so that the filter element 414 does not protrude from the upper surface of the filter element holder 417, the lens at the bottom of the one or more lenses 432 of the lens 430 can be relatively moved down, so that the distance from the photosensitive element 413 is reduced, thereby reducing the back focus of the camera module 400.

When the filter element 414 is provided with light shielding layer 4142 on the bottom side, as shown in FIG. 41, a part of the stray light L41 incident on the upper surface of the filter element holder 417 is reflected without entering the light window 4122 of the molding base 412, so as to block a part of the stray light.

When another part of the stray light L42 passes through the effective light transmitting region 41411 of the filter element main body 4141 and is incident on the first portion inner surface 41231, it will be reflected upward to the light shielding layer 4142 by the inclined first portion inner surface 41231 of the molding base 412 or further reflected to light shielding layer 4142 by the second portion inner surface 41232, so as to be absorbed by light shielding layer 4142, so as not to be further reflected and reach the photosensitive element 413, thereby affecting the imaging quality of the camera module 400. Accordingly, the light shielding layer 4142 is adjacent to the second portion inner surface 41232 of the molding base 412, the second portion inner surface 41232 of the molding base 412 is from the light shielding layer 4142 extends downward, and a light suppression groove 41221 is formed on the light shielding layer 4142, between the first portion inner surface 41231 and the second portion inner surface 41232, on an outer side portion of the light window 4122, the light suppression groove 41221 is a space for suppressing the stray light. More specifically, as shown in FIG. 41, the stray light L42 enters the light suppression groove 41221, so that it cannot be emitted from the light suppression groove 41221.

In addition, it can be understood that, because of the light shielding layer 4142 and the second portion inner surface 41232 of the molding base 412, the light shielding layer 4142 effectively reduces light passing through the filter element main body 4141 and reaching the second portion inner surface 41232, thereby preventing the light incident on the second portion inner surface 41232 from being reflected and reaching the photosensitive element 413 to form the stray light and affect the imaging quality of the camera module 400.

Figure 42:
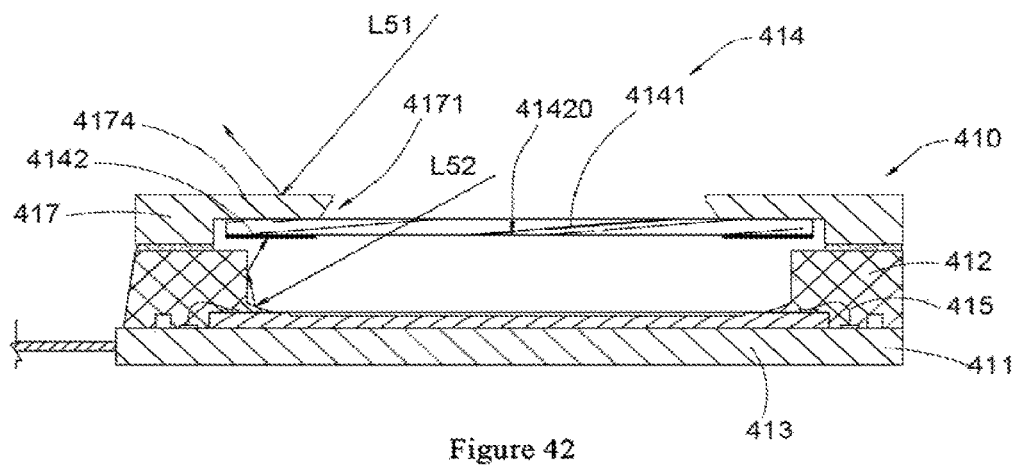
FIG. 42 is a cross-sectional view illustrating a camera module according to a variant embodiment of the above-mentioned fifth preferred embodiment of the present application.

As shown in FIG. 42, according to another variant embodiment of the fifth embodiment of the present application, the wiring direction of the connecting wire 415 is from the circuit board 411 to the photosensitive element 413, so that, in the molding process, the light window molding portion 4214 does not need to provide an avoiding space for the connecting wire 415 as much as possible, and the top side extending portion 41212 is made to have a greater height to increase the area of the top surface 4124 of the molding base 412.

In addition, an opening window 4171 is formed on the top side of the filter element holder 417, and the length of the top side portion 4174 of the filter element holder 417 extending inward may be greater than or equal to the length of the light shielding layer 4142 extending inward, in this way, the area of the opening window 4171 may not be greater than the area of the light path 41420, so that the top surface of the filter element holder 417 has the effect of blocking a part of the stray light L51, so that it is not necessary to provide the top side light shielding layer 4143 on the top side of the filter element 414. The stray light L52 can be absorbed by light shielding layer 4142.

Figure 43:
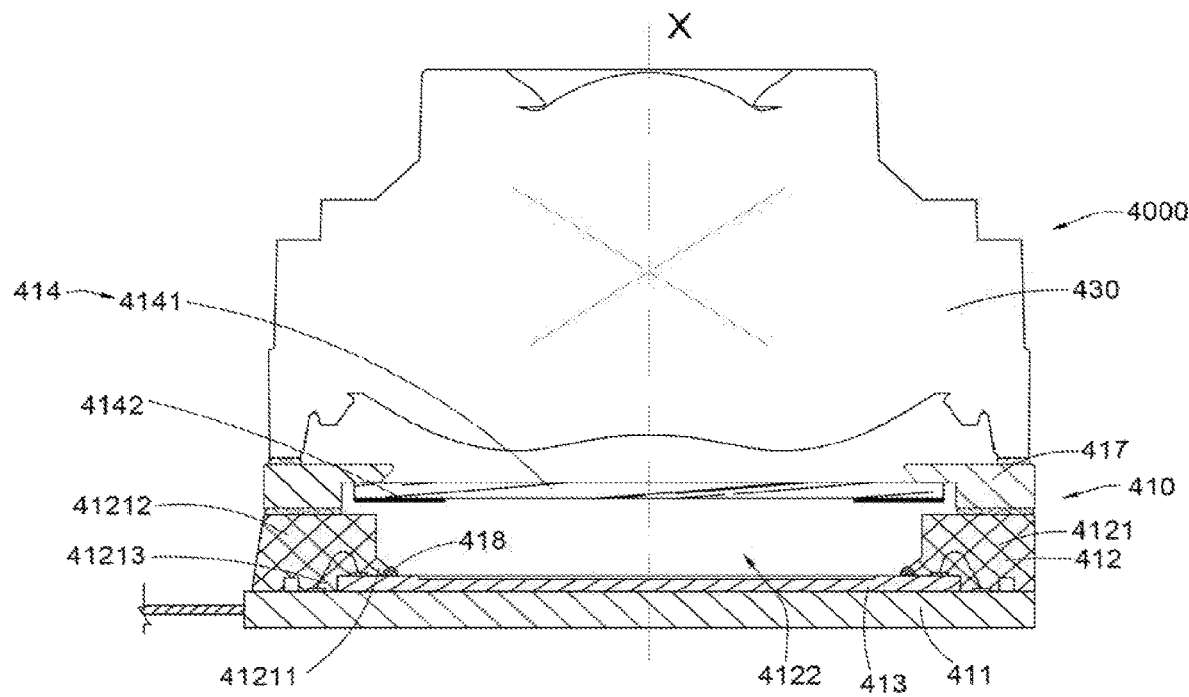
FIG. 43 is a cross-sectional view illustrating a camera module according to another variant embodiment of the above-mentioned fifth preferred embodiment of the present application.

As shown in FIG. 43, according to another variant embodiment of the fifth embodiment of the present application, the photosensitive assembly 410 includes a circuit board 411, a molding base 412, a photosensitive element 413, and a filter element 414, a filter element holder 417 and a blocking frame 418. The molding base 412 is integrated with the circuit board, the photosensitive element 413 and the blocking frame 418, and the filter element 414 is assembled on the filter element holder 417, the filter element holder 417 is assembled on the top side of the molding base 412. The light shielding layer 4142 of the filter element 414 is similar to the above mentioned third preferred embodiment, and is provided on the bottom side of the filter element main body 142 to reduce the stray light.

The ring shaped blocking frame 418 is provided on the photosensitive element 413, and is used to press the light window molding portion 4214 on the blocking frame 418 in a molding process to prevent the fluid-like molding material 416 from flowing into the photosensitive region 4131 of the photosensitive element 413, wherein the molding base 412 is integrally molded on the circuit board, the photosensitive element 413 and the blocking frame 418, the blocking frame 418 may be glue in a preferred embodiment, which may have a predetermined elasticity, for example, the elastic modulus ranges from 0.1 Gpa to 1 Gpa.

A base main body 4121 of the molding base 412 includes a photosensitive element coupling portion 41211 and a top side extending portion 41212 located around the light window 4122, and a circuit board coupling portion 41213 on bottom side of the photosensitive element coupling portion 41211 and around the photosensitive element 413 and on the top side of the circuit board 411. The photosensitive element coupling portion 41211 is integrally coupled to the circuit board 411, the photosensitive element 413 and the blocking frame 418, and has a first portion inner surface 41231 extending obliquely from the blocking frame 418, the top side extending portion 41212 has a second portion inner surface 41232 that extends from the first portion inner surface 41231 in a twist manner, so that such a structure enables the reflection effect of the inclined inner surface 41231 of the first portion to reduce stray light, and the second partial surface 1232 extending in a twist manner allows the top surface of the top side extending portion 41212 to have a greater mounting area, and reduce the area of the filter element 414, and prevent the molding material 416 from forming a "flashing" in the molding process, and the included angle of the inner surface of the two portions relative to the optical axis X is similar to the previous embodiment. It can be understood that, the blocking frame 418 of this embodiment can also be applied to other embodiment s of the present application.

Those skilled in the art should understand that the embodiments of the present application shown in the above description and the accompanying drawings are merely examples and do not limit the present application. The object of the present application has been completely and effectively achieved. The function and structural principle of the present application have been shown and explained in the embodiments, and the embodiments of the present application may have any variation or modification without departing from the principle.

The invention claimed is:

1. A photosensitive assembly of a camera module, comprising:
a circuit board, including a rigid region and a flexible region combined with each other;
a photosensitive element; and
a molding base, wherein the molding base is integrally molded on the circuit board and the photosensitive element and forms a light window that provides a light path for the photosensitive element; wherein a first end side corresponding to the molding base adjacent to the flexible region has a first side surface facing the light window, and an opposite second end side corresponding to the molding base away from the flexible region has a second side surface facing the light window, and the first side surface and the second side surface have a two-stage design extending from bottom to top.

2. The photosensitive assembly according to claim 1, wherein the first side surface includes a first partial surface provided adjacent to the photosensitive element and a second partial surface connected to the second partial surface, and the second side surface includes a third partial surface provided adjacent to the photosensitive element and a fourth partial surface connected to the third partial surface.

3. The photosensitive assembly according to claim 2, wherein the circuit board and the photosensitive element are connected by a connecting wire, and the connecting wire is embedded by the molding base, and a position at which the first partial surface and the second partial surface are connected is at an inner side of the connecting wire at the side of the first side surface, and a position at which the third partial surface and the fourth partial surface are connected is at an inner side of the connecting wire at the side of the second side surface.

4. The photosensitive assembly according to claim 2, wherein a distance D1 from the position at which the first partial surface and the second partial surface are connected to the optical axis is smaller than a distance D2 from an outer side of the non-photosensitive area of the photosensitive element to the optical axis.

5. The photosensitive assembly according to claim 2, wherein a top portion of the connecting wire is higher than the position at which the first partial surface and the second partial surface are connected and the position at which the third partial surface and the fourth partial surface are connected.

6. The photosensitive assembly according to claim 2, wherein a tilt degree of the first partial surface is greater than a tilt degree of the second partial surface, and a tilt degree of the third partial surface is greater than a tilt degree of the fourth partial surface.

7. The photosensitive assembly according to claim 2, wherein a first angle of the first partial surface relative to an optical axis of the camera module is greater than a second angle of the second partial surface relative to the optical axis, and a third angle of the third partial surface relative to the optical axis is greater than a fourth angle of the fourth partial surface relative to the optical axis.

8. The photosensitive assembly according to claim 2, wherein a first height of the first partial surface and a third height of the third partial surface in a direction perpendicular to the surface of the photosensitive element is 0.05 mm to 0.7 mm, and a second height of the second partial surface and a fourth height of the fourth partial surface in a direction perpendicular to the surface of the photosensitive element is 0.02 mm to 0.6 mm.

9. The photosensitive assembly according to claim 7, wherein the first angle and the third angle are 3°~80°.

10. The photosensitive assembly according to claim 9, wherein the second angle and the fourth angle are 0°~20°.

11. The photosensitive assembly according to claim 9, wherein a distance between an inner edge and an outer edge of a portion of the first end side of the molding base adjacent to the flexible region is 0.2 mm~1 mm.

12. A photosensitive assembly jointed panel of a camera module, comprising:
one or more rows of the circuit boards, each row of the circuit boards includes one or more circuit boards arranged side by side, each of the circuit boards includes a rigid region and a flexible region combined with each other;
one or more rows of photosensitive elements; and
one or more of one-piece molding bases, each of the one-piece molding bases is integrally molded on a row of the circuit boards and a row of the photosensitive elements and forms a light window that provides a light path for each of the photosensitive elements; wherein a first end side corresponding to the one-piece molding base adjacent to the flexible region has a first side surface facing the light window, and an opposite second end side corresponding to the one-piece molding base away from the flexible region has a second side surface facing the light window, and the first side surface and the second side surface have a two-stage design extending from bottom to top.

13. The photosensitive assembly jointed panel according to claim 12, wherein the first side surface includes a first partial surface provided adjacent to the photosensitive element and a second partial surface connected to the second partial surface, and the second side surface includes a third partial surface provided adjacent to the photosensitive element and a fourth partial surface connected to the third partial surface.

14. The photosensitive assembly jointed panel according to claim 13, wherein the circuit board and the photosensitive element are connected by a connecting wire, and the connecting wire is embedded by the molding base, and a position at which the first partial surface and the second partial surface are connected is at an inner side of the connecting wire at the side of the first side surface, and a position at which the third partial surface and the fourth partial surface are connected is at an inner side of the connecting wire at the side of the second side surface.

15. The photosensitive assembly jointed panel according to claim 13, wherein a distance D1 from the position at which the first partial surface and the second partial surface are connected to the optical axis is smaller than a distance D2 from an outer side of the non-photosensitive area of the photosensitive element to the optical axis.

16. The photosensitive assembly jointed panel according to claim 13, wherein a top portion of the connecting wire is higher than the position at which the first partial surface and the second partial surface are connected and the position at which the third partial surface and the fourth partial surface are connected.

17. The photosensitive assembly jointed panel according to claim 13, wherein a tilt degree of the first partial surface is greater than a tilt degree of the second partial surface, and a tilt degree of the third partial surface is greater than a tilt degree of the fourth partial surface.

18. The photosensitive assembly jointed panel according to claim 13, wherein a first angle of the first partial surface relative to an optical axis of the camera module is greater than a second angle of the second partial surface relative to the optical axis, and a third angle of the third partial surface relative to the optical axis is greater than a fourth angle of the fourth partial surface relative to the optical axis.

19. The photosensitive assembly jointed panel according to claim 13, wherein a first height of the first partial surface and a third height of the third partial surface in a direction perpendicular to the surface of the photosensitive element is 0.05 mm to 0.7 mm, and a second height of the second partial surface and a fourth height of the fourth partial surface in a direction perpendicular to the surface of the photosensitive element is 0.02 mm to 0.6 mm.

20. A camera module, comprising:
a lens;
a circuit board, including a rigid region and a flexible region combined with each other;
a photosensitive element; and
a molding base, wherein the molding base is integrally molded on the circuit board and the photosensitive element and forms a light window that provides a light path for the photosensitive element, wherein the lens is located on a photosensitive path of the photosensitive element; wherein a first end side corresponding to the molding base adjacent to the flexible region has a first side surface facing the light window, and an opposite second end side corresponding to the molding base away from the flexible region has a second side surface facing the light window, and the first side surface and the second side surface have a two-stage design extending from bottom to top.

* * * * *